(12) United States Patent
Inoue

(10) Patent No.: US 11,849,578 B2
(45) Date of Patent: Dec. 19, 2023

(54) THREE-DIMENSIONAL MEMORY DEVICE WITH A COLUMNAR MEMORY OPENING ARRANGEMENT AND METHOD OF MAKING THEREOF

(71) Applicant: SANDISK TECHNOLOGIES LLC, Addison, TX (US)

(72) Inventor: Tatsuya Inoue, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 314 days.

(21) Appl. No.: 17/388,547

(22) Filed: Jul. 29, 2021

(65) Prior Publication Data

US 2023/0029690 A1 Feb. 2, 2023

(51) Int. Cl.
| | | |
|---|---|---|
| H10B 43/10 | (2023.01) |
| H01L 23/522 | (2006.01) |
| H10B 41/10 | (2023.01) |
| H10B 41/27 | (2023.01) |
| H10B 43/27 | (2023.01) |
| H10B 51/10 | (2023.01) |
| H10B 51/20 | (2023.01) |
| H10B 63/00 | (2023.01) |

(52) U.S. Cl.
CPC ......... *H10B 43/10* (2023.02); *H01L 23/5226* (2013.01); *H10B 41/10* (2023.02); *H10B 41/27* (2023.02); *H10B 43/27* (2023.02); *H10B 51/10* (2023.02); *H10B 51/20* (2023.02); *H10B 63/34* (2023.02); *H10B 63/845* (2023.02)

(58) Field of Classification Search
CPC ........ H10B 43/10; H10B 41/10; H10B 41/27; H10B 43/27; H10B 51/10; H10B 51/20; H10B 63/34; H10B 63/845; H01L 23/5226
See application file for complete search history.

(56) References Cited

U.S. PATENT DOCUMENTS

| | | |
|---|---|---|
| 9,812,461 B2 | 11/2017 | Doda et al. |
| 9,922,987 B1 | 3/2018 | Mizutani et al. |
| 9,929,174 B1 | 3/2018 | Mizutani et al. |
| 10,297,610 B2 | 5/2019 | Kai et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Allison Bernstein
(74) *Attorney, Agent, or Firm* — THE MARBURY LAW GROUP PLLC

(57) ABSTRACT

A three-dimensional memory device includes an alternating stack of insulating layers and electrically conductive layers located over a substrate, a plurality of periodic two-dimensional arrays of memory openings vertically extending through the alternating stack, a plurality of periodic two-dimensional arrays of memory opening fill structures, and bit lines. The bit lines laterally extend along a second horizontal direction. Each periodic two-dimensional array of memory openings includes a plurality of columns of memory openings in which neighboring columns of memory openings are laterally spaced apart along a first horizontal direction with an intercolumnar pitch. Memory openings within each column of memory openings are laterally spaced apart along the second horizontal direction with a nearest-neighbor pitch.

20 Claims, 43 Drawing Sheets

(56) References Cited

U.S. PATENT DOCUMENTS

| | | |
|---|---|---|
| 10,381,229 B2 | 8/2019 | Yada et al. |
| 10,381,364 B2 | 8/2019 | Zhou et al. |
| 10,381,450 B1 | 8/2019 | Yada et al. |
| 10,403,639 B2 | 9/2019 | Orimoto et al. |
| 10,490,564 B2 | 11/2019 | Mushiga et al. |
| 10,490,569 B2 | 11/2019 | Mushiga et al. |
| 10,586,803 B2 | 3/2020 | Mushiga et al. |
| 2009/0168480 A1 | 7/2009 | Scheuerlein et al. |
| 2009/0170030 A1 | 7/2009 | Scheuerlein et al. |
| 2010/0149073 A1 | 6/2010 | Chaum et al. |
| 2010/0290262 A1 | 11/2010 | Scheuerlein et al. |
| 2011/0001217 A1 | 1/2011 | Neuilly et al. |
| 2014/0166959 A1 | 6/2014 | Bertin et al. |
| 2015/0277123 A1 | 10/2015 | Chaum et al. |
| 2016/0204117 A1 | 7/2016 | Liu et al. |
| 2016/0276360 A1 | 9/2016 | Doda et al. |
| 2016/0315122 A1 | 10/2016 | Bertin et al. |
| 2017/0125433 A1 | 5/2017 | Ogawa et al. |
| 2017/0148800 A1 | 5/2017 | Nishikawa et al. |
| 2017/0148810 A1 | 5/2017 | Kai et al. |
| 2017/0148811 A1 | 5/2017 | Zhang et al. |
| 2017/0200769 A1 | 7/2017 | Bertin et al. |
| 2017/0373078 A1 | 12/2017 | Chu et al. |
| 2018/0158834 A1 | 6/2018 | Ogawa et al. |
| 2018/0197918 A1 | 7/2018 | Bertin et al. |
| 2018/0366482 A1 | 12/2018 | Zhou et al. |
| 2019/0013327 A1 | 1/2019 | He et al. |
| 2019/0027434 A1 | 1/2019 | Jung et al. |
| 2019/0027488 A1 | 1/2019 | Kai et al. |
| 2019/0027489 A1 | 1/2019 | Orimoto et al. |
| 2019/0067025 A1 | 2/2019 | Yada et al. |
| 2019/0088717 A1 | 3/2019 | Yeh et al. |
| 2019/0198517 A1 | 6/2019 | Umezawa et al. |
| 2019/0221613 A1 | 7/2019 | Bertin et al. |
| 2019/0267319 A1 | 8/2019 | Imai et al. |
| 2019/0267461 A1 | 8/2019 | Yada et al. |
| 2019/0326306 A1 | 10/2019 | Mushiga et al. |
| 2019/0326307 A1 | 10/2019 | Mushiga et al. |
| 2019/0326313 A1 | 10/2019 | Cui et al. |
| 2019/0378879 A1 | 12/2019 | Bertin et al. |
| 2020/0035560 A1 | 1/2020 | Block et al. |
| 2020/0127003 A1 | 4/2020 | Hua |
| 2020/0185385 A1 | 6/2020 | Juengling |
| 2020/0273514 A1 | 8/2020 | Manipatruni et al. |
| 2020/0273864 A1 | 8/2020 | Manipatruni et al. |
| 2020/0273865 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0279861 A1 | 9/2020 | Uryu et al. |
| 2020/0303395 A1 | 9/2020 | Nakatsuka et al. |
| 2020/0303398 A1 | 9/2020 | Otsu et al. |
| 2020/0328223 A1 | 10/2020 | Lai et al. |
| 2020/0358187 A1 | 11/2020 | Tran et al. |
| 2020/0403036 A1 | 12/2020 | Bertin et al. |
| 2021/0005617 A1 | 1/2021 | Kai et al. |

OTHER PUBLICATIONS

U.S. Appl. No. 17/208,019, filed Mar. 22, 2021, SanDisk Technologies Llc.

International Search Report and Written Opinion of the International Searching Authority for International Patent Application No. PCT/US2022/027359, dated Aug. 21, 2022, 13 pages.

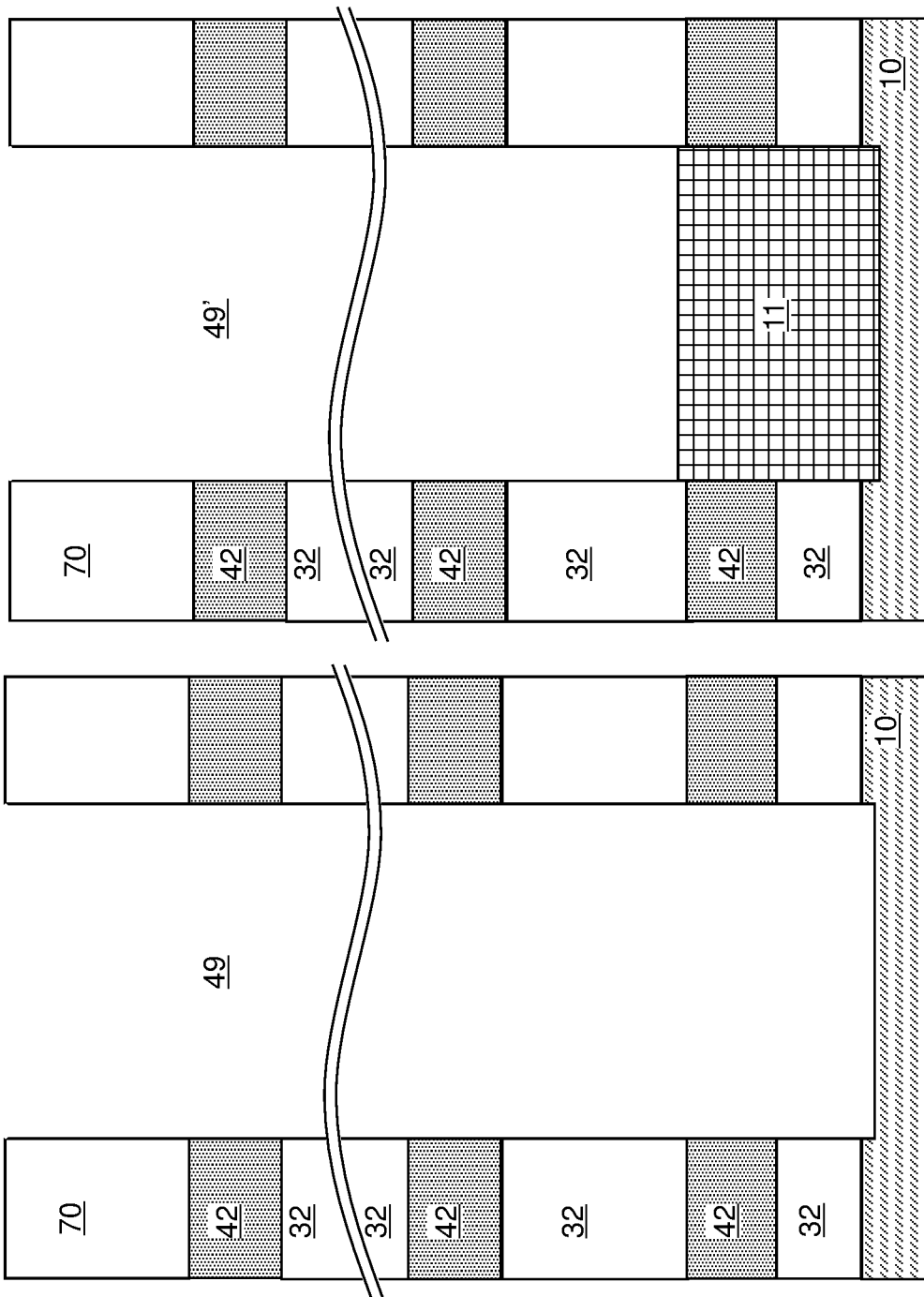

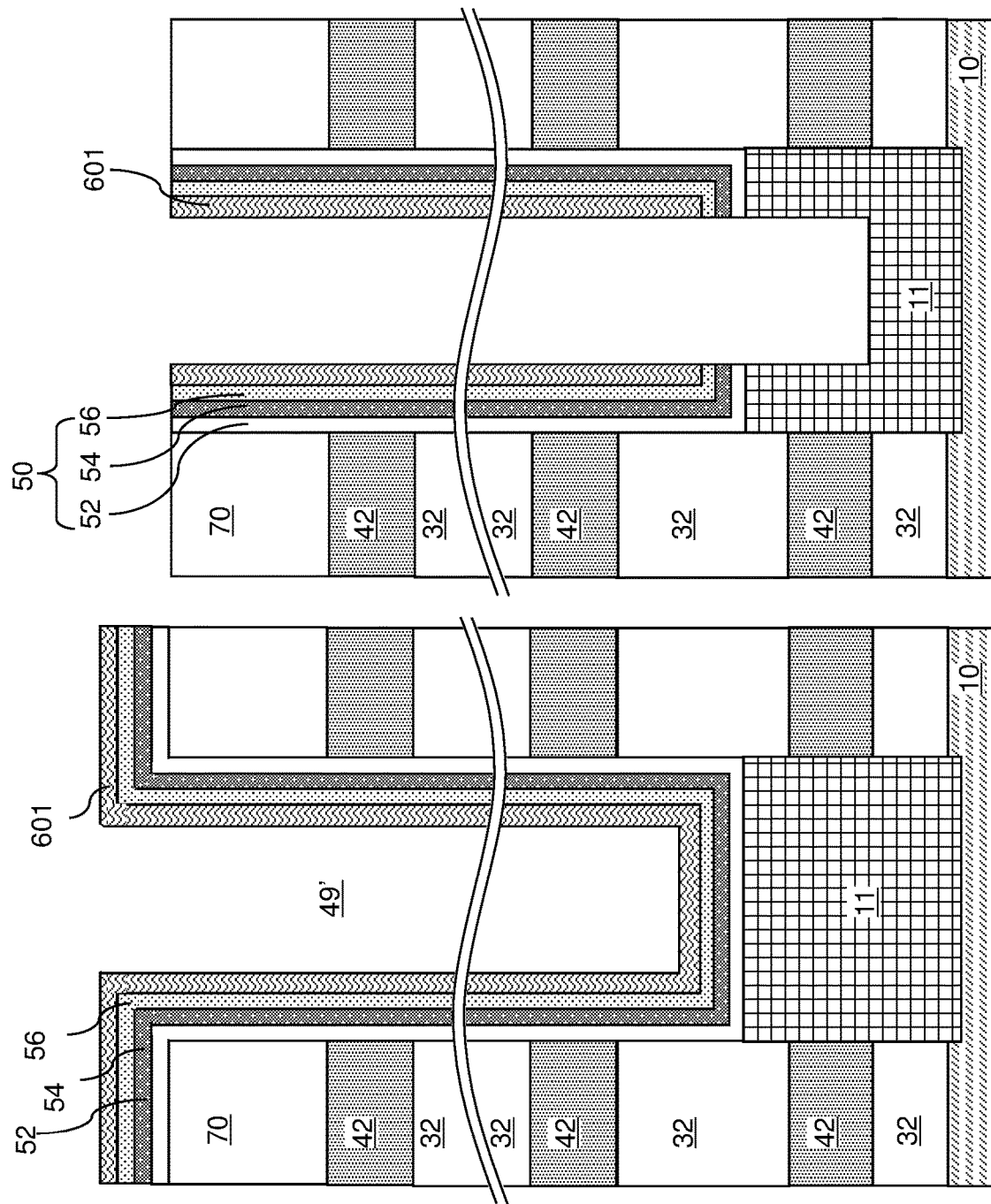

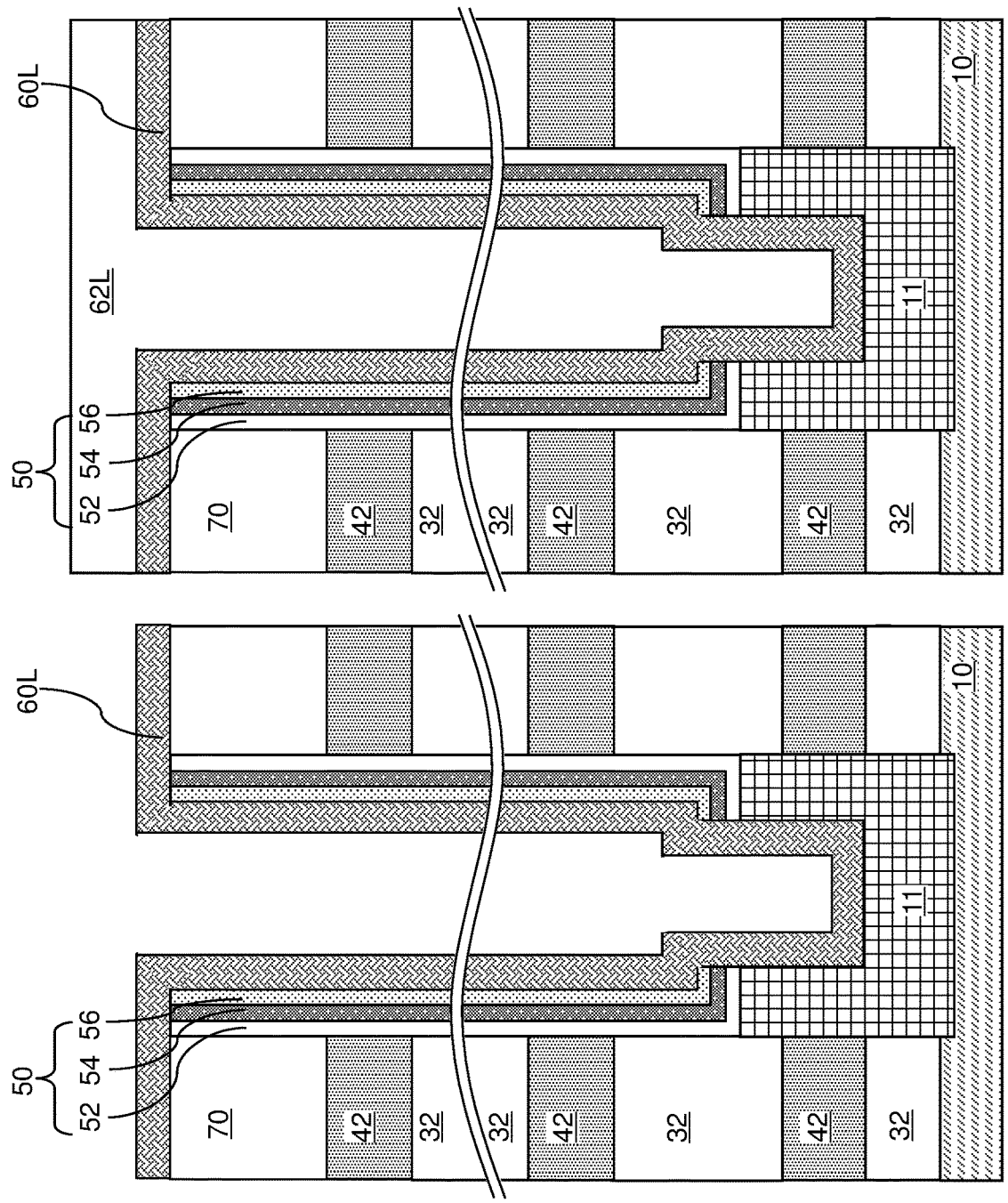

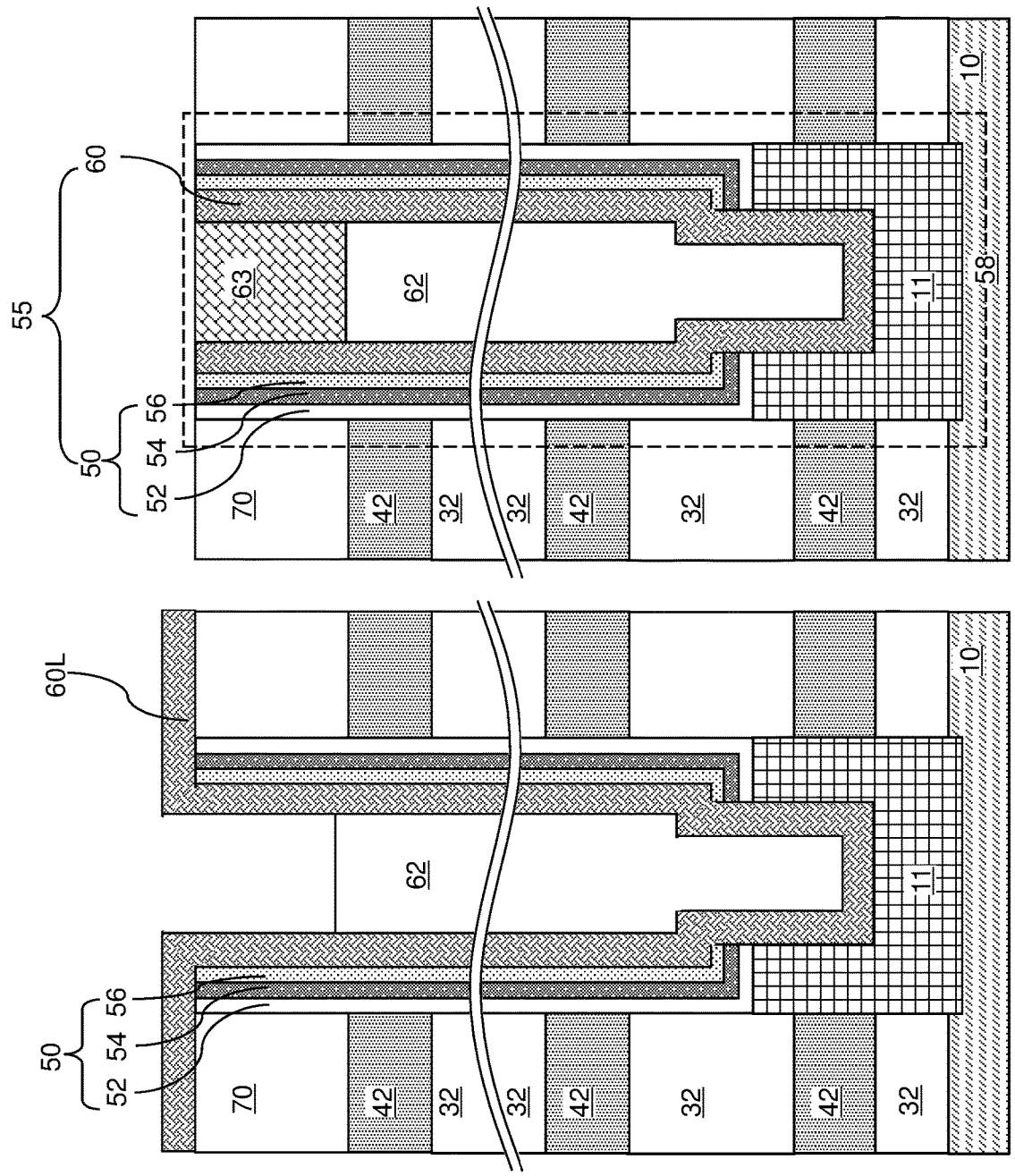

THREE-DIMENSIONAL MEMORY DEVICE WITH A COLUMNAR MEMORY OPENING ARRANGEMENT AND METHOD OF MAKING THEREOF

FIELD

The present disclosure relates generally to the field of semiconductor devices, and particularly to a three-dimensional memory device employing a columnar memory opening arrangement and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises: an alternating stack of insulating layers and electrically conductive layers located over a substrate; a plurality of periodic two-dimensional arrays of memory openings vertically extending through the alternating stack, wherein each periodic two-dimensional array of memory openings comprises a plurality of columns of memory openings in which neighboring columns of memory openings are laterally spaced apart along a first horizontal direction with an intercolumnar pitch, wherein memory openings within each column of memory openings are laterally spaced apart along a second horizontal direction with a nearest-neighbor pitch that is greater than the intercolumnar pitch, and each neighboring columns of memory openings are laterally offset along the second horizontal direction by one half of the nearest-neighbor pitch; a plurality of periodic two-dimensional arrays of memory opening fill structures, wherein each of the memory opening fill structures is located within a respective memory opening within the periodic two-dimensional arrays of memory openings and comprises a respective vertical semiconductor channel, a respective vertical stack of memory elements, and a respective drain region; and bit lines overlying the alternating stack and the two-dimensional arrays of memory opening fill structures and laterally extending along the second horizontal direction, wherein each of the bit lines is electrically connected to a respective subset of the drain regions.

According to another embodiment, a three-dimensional memory device comprises an alternating stack of insulating layers and electrically conductive layers comprising word lines and drain side select gate electrodes; a plurality of memory opening fill structures vertically extending through the alternating stack, wherein each of the plurality of memory opening fill structures comprises a respective vertical semiconductor channel, a respective vertical stack of memory elements, and a respective drain region; and bit lines overlying the alternating stack and the plurality of memory opening fill structures and laterally extending along a bit line direction, wherein each of the bit lines is electrically connected to a respective subset of the drain regions. Each of the memory opening fill structures has nearest neighbor memory opening structures along the bit line direction and along two diagonal directions that are inclined by 45 degrees from the bit line direction.

According to another aspect of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming a plurality of periodic two-dimensional arrays of memory openings through the alternating stack, wherein each periodic two-dimensional array of memory openings comprises a plurality of columns of memory openings in which neighboring columns of memory openings are laterally spaced apart along a first horizontal direction with an intercolumnar pitch, wherein memory openings within each column of memory openings are laterally spaced apart along a second horizontal direction with a nearest-neighbor pitch that is greater than the intercolumnar pitch, and each neighboring columns of memory openings are laterally offset along the second horizontal direction by one half of the nearest-neighbor pitch; forming a plurality of periodic two-dimensional arrays of memory opening fill structures within the plurality of periodic two-dimensional arrays of memory openings, wherein each memory opening fill structure within the plurality of periodic two-dimensional arrays of memory opening fill structures comprises a respective vertical semiconductor channel, a respective vertical stack of memory elements, and a respective drain region; and forming bit lines over the alternating stack and the two-dimensional arrays of memory opening fill structures, wherein the bit lines laterally extend along the second horizontal direction, and wherein each of the bit lines is electrically connected to a respective subset of the drain regions.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

DETAILED DESCRIPTION

Figure 1:
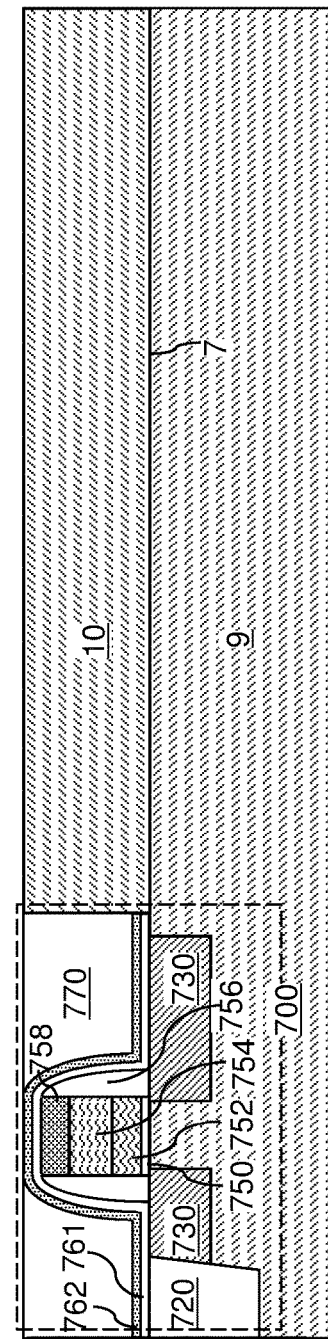
FIG. 1 is a schematic vertical cross-sectional view of an exemplary structure after formation of at least one peripheral device, a semiconductor material layer, and a gate dielectric layer according to an embodiment of the present disclosure.

As discussed above, the embodiments of the present disclosure are directed to three-dimensional memory devices containing a columnar memory opening arrangement and methods of manufacturing the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
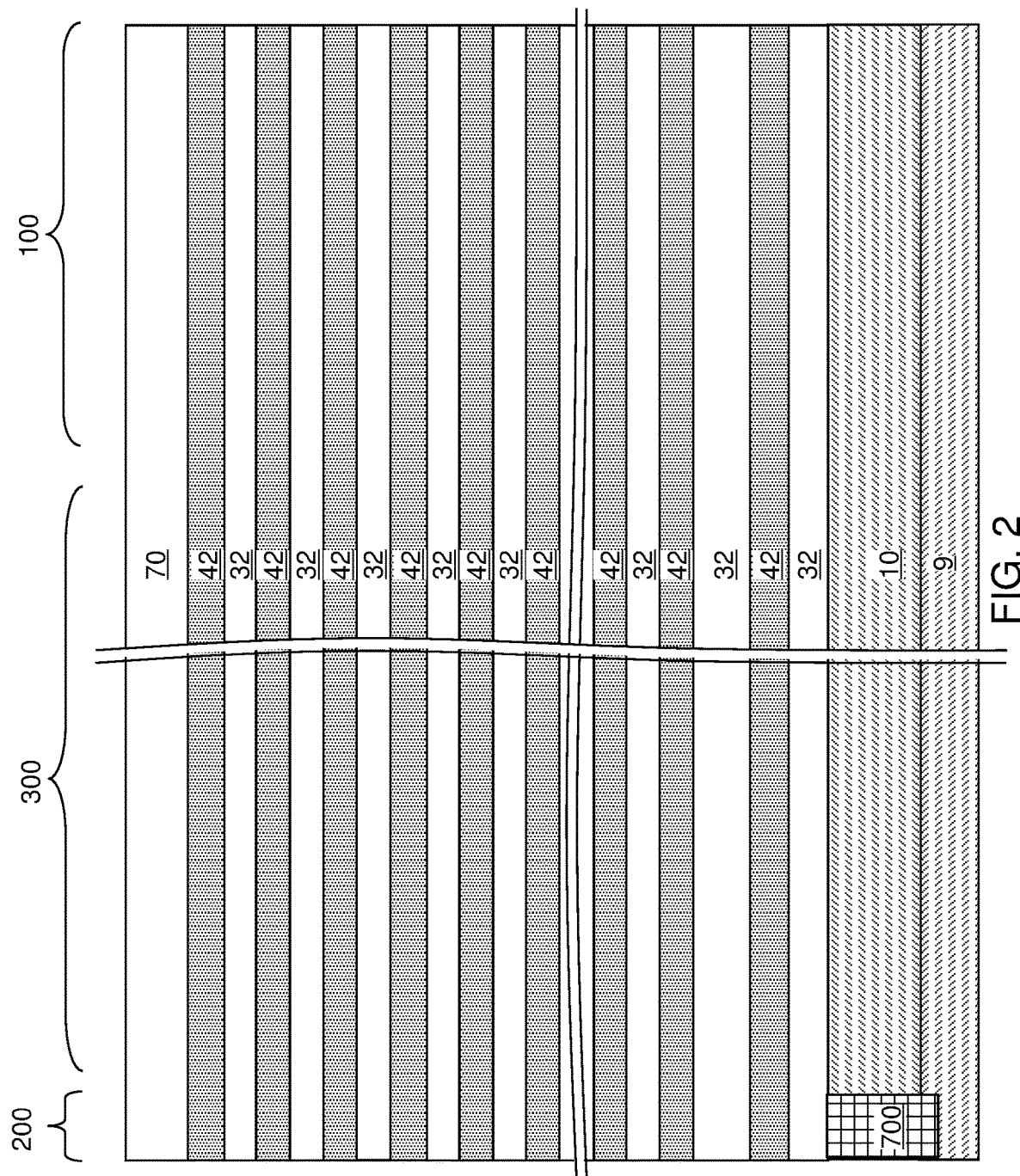
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 (e.g., a control gate electrode or a sacrificial material layer) can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Generally, an alternating stack of insulating layers 32 and spacer material layers can be formed over a substrate (9, 10). The spacer material layers are formed as, or are subsequently replaced with, electrically conductive layers. In case the spacer material layers are subsequently replaced with the electrically conductive layers, the spacer material layers can be formed as the sacrificial material layers 42. While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3A:
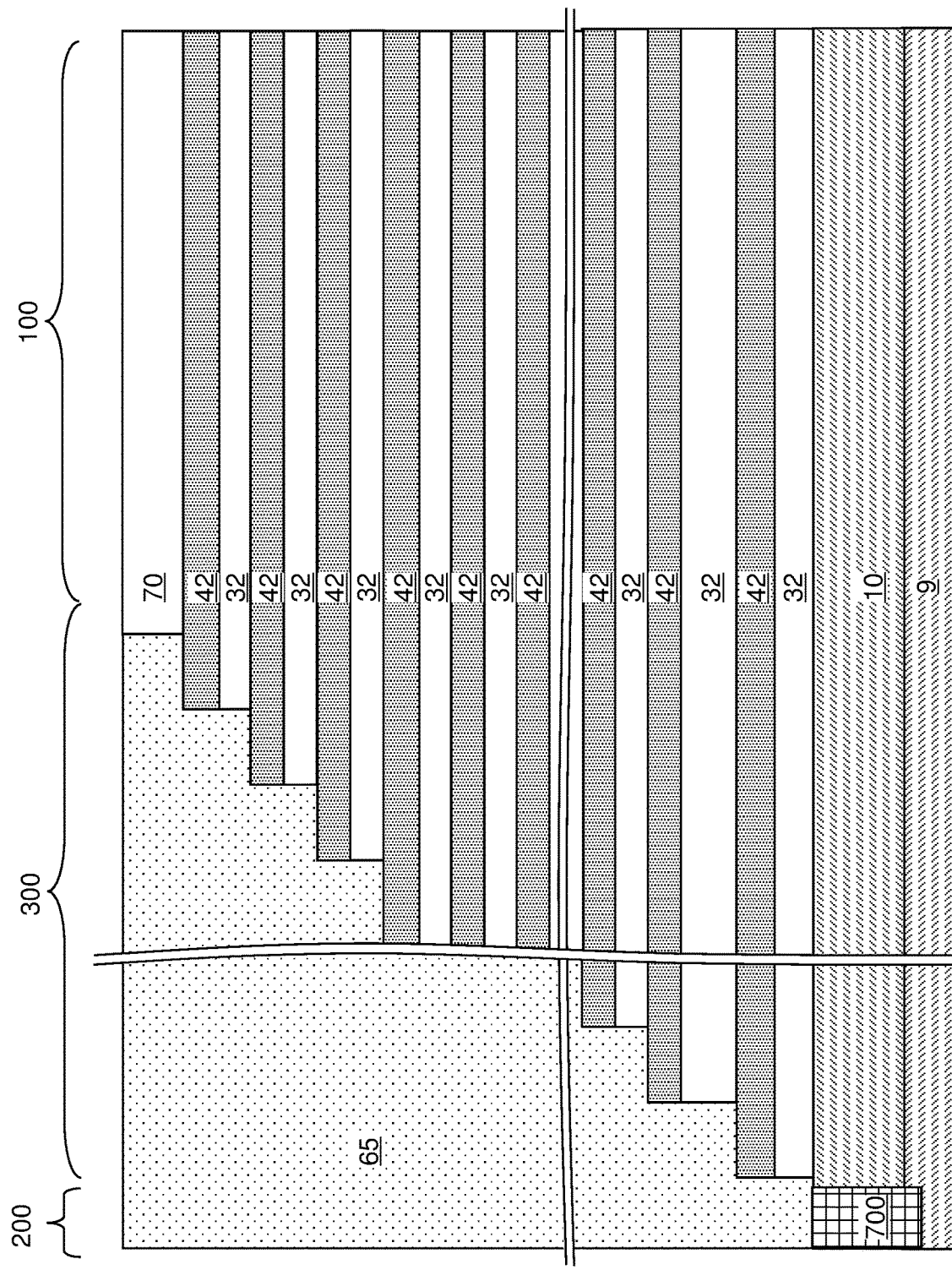
FIG. 3A is a schematic vertical cross-sectional view of the exemplary structure after formation of stepped terraces and a retro-stepped dielectric material portion according to an embodiment of the present disclosure.
Figure 3B:
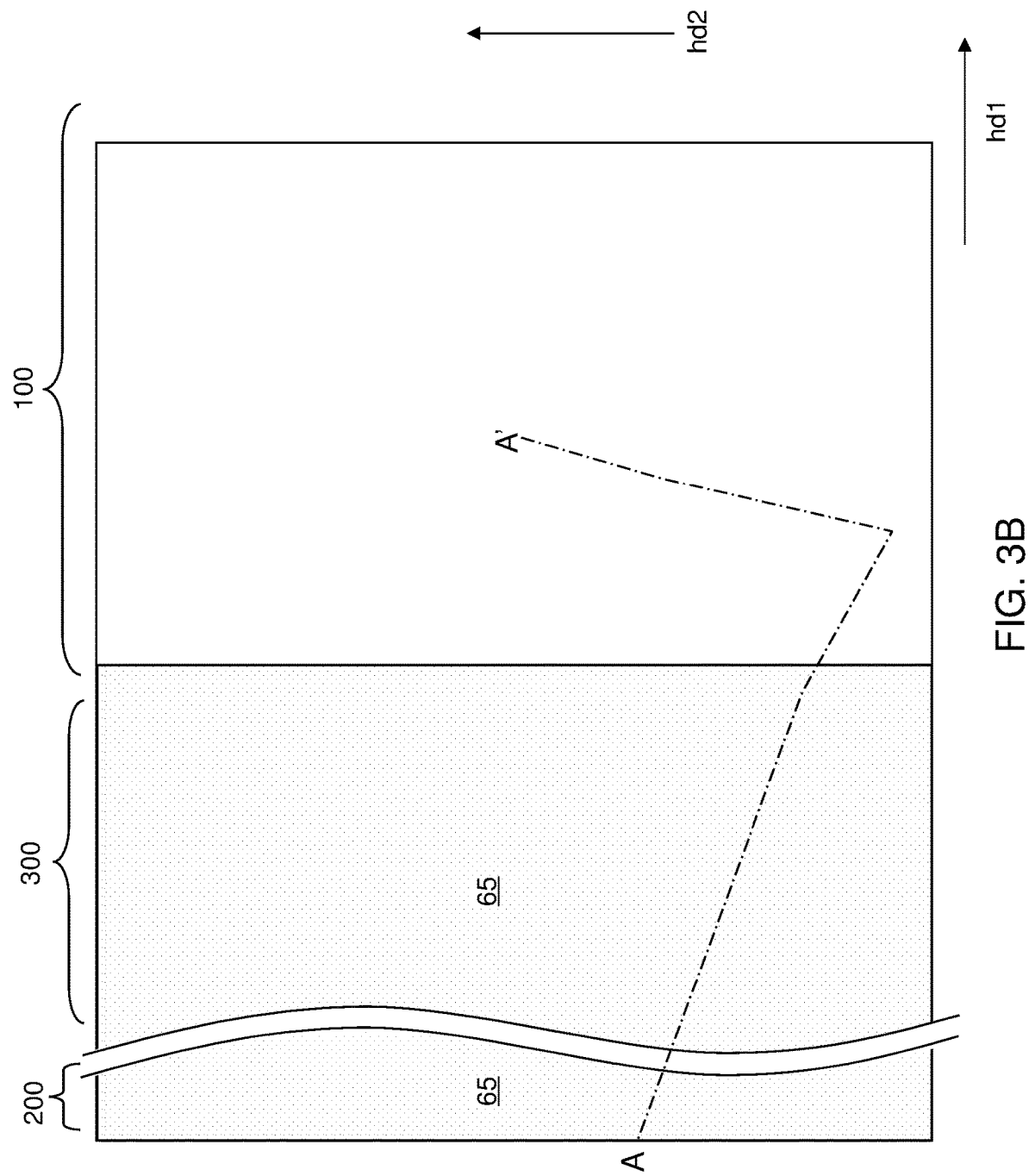
FIG. 3B is a top-down view of the exemplary structure of FIG. 3A. The vertical plane A-A' is the plane of the cross-section for FIG. 3A.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
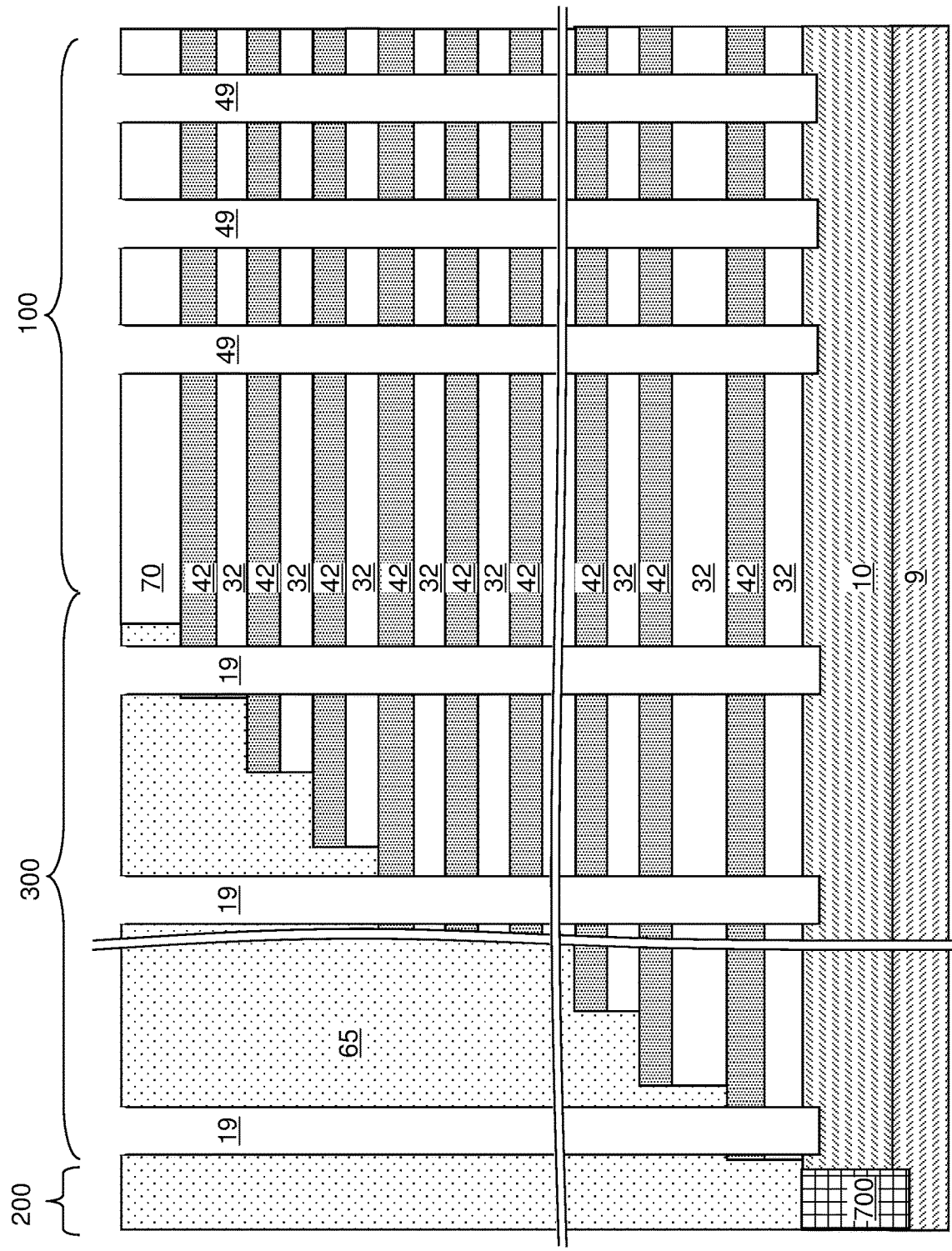
FIG. 4A is a schematic vertical cross-sectional view of the exemplary structure after formation of memory openings and support openings according to an embodiment of the present disclosure.
Figure 4B:
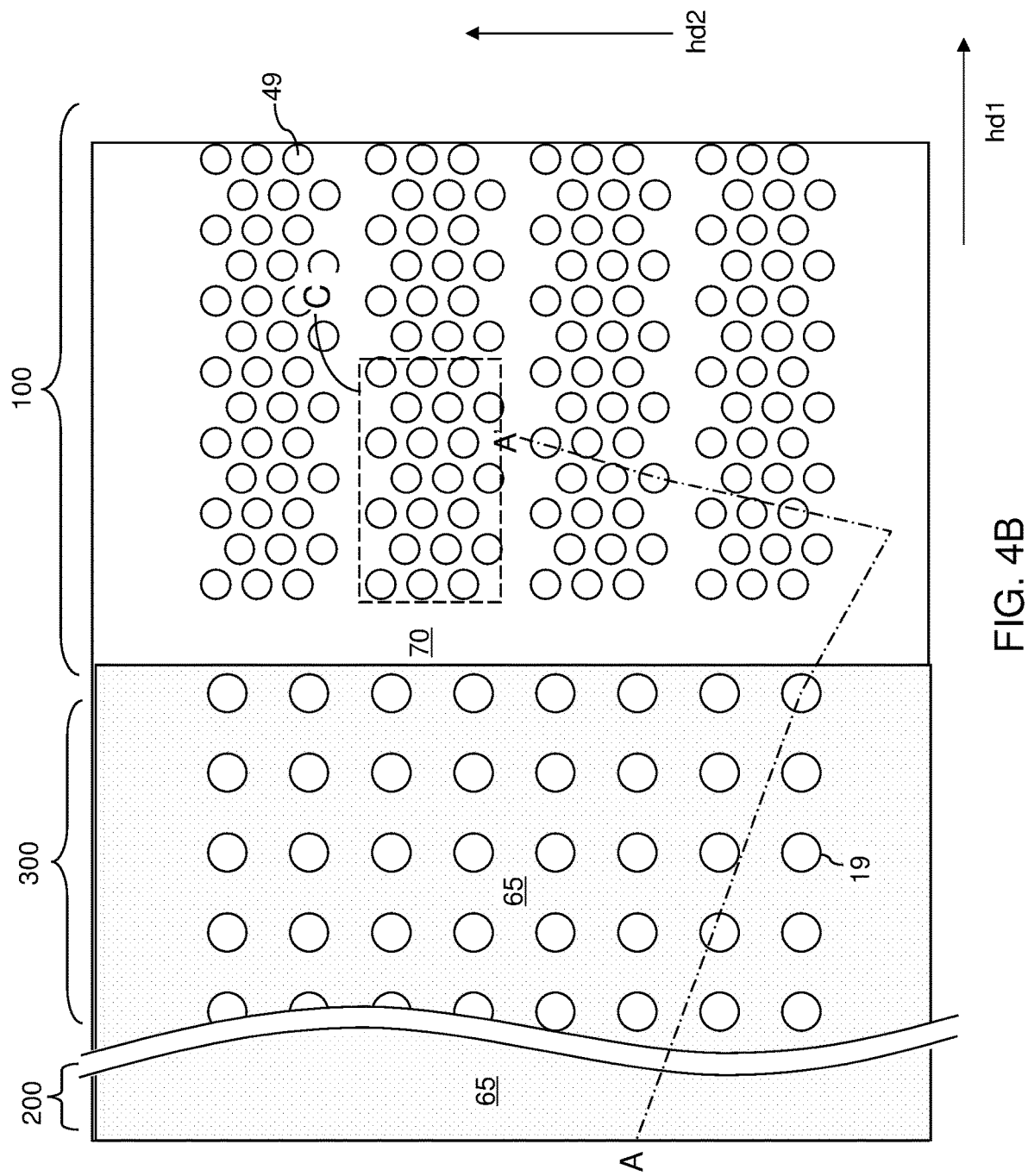
FIG. 4B is a top-down view of the exemplary structure of FIG. 4A. The vertical plane A-A' is the plane of the cross-section for FIG. 4A.
Figure 4C:
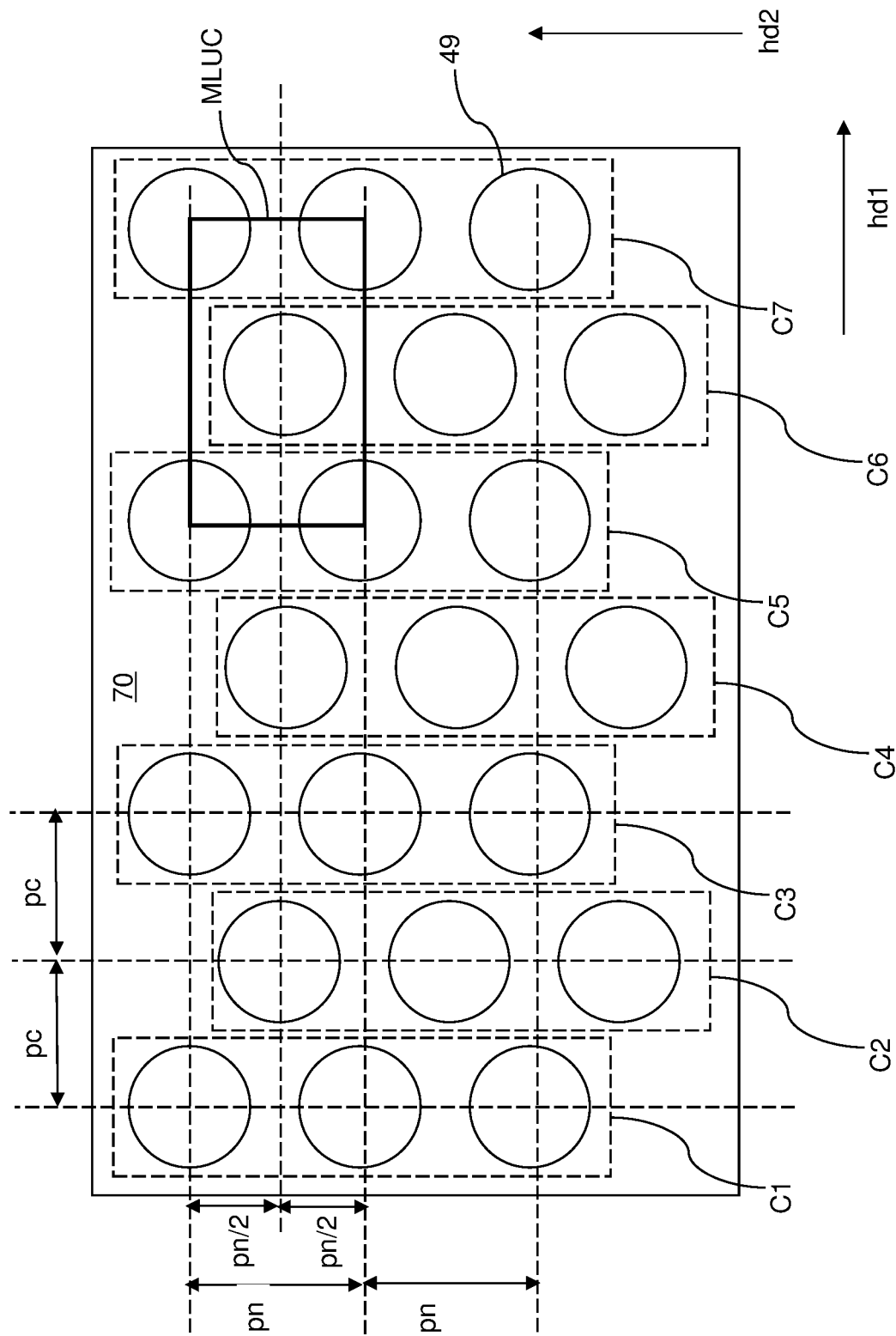
FIG. 4C is a magnified view of region C of FIG. 4B.

Referring to FIGS. 4A-4C, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. At least one two-dimensional array of memory openings 49 can be formed in the memory array region 100. At least one two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

In one embodiment shown in FIG. 4C, a plurality of periodic two-dimensional arrays of memory openings 49 can be formed through the alternating stack (32, 42). Each periodic two-dimensional array of memory openings 49 can be formed between a respective neighboring pair of elongated regions that lateral extend along the first horizontal direction hd1 that are subsequently employed to form backside trenches therethrough. According to an aspect of present disclosure, each of periodic two-dimensional array of memory openings 49 comprises a plurality of columns Ci of memory openings 49 in which neighboring columns Ci of memory openings 49 are laterally spaced apart along a first horizontal direction hd1 (i.e., word line direction) with an intercolumnar pitch pc. In the notation Ci, the index i refers to an integer index that is attached to a respective column of memory openings 49. The indices i may be assigned in any sequentially incremental manner or any sequentially decremental manner that increases or decreases the numerical values of the indices i along the first horizontal direction hd1. While the structure in the embodiment of FIG. 4C has a column of memory openings 49 that are most proximal to the contact region 300 assigned the value of 1 for the index i, and the numerical values for the index i increments by 1 for each successive column of memory openings 49 along the first horizontal direction hd1 away from the contact region 300, alternative labeling schemes for the index i may also be employed.

Memory openings 49 within each column Ci of memory openings 49 are laterally spaced apart along a second horizontal direction hd2 (i.e., bit line direction) with a nearest-neighbor pitch pn that is greater than the intercolumnar pitch oc. In one embodiment, the second horizontal direction hd2 can be perpendicular to the first horizontal direction. In one embodiment, each neighboring columns Ci of memory openings 49 may be laterally offset along the second horizontal direction hd2 by one half of the nearest-neighbor pitch pn, i.e., by pn/2.

In one embodiment, each of the periodic two-dimensional array of memory openings 49 can have a first periodicity along the first horizontal direction hd1 that is twice the intercolumnar pitch pc, and a second periodicity along the second horizontal direction hd2 that is the same as the nearest-neighbor pitch pn. In this case, the area of a memory-level unit cell MLUC that is a unit of two-dimensional repetition within each periodic two-dimensional array of memory openings 49 can have the area of a product of two intercolumnar pitches pc times one nearest-neighbor pitch pn.

In one embodiment, the first periodicity (i.e., twice the intercolumnar pitch pc) is in a range from 1.4 times to 2 times the second periodicity (i.e., the nearest-neighbor pitch pn). In one embodiment, the first periodicity may be in a range from 1.55 times the second periodicity to 1.9 times the second periodicity, and/or may be in a range from 1.65 times the second periodicity to 1.8 times the second periodicity, and/or may be in a range from 1.70 times the second periodicity to 1.76 times the second periodicity. In one embodiment, each of the memory openings 49 may have a circular horizontal cross-sectional shape of a same radius, and each periodic two-dimensional array of memory openings 49 may be formed as a two-dimensional hexagonal periodic array of memory openings 49. In this case, the ratio of the first periodicity to the second periodicity may be the square root of three divided by 2, i.e., $\sqrt{3}/2$.

In one embodiment, each column Ci of memory openings 49 within the plurality of columns Ci of memory openings 49 consists of a respective set of N memory openings 49, in which N is an integer selected from 2, 3, 4, 5, and 6. In the embodiment, shown in FIG. 4C, N=3 (i.e., there are three memory openings 49 in each column Ci).

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening 49 with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The optional blocking dielectric layer 52 can include a single dielectric material layer or a stack of a plurality of dielectric material layers. The blocking dielectric layer 52 can be formed employing a conformal deposition process. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, polysilicon, or a metallic material, a ferroelectric material that can store information in the form of a ferroelectric polarization direction, or any other memory material that can store date by altering electrical resistivity.

The memory material layer 54 can be formed as a single memory material layer of homogeneous composition, or can include a stack of multiple memory material layers. In one embodiment, the memory material layer 54 may comprise an insulating charge trapping material, such as one or more silicon nitride segments. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. The dielectric material liner 56 can be formed on the memory material layer 54 employing a conformal deposition process. In one embodiment, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening 49, or may fully fill the cavity in each memory opening 49.

Referring to FIG. 5F, in case the memory cavity 49' in each memory opening 49 is not completely filled by the semiconductor channel layer 60L, a dielectric core layer 62C can be deposited in the memory cavity 49' to fill any remaining portion of the memory cavity 49' within each memory opening 49. The dielectric core layer 62C includes a dielectric material such as silicon oxide or organosilicate glass. The dielectric core layer 62C can be deposited by a conformal deposition method such as low pressure chemical vapor deposition (LPCVD), or by a self-planarizing deposition process such as spin coating.

Referring to FIG. 5G, the horizontal portion of the dielectric core layer 62C can be removed, for example, by a recess etch process such that each remaining portions of the dielectric core layer 62C is located within a respective memory opening 49 and has a respective top surface below the horizontal plane including the top surface of the insulating cap layer 70. Each remaining portion of the dielectric core layer 62C constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon. Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or ferroelectric polarization with a macroscopic retention time. In some embodiments, a blocking dielectric layer 52 may not be present in the memory film 50 at this step, and a backside blocking dielectric layer may be subsequently formed after formation of backside recesses. Furthermore, if the ferroelectric memory material layer 54 is used, then the dielectric material liner 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure. Generally, a memory opening fill structure 58 can be formed in each memory opening 49. The memory opening fill structure 58 comprises an optional blocking dielectric layer 52, a memory material layer 54, an optional dielectric material liner 56, a vertical semiconductor channel 60, a drain region 63 and the optional dielectric core 62.

In case a blocking dielectric layer 52 is present in each memory opening fill structure 58, the blocking dielectric layer 52 may be formed on a sidewall of a memory opening 49, and the vertical stack of memory elements (which may comprise portions of the memory material layer 54) may be formed on the blocking dielectric layer 52. In one embodiment, the vertical stack of memory elements comprises portions of a charge storage layer (comprising the memory material layer 54) located at the levels of the sacrificial material layers 42. In case a dielectric material liner 56 is present in each memory opening fill structure 58, the dielectric material liner 56 may be formed on the vertical stack of memory elements. In on embodiment, the dielectric material liner 56 may comprise a tunneling dielectric layer. In this case, the vertical semiconductor channel 60 can be formed on the tunneling dielectric layer. The blocking dielectric layer 52 laterally surrounds the charge storage layer and the tunneling dielectric layer can be located between the charge storage layer and the vertical semiconductor channel 60. A vertical NAND string can be formed in each memory opening 49 upon subsequent replacement of the sacrificial material layers 42 with electrically conductive layers.

Figure 6A:
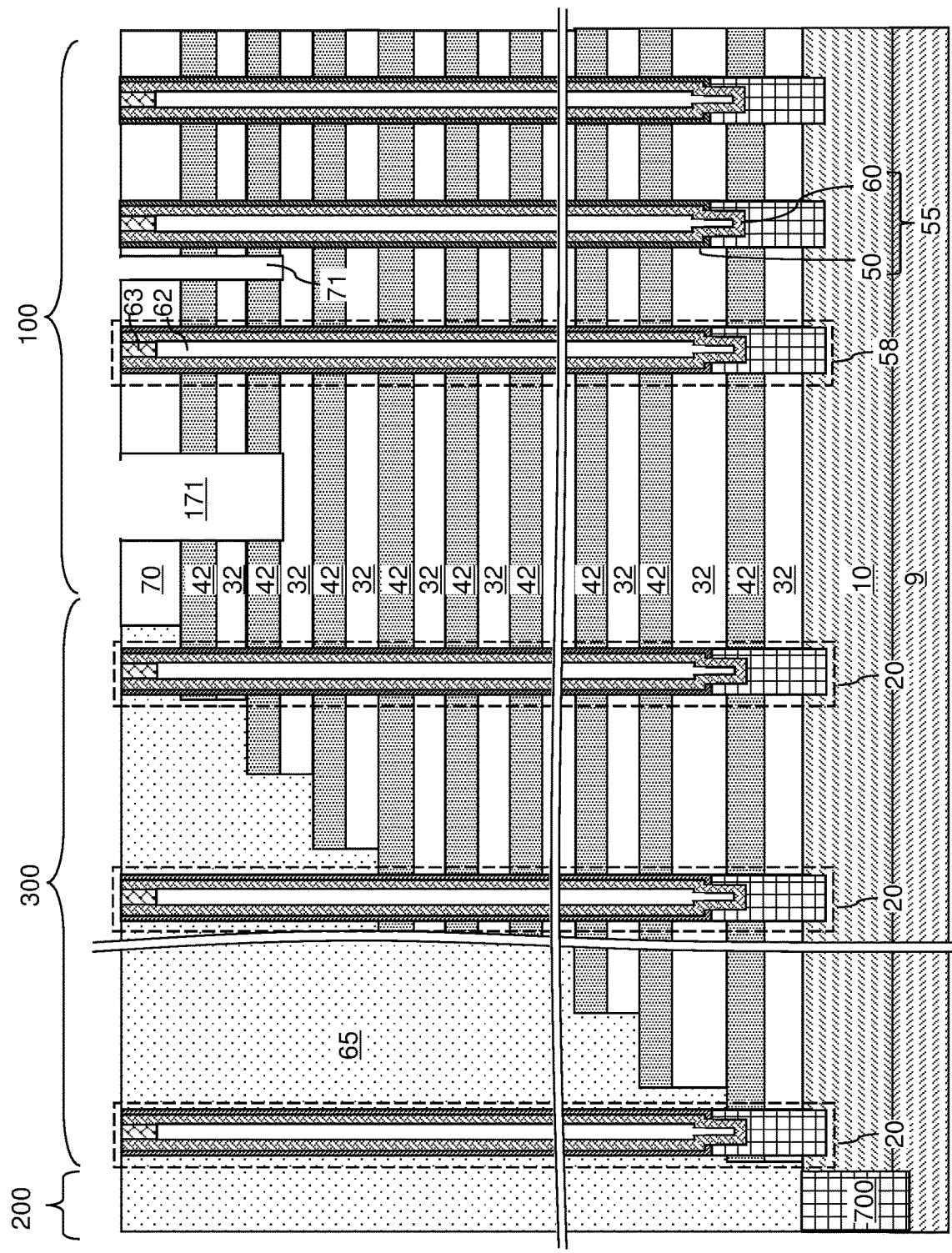
FIG. 6A is a schematic vertical cross-sectional view of the exemplary structure after formation of drain-select-level isolation trenches according to an embodiment of the present disclosure.
Figure 6B:
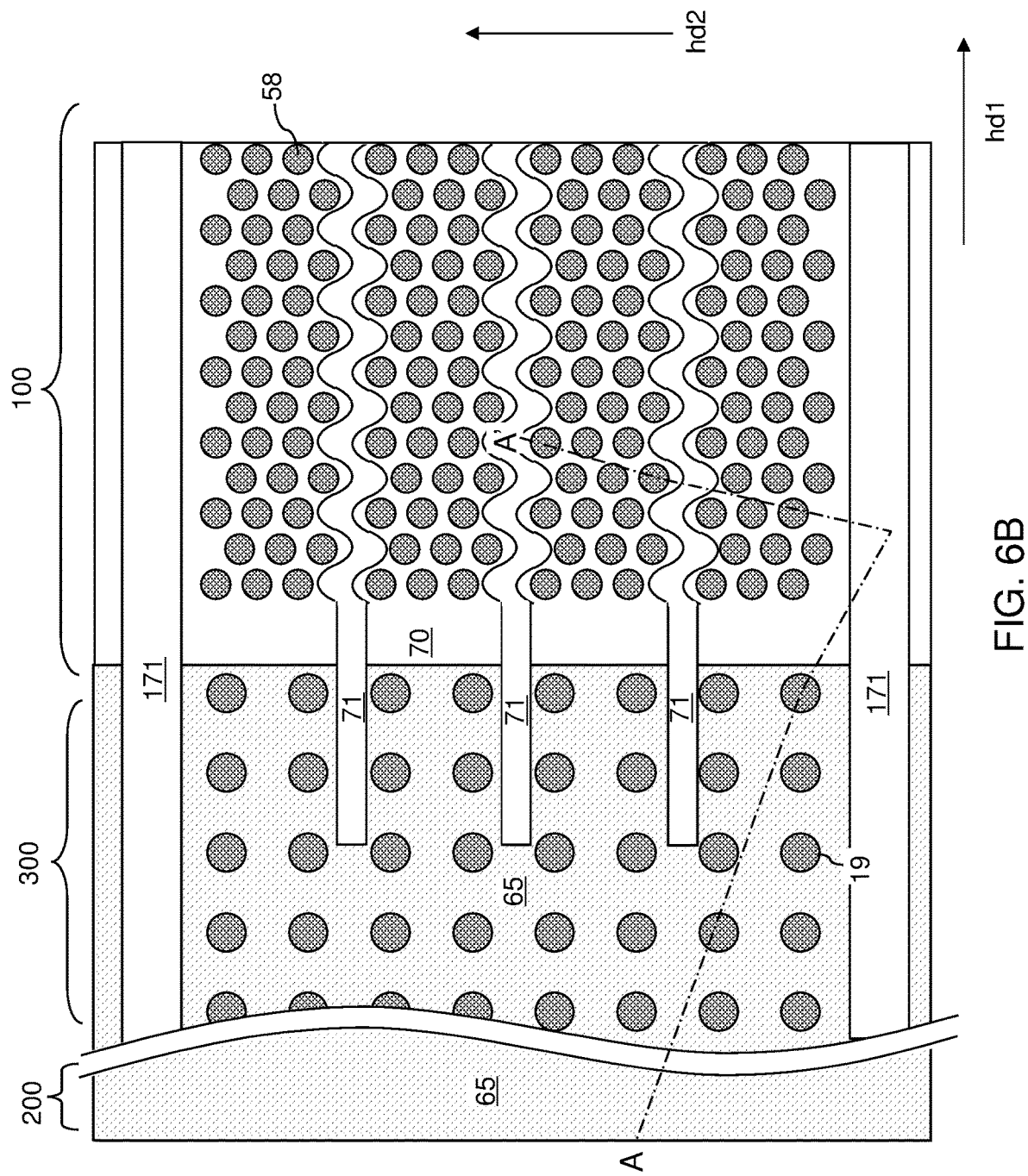
FIG. 6B is a top-down view of a first configuration of the exemplary structure of FIG. 6A. The vertical plane A-A' is the plane of the schematic vertical cross-sectional view of FIG. 6A.
Figure 6C:
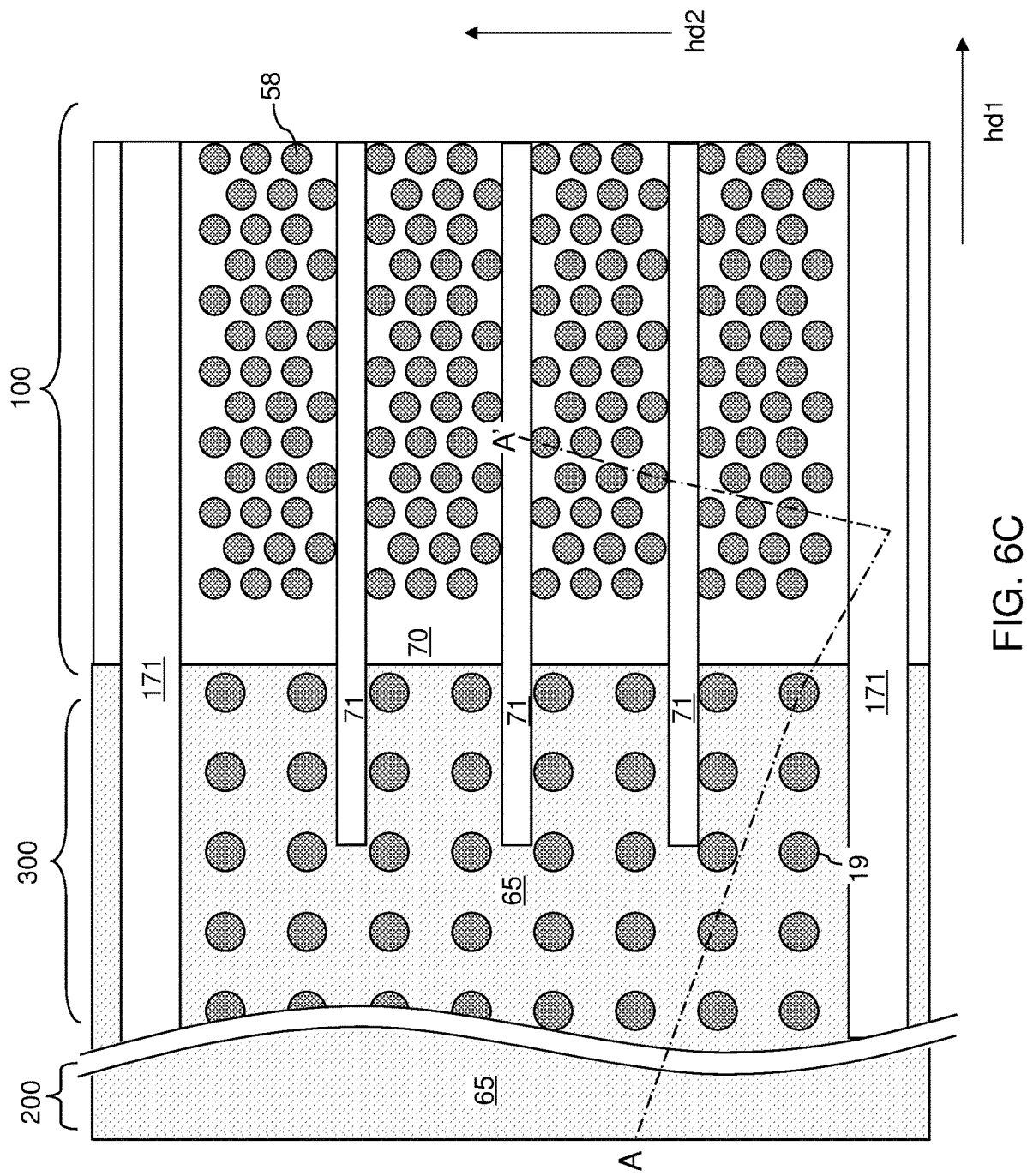
FIG. 6C is a top-down view of a second configuration of the exemplary structure of FIG. 6A. The vertical plane A-A' is the plane of the schematic vertical cross-sectional view of FIG. 6A.

Referring to FIGS. 6A-6C, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

A photoresist layer (not shown) can be applied over the insulating cap layer 70, and can be lithographically patterned to form elongated openings over areas between a respective neighboring pair of rows of memory opening fill structures 58 arranged along the first horizontal direction hd1 and an adjoined region located in the contact region 300. The elongated openings comprise first-type elongated openings that are formed between neighboring pairs of two-dimensional array of memory opening fill structures 58 including respective columns Ci of memory opening fill structures 58, and second-type elongated openings that are formed over areas in which memory opening fill structures 58 and support pillar structures 20 are not present. The second-type elongated openings may be rectangular openings having a respective rectangular horizontal cross-sectional shape.

In a first configuration of the exemplary structure of which a top-down view is illustrated in FIG. 6B, each first-type elongated opening extends generally along the first horizontal direction hd1 and has a periodic repetition of lateral wiggles along the second horizontal direction hd2 that is perpendicular to the first horizontal direction hd1. In one embodiment, the first-type elongated openings in the photoresist layer can be formed such that the slit-shaped openings in the photoresist layer does not have any areal overlap with the areas of the memory opening fill structures 58 or with the areas of the support pillar structures 20.

In a second configuration of the exemplary structure of which a top-down view is illustrated in FIG. 6C, the first-type elongated openings may laterally extend along the first horizontal direction hd1 with straight lengthwise sidewalls that are parallel to the first horizontal direction hd1.

An anisotropic etch process can be performed to transfer the pattern of the elongated openings in the photoresist layer through the insulating cap layer 70, a subset of the sacrificial material layers 42 located at drain select levels, and a subset of the insulating layers 32 located above the bottommost layer among the subset of the sacrificial material layers 42. The total number of sacrificial material layer(s) 42 located at drain select levels may be in a range from 1 to 6, such as from 2 to 4, although lesser and greater numbers may also be employed.

Drain-select-level backside trenches 171 and drain-select-level isolation trenches 71 are formed in volumes from which the materials of the insulating cap layer 70, the subset of the sacrificial material layers 42, and the subset of the insulating layers 32 are removed. The drain-select-level backside trenches 171 may have straight edges, and may have a respective rectangular horizontal cross-sectional shape. The drain-select-level backside trenches 171 are formed in regions in which the memory opening fill structures 58 and the support pillar structures 20 are absent, and laterally extend through the memory array region 100 and the entirety length of the contact region 300 along the first horizontal direction hd1.

In the first configuration of the exemplary structure shown in FIG. 6B, the drain-select-level isolation trenches 71 laterally extend generally along the first horizontal direction hd1 and have a respective periodic repetition of lateral wiggles along the second horizontal direction hd1. As used herein, a lateral wiggle refers to a lateral bidirectional undulation of a surface along a direction that is perpendicular to a general lateral propagation direction of the surface such that at least two lateral undulations of the surface alternate along the general lateral propagation of the surface. Each drain-select-level isolation trench 71 vertically extends through the insulating cap layer 70 and each of the subset of the sacrificial material layers 42 and the subset of the insulating layers 32 in the drain-select-levels. In one embodiment, one or more drain-select-level isolation trenches 71 can be formed within the area of a two-dimensional periodic array of memory opening fill structures 58 located between a neighboring pair of backside trench regions in which backside trenches are subsequently formed.

Generally, the periodicity of the lateral wiggles along the second horizontal direction hd2 can be the same as a periodicity of memory opening fill structures 58 within each row of memory opening fill structures 58 among the memory opening fill structures 58. In one embodiment, the drain-select-level isolation trenches 71 do not contact the memory opening fill structures 58 and/or the support pillar structures 20, and can be laterally spaced from each of the memory opening fill structures 58 and/or the support pillar structures 20 by remaining portions of the insulating cap layer 70, the subset of the sacrificial material layers 42, and the subset of the insulating layers 32. Generally, the drain-select-level isolation trenches 71 can be formed through the at least one subset of the sacrificial material layers 42 between a neighboring pair of rows of memory opening fill structures 58.

In a second configuration of the exemplary structure shown in FIG. 6C, the drain-select-level isolation trenches 71 may have a respective rectangular horizontal cross-sectional shape. Sidewalls of the memory opening fill structures 58 may, or may not, be physically exposed to the drain-select-level isolation trenches 71 depending on the width the drain-select-level isolation trenches 71 and the layout of the memory opening fill structures 58.

In the first configuration and in the second configuration, each of the drain-select-level isolation trenches 71 may have a uniform width along the second horizontal direction hd2 that is invariant under translation along the first horizontal direction hd1. In other words, the distance between a pair of lengthwise sidewalls of each drain-select-level isolation trench 71 as measured along the second horizontal direction hd2 may be the same irrespective of the measurement location. The distance between the pair of lengthwise sidewalls of drain-select-level isolation trench 71 is greater than the height of any of the sacrificial material layers 42 located at the drain select levels. The two lengthwise sidewalls of each drain-select-level isolation trench 71 define a pair of vertical planes that are laterally spaced apart from each other by a uniform spacing.

Figure 7:
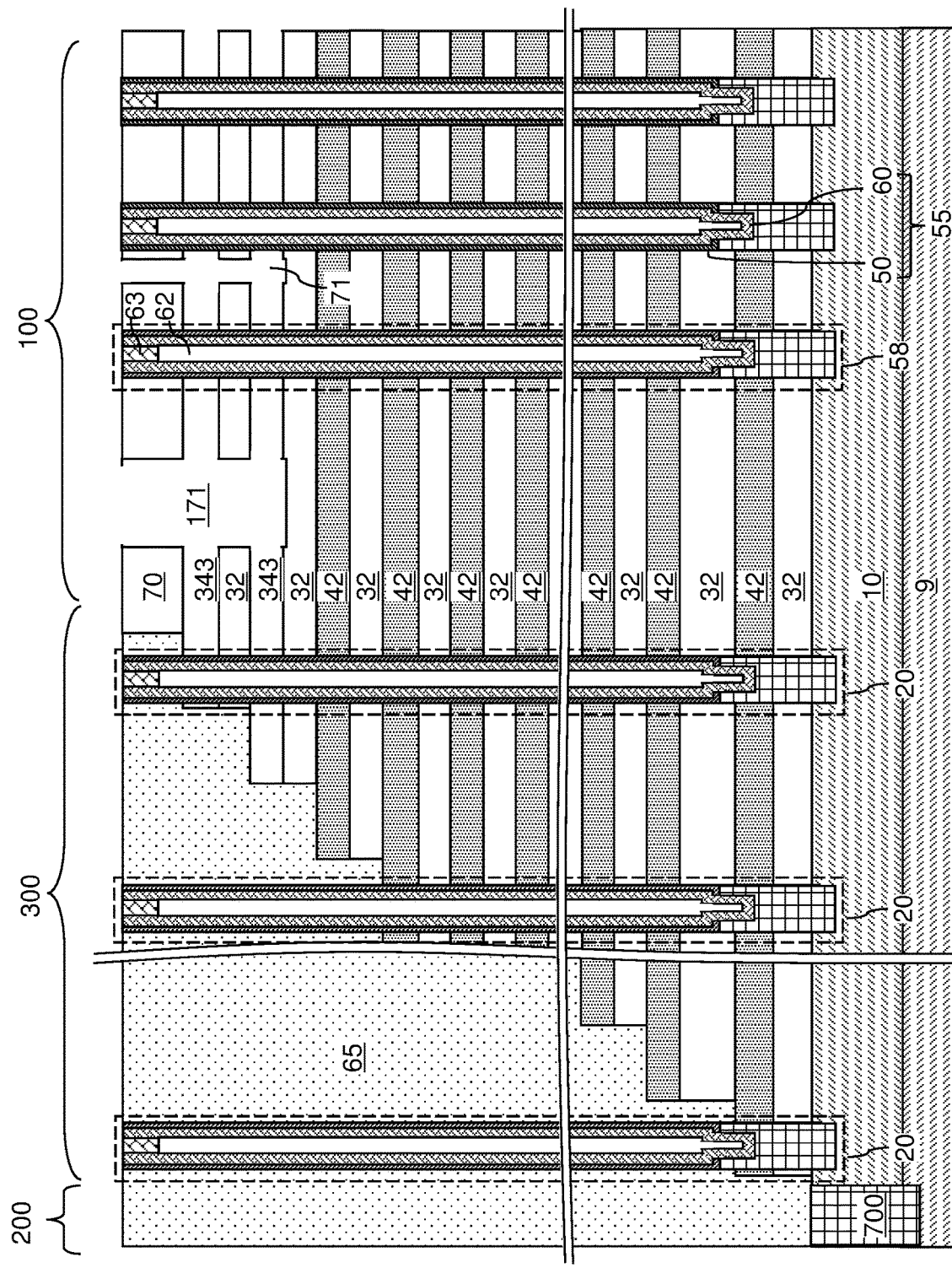
FIG. 7 is a schematic vertical cross-sectional view of the exemplary structure after formation of drain-select-level backside recesses according to an embodiment of the present disclosure.

Referring to FIG. 7, drain-select-level backside recesses 343 can be formed by removing the materials of the drain-select-level subset of the sacrificial material layers 42 that are exposed to the drain-select-level isolation trenches 71 or to the drain-select-level backside trenches 171 selective to the materials of the insulating cap layer 70 and the insulating layers 32. An etchant that selectively etches the material of the subset of the sacrificial material layers 42 with respect to the materials of the insulating cap layer 70 and the insulating layers 32 can be introduced into the drain-select-level isolation trenches 71 and into the drain-select-level backside trenches 171 employing an isotropic etch process. The isotropic etch process may be a wet etch process employing a wet etch solution, or can be a gas phase (dry) etch process in which the etchant is introduced in a vapor phase into the drain-select-level isolation trenches 71 and into the drain-select-level backside trenches 171. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory opening fill structures 58 provide structural support while the drain-select-level backside recesses 343 are present within volumes previously occupied by the drain-select-level subset of the sacrificial material layers 42 located at the drain select levels. Cylindrical sidewall segments of the memory opening fill structures 58 and cylindrical sidewall segments of the support pillar structures 20 can be physically exposed to each drain-select-level backside recess 343.

Figure 8:
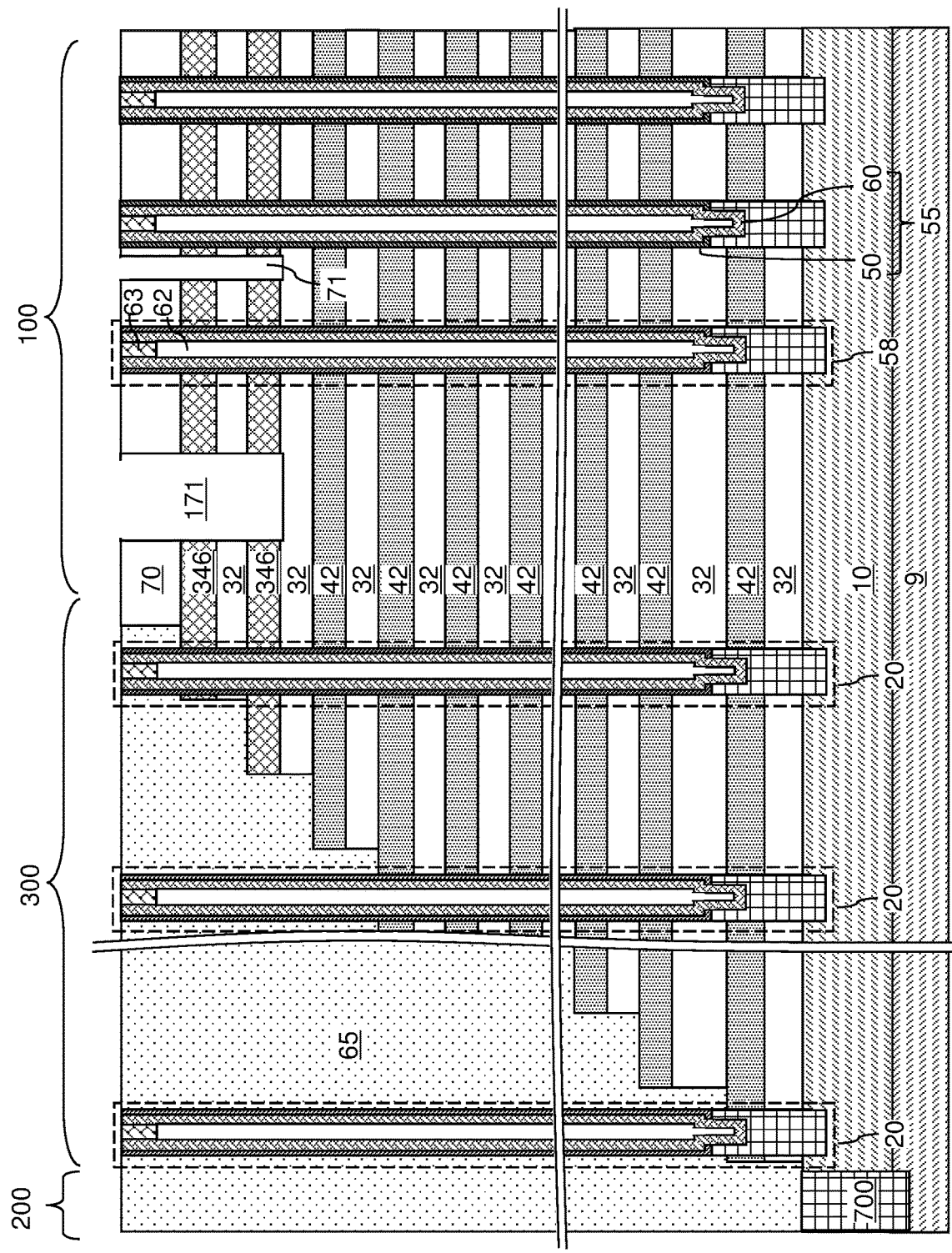
FIG. 8 is a schematic vertical cross-sectional view of the exemplary structure after formation of drain-select-level electrically conductive layers according to an embodiment of the present disclosure.

Referring to FIG. 8, a drain-select-level backside blocking dielectric layer (not shown) may be optionally deposited on the physically exposed surfaces of the insulating cap layer 70 and the insulating layers 32. The drain-select-level blocking dielectric layer comprises at least one dielectric material such as silicon oxide and/or a dielectric metal oxide. The thickness of the drain-select-level blocking dielectric layer, if present, may be in a range from 1 nm to 6 nm, although lesser and greater thicknesses may also be employed.

At least one conductive material is deposited in the drain-select-level backside recesses 343, on the sidewalls of the drain-select-level isolation trenches 71 and the drain-select-level backside trenches 171, and over the top surface of the sacrificial planarization stopper layer 373. The at least one conductive material may comprise, for example, a drain-select-level metallic barrier liner including a metallic barrier material (such as TiN, TaN, MoN or WN) and a drain-select-level metallic fill material that includes a metal such as W, Co, Ru, Mo, etc. The at least one conductive material can be deposited by a conformal deposition method, which can be, for example, chemical vapor deposition (CVD), atomic layer deposition (ALD), electroless plating, electroplating, or a combination thereof.

Portions of the at least one conductive material that are present over the insulating cap layer 70, in the drain-select-level isolation trenches 71, or in the drain-select-level backside trenches 171 can be removed by performing an anisotropic etch process selective to the materials of the insulating cap layer 70 and the insulating layers 32. Remaining portions of the at least one conductive material located within the drain-select-level backside recesses 343 constitute drain-select-level electrically conductive layers (i.e., drain side select gate electrodes) 346. Each of the at least one subset of the sacrificial material layers 42 located at the drain select levels is replaced with at least one drain-select-level electrically conductive layer 346. Each of the at least one drain-select-level electrically conductive layer 346 includes multiple discrete segments that are laterally spaced apart by the combination of the drain-select-level isolation trenches 71 and the drain-select-level backside trenches 171.

Figure 9A:
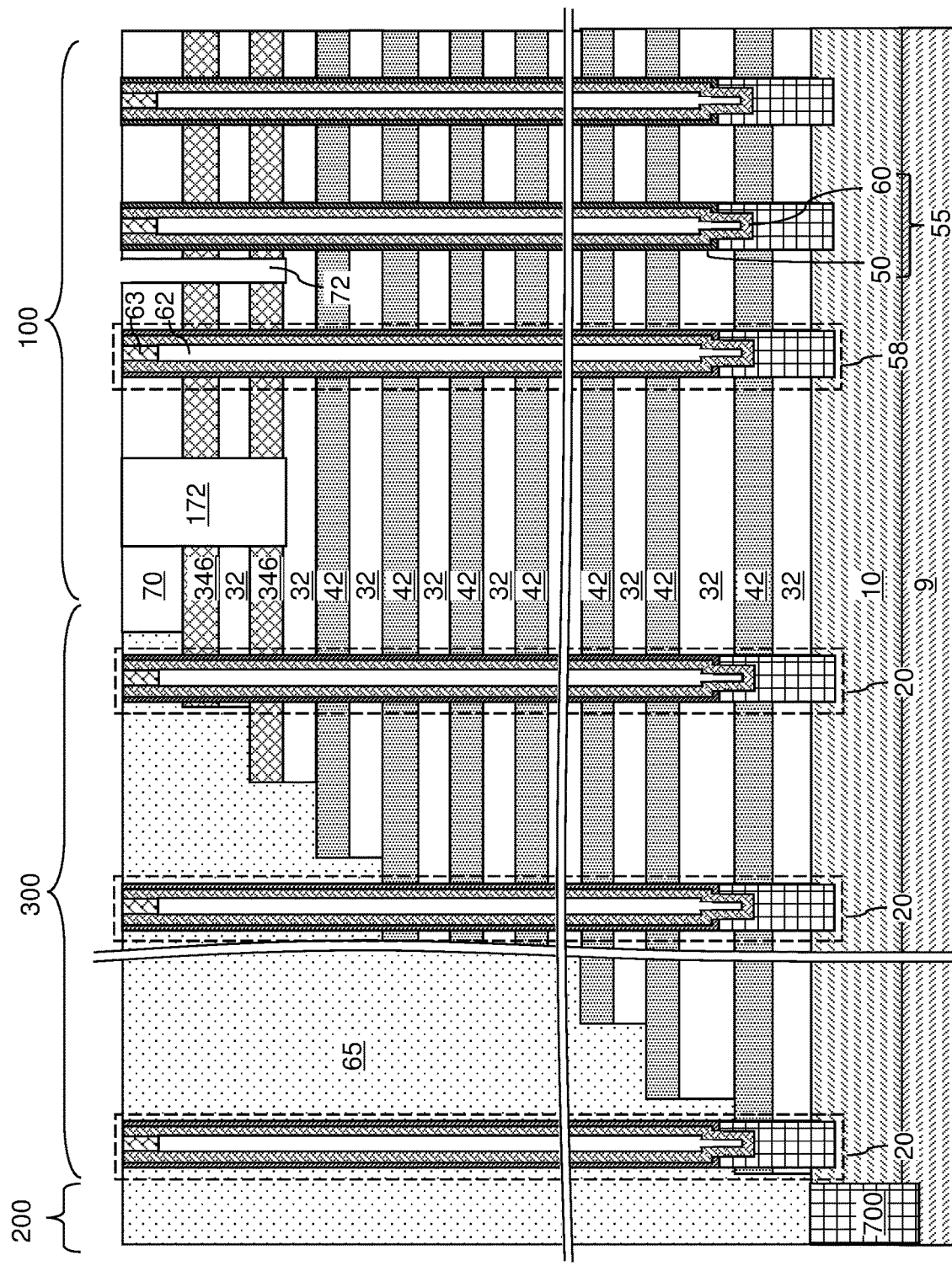
FIG. 9A is a schematic vertical cross-sectional view of the exemplary structure after formation of drain-select-level isolation structures according to an embodiment of the present disclosure.
Figure 9B:
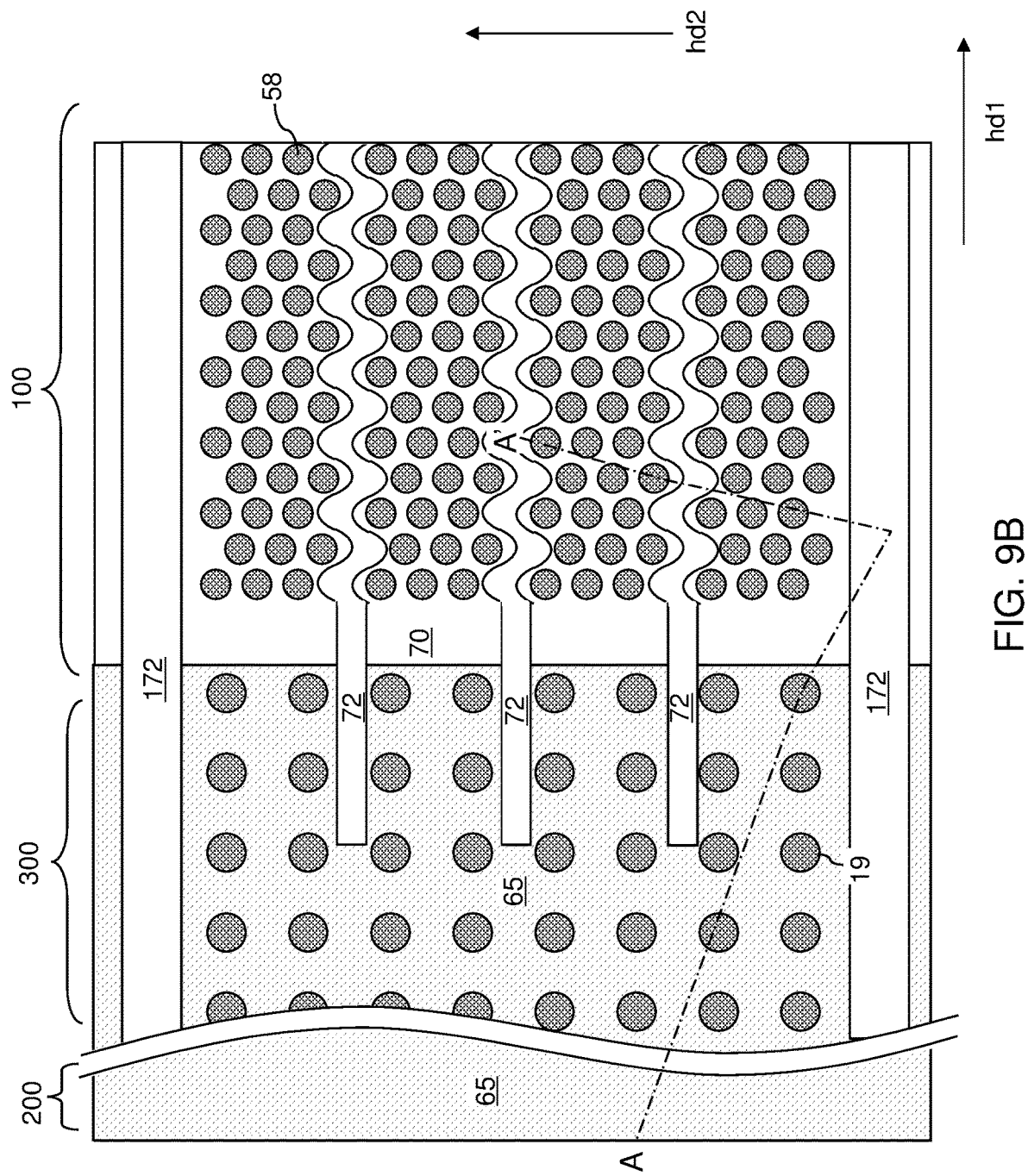
FIG. 9B is a top-down view of the first configuration of the exemplary structure of FIG. 9A. The vertical plane A-A' is the plane of the schematic vertical cross-sectional view of FIG. 9A.
Figure 9C:
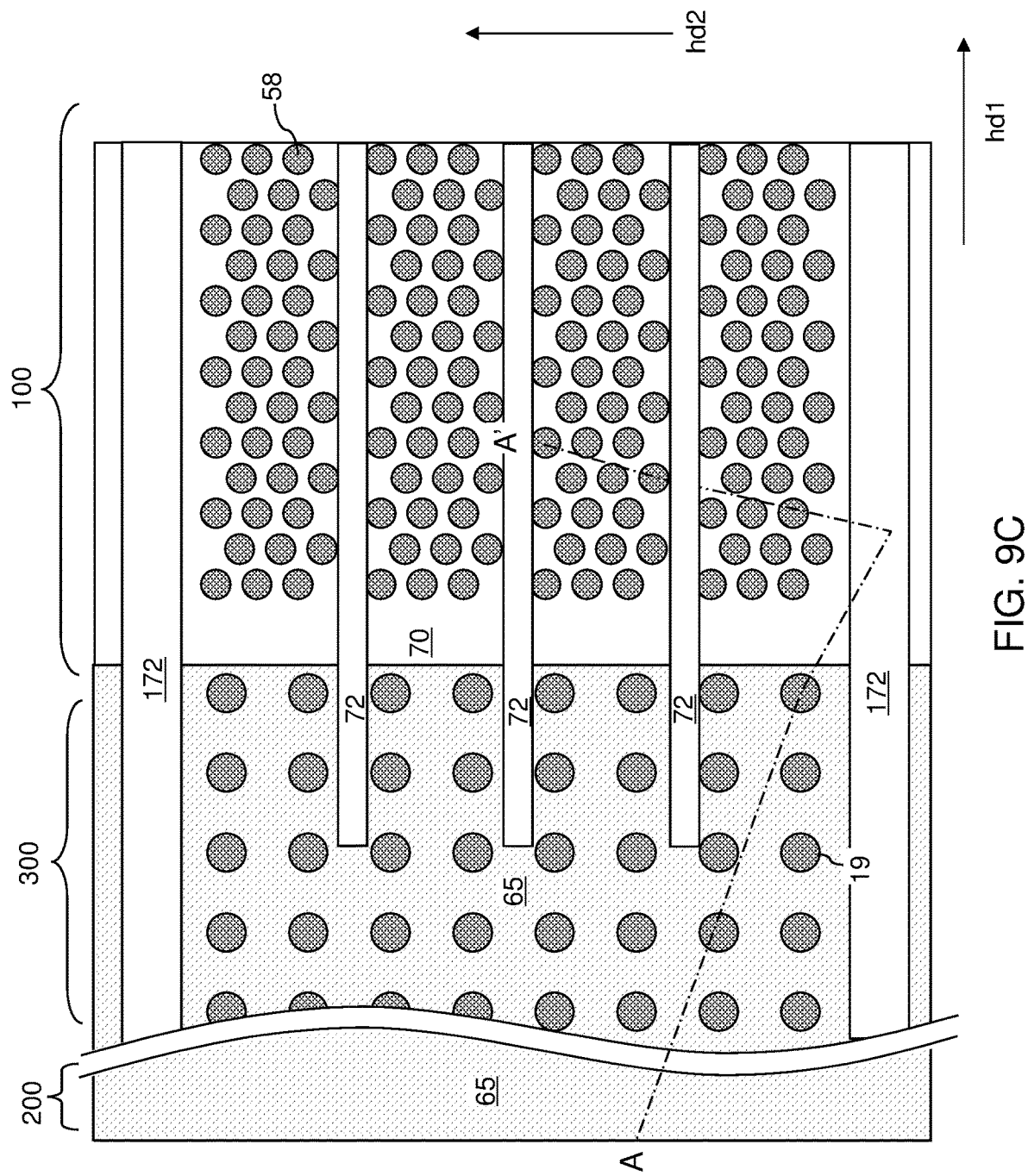
FIG. 9C is a top-down view of the second configuration of the exemplary structure of FIG. 9A. The vertical plane A-A' is the plane of the schematic vertical cross-sectional view of FIG. 9A.
Figure 10A:
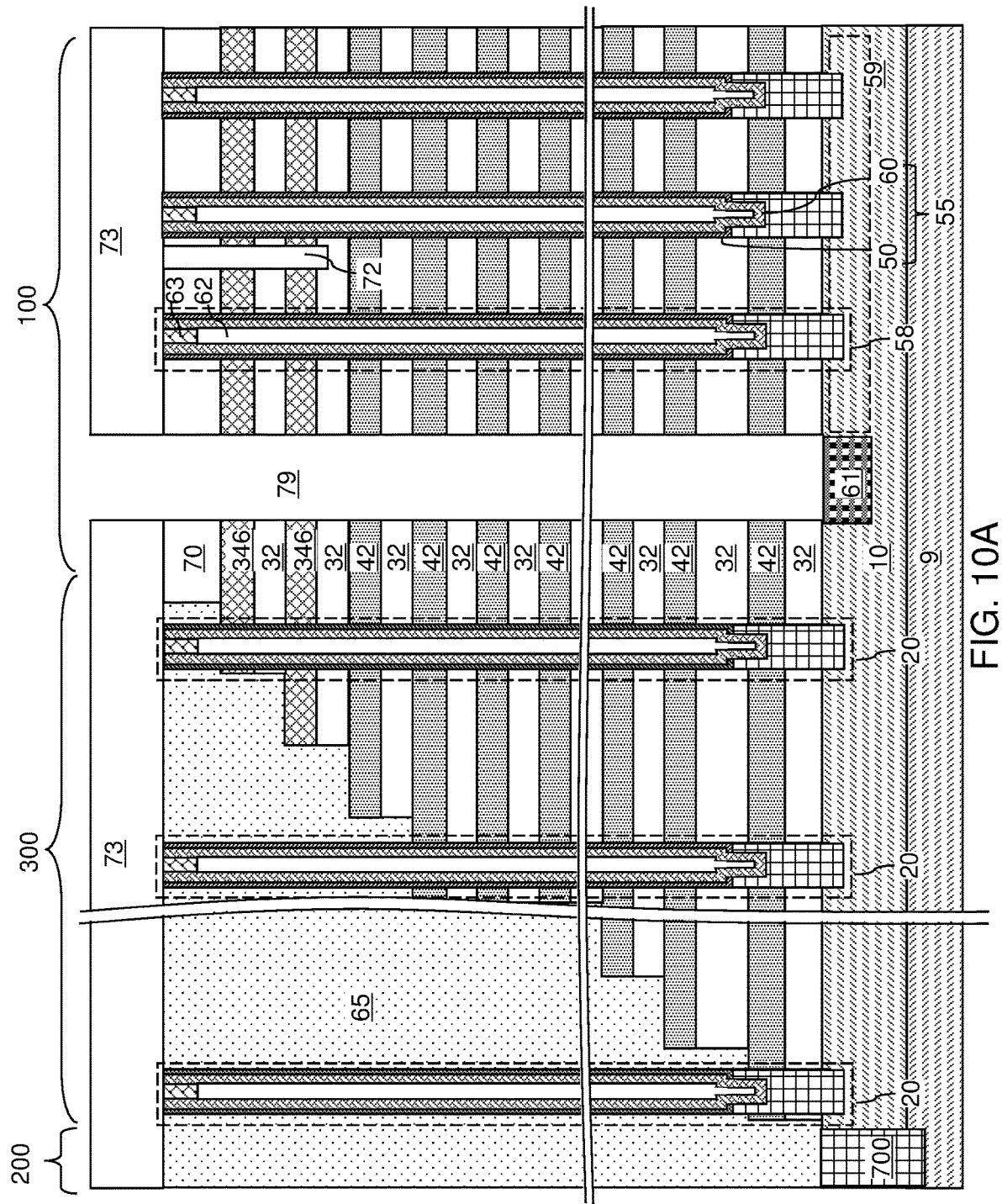
FIG. 10A is a schematic vertical cross-sectional view of the exemplary structure after formation of backside trenches according to an embodiment of the present disclosure.
Figure 10B:
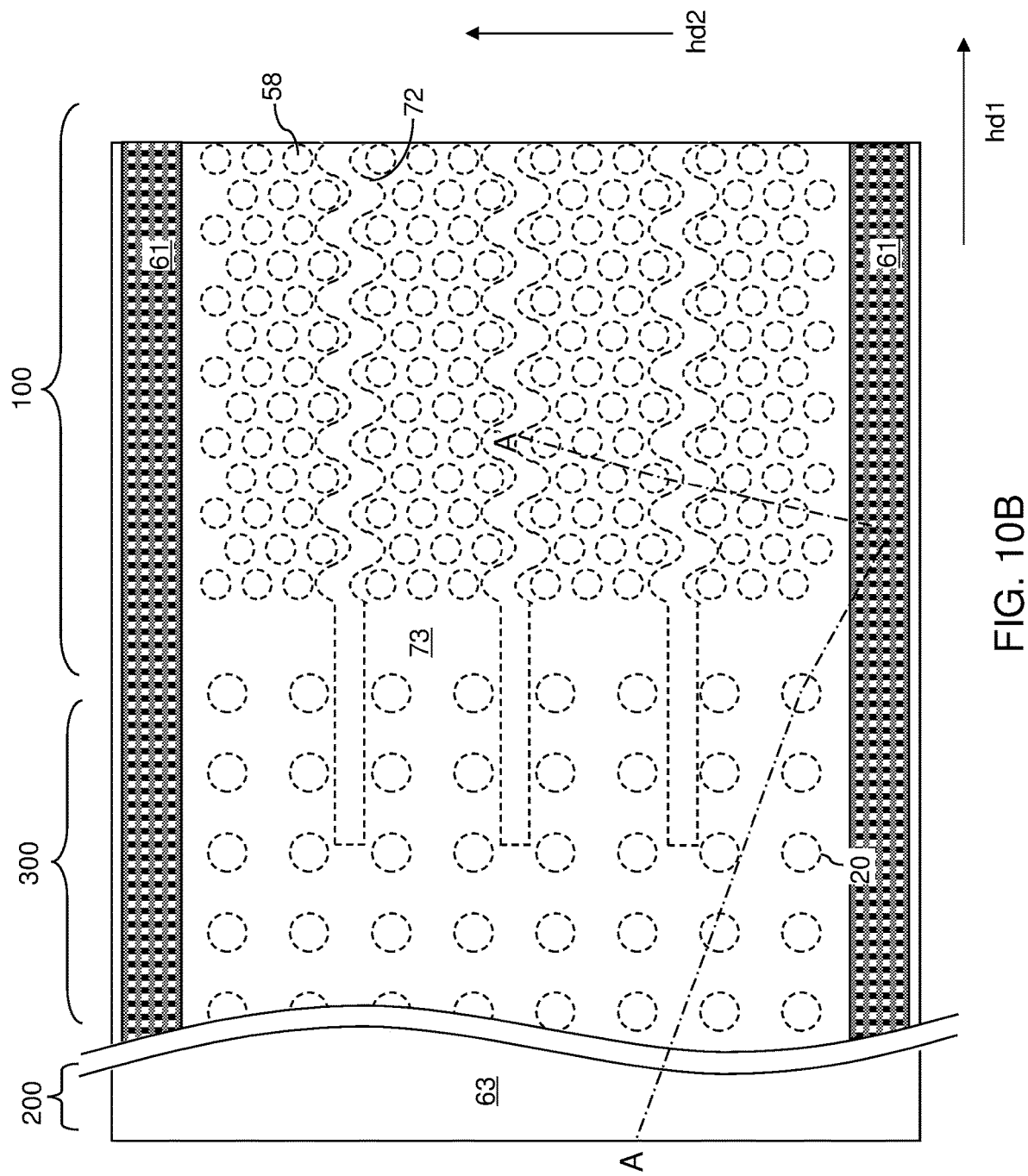
FIG. 10B is a top-down view of the first configuration of the exemplary structure of FIG. 10A. The vertical plane A-A' is the plane of the schematic vertical cross-sectional view of FIG. 10A.
Figure 10C:
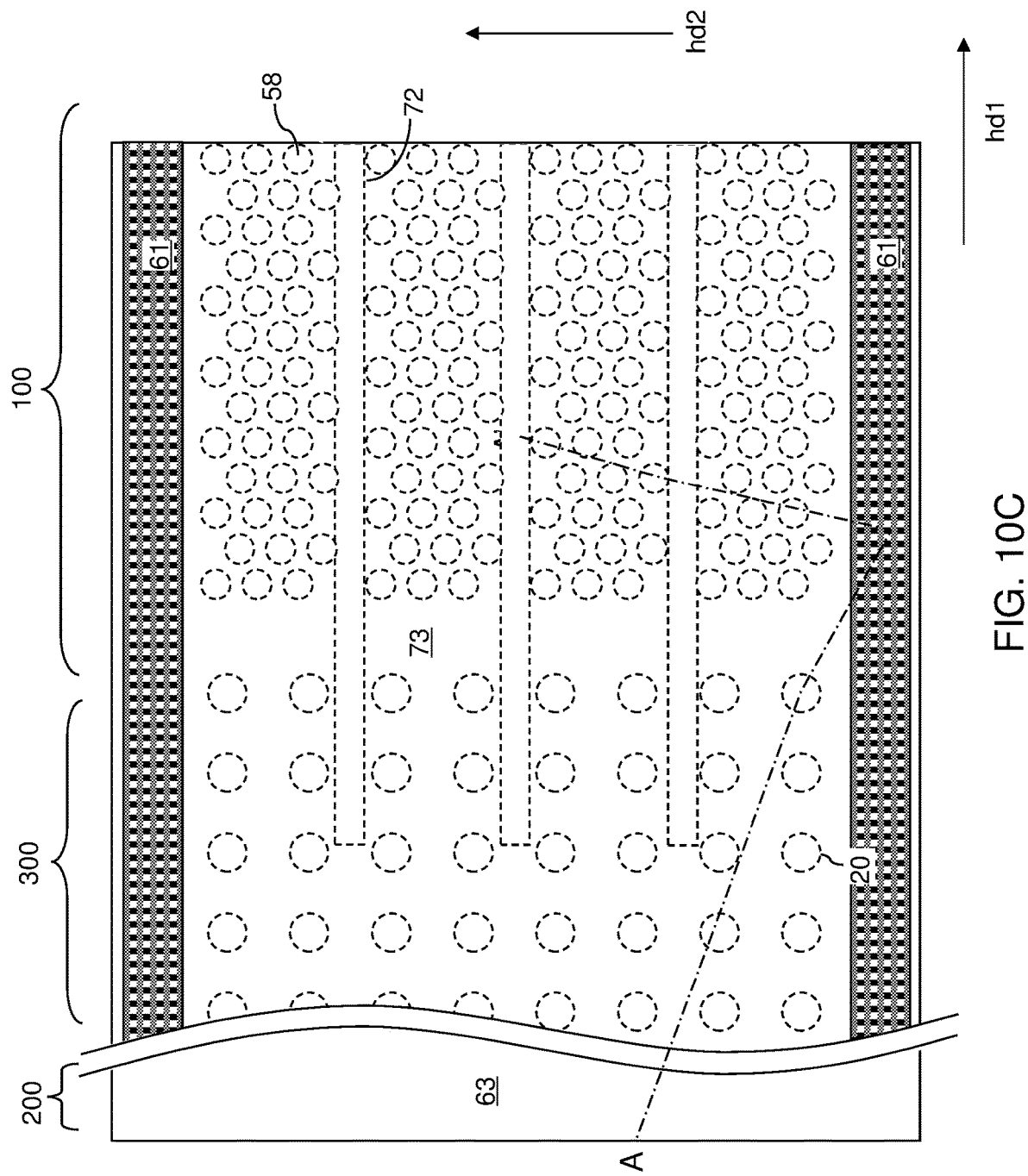
FIG. 10C is a top-down view of the second configuration of the exemplary structure of FIG. 10A. The vertical plane A-A' is the plane of the schematic vertical cross-sectional view of FIG. 10A.
Figure 10D:
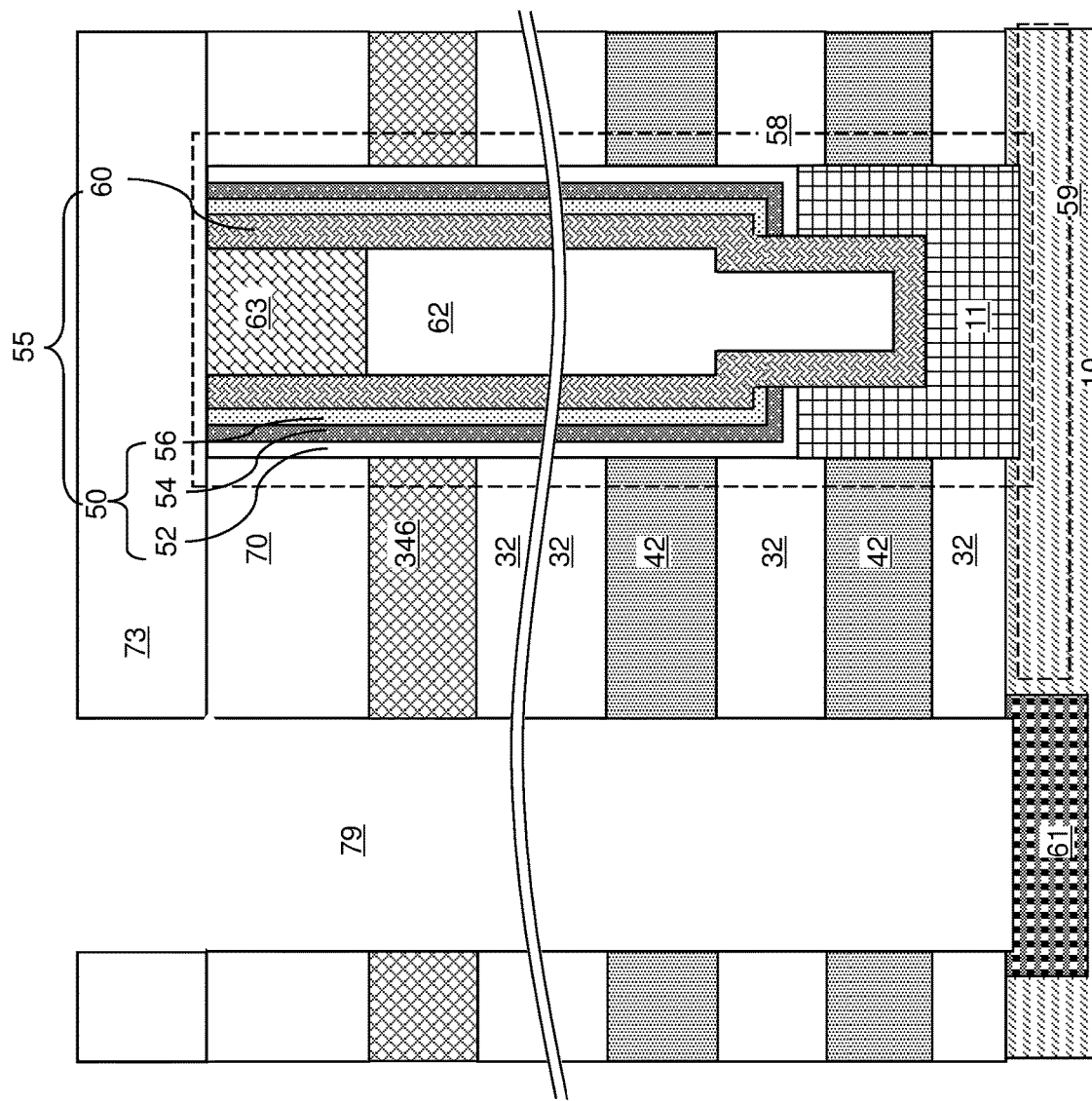
FIG. 10D is a magnified view of a region of FIG. 10A.

Referring to FIGS. 9A-9C, a dielectric fill material such as silicon oxide can be deposited in the drain-select-level isolation trenches 71 and the drain-select-level backside trenches 171. Excess portions of the dielectric fill material can be removed from above the horizontal plane including the top surface of the insulating cap layer 70 by a planarization process, which may employ a chemical mechanical polishing (CMP) process or a recess etch process. Remaining portions of the dielectric fill material that fill the drain-select-level isolation trenches 71 comprise drain-select-level isolation structures 72. Remaining portions of the dielectric fill material that fill the drain-select-level backside trenches 171 comprise drain-select-level backside trench fill structures 172. The drain-select-level isolation structures 72 are formed directly on sidewalls of the at least one drain-select-level electrically conductive layer 346. Each drain-select-level isolation structure 72 can be formed within a volume of a drain-select-level isolation trench 71.

In the first configuration of the exemplary structure of which a top-down view is illustrated in FIG. 9B, each of the at least one drain-select-level isolation structure 72 comprises a periodic repetition of lateral wiggles along the second horizontal direction hd2. In one embodiment, the memory opening fill structures 58 comprise multiple rows of memory opening fill structures 58 that are arranged along the first horizontal direction hd1 with a first pitch, and the periodic repetition of lateral wiggles has a periodicity of the first pitch along the first horizontal direction hd1.

In the second configuration of the exemplary structure of which a top-down view is illustrated in FIG. 9C, each of the at least one drain-select-level isolation structure 72 may have a pair of lengthwise sidewalls that are parallel to each other and laterally extend along the first horizontal direction hd1.

While the present disclosure is described employing an embodiment in which two or more drain-select-level isolation structures 72 are formed between areas for subsequently forming a neighboring pair of backside trenches, embodiments of the present disclosure may be practiced while omitting the processing steps of FIGS. 7 and 8 in case a single drain-select-level isolation structure 72 is formed between areas for subsequently forming a neighboring pair of backside trenches. In other words, replacement of a subset of the sacrificial material layers 42 located at drain select levels with drain-select-level electrically conductive layers 346 may be omitted in case a single drain-select-level isolation structure 72 is formed between areas for subsequently forming a neighboring pair of backside trenches. In this alternative embodiment, all sacrificial material layers 42 may be subsequently replaced with electrically conductive layers after formation of backside trenches through the alternating stack (32, 42). In this case, formation of the drain-select-level backside trenches 171 at the processing steps of FIGS. 6A-6C may be omitted. Thus, formation of the drain-select-level backside trench fill structures 172 may be omitted.

Generally, at least one drain-select-level isolation structure 72 comprising a dielectric material can be formed through at least one spacer material layer including a topmost spacer material layer within the alternating stack (32, 42). In the alternative embodiment in which the processing steps of FIGS. 7 and 8 are omitted and formation of the drain-select-level backside trenches 171 at the processing steps of FIGS. 6A-6C is omitted, the at least one spacer material layer can be at least one sacrificial material layers 42. In the embodiment described in FIGS. 6A-6C, 7, 8, and 9A-9C, at least one drain-select-level isolation structure 72 comprising a dielectric material can be formed through at least one electrically conductive layer (i.e., the at least one drain-select-level electrically conductive layer 346) including a topmost electrically conductive layer within the alternating stack of insulating layers 32 and spacer material layers that include remaining sacrificial material layers 42 and the drain-select-level electrically conductive layers 346.

Neighboring pairs of periodic two-dimensional arrays of memory openings 49 are laterally spaced apart along the second horizontal direction hd2 by a respective drain-selectlevel isolation structure 72 that vertically extends through at least one spacer material layer (which may be at least one electrically conductive layer including a topmost electrically conductive layer, or at least one sacrificial material layer 42 including a topmost sacrificial material layer 42 in the alternative embodiment) within the alternating stack of insulating layers 32 and spacer material layers. In the first configuration of the exemplary structure, the respective drain-select-level isolation structure 72 laterally extends along the first horizontal direction hd1 with lateral wiggles along the second horizontal direction hd2, and the lateral wiggles have a periodicity that is the same as twice the intercolumnar pitch pc. In the second configuration, the respective drain-select-level isolation structure 72 laterally extends along the first horizontal direction hd1 with straight lengthwise sidewalls that are parallel to the first horizontal direction hd1. In the embodiments shown in FIGS. 9B and 9C, each column Ci of memory openings 49 has three memory openings 49 between a pair of adjacent drain-select-level isolation structures 72.

Referring to FIGS. 10A-10D, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. In case drain-select-level backside trench fill structures 172 are present in the exemplary structure, the pattern of openings in the photoresist layer can be the same as the pattern of the drain-select-level backside trench fill structures 172. Generally, the openings in the photoresist layer are formed between clusters of two-dimensional periodic arrays of memory opening fill structures 58 in a respective area in which the memory opening fill structures 58 are not present.

The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1 and in columns Ci that extend along the second horizontal direction hd2. The drain-select-level isolation structures 72 can laterally extend generally along the first horizontal direction hd1 with, or without, lateral wiggles along the second horizontal direction hd1. Each backside trench 79 can have a uniform width that is invariant along the lengthwise direction (i.e., along the first horizontal direction hd1), and may be free of lateral wiggles.

A two-dimensional periodic array of memory opening fill structures 58 can be located between a neighboring pair of a backside trench 79 and a drain-select-level isolation structure 72, or between a neighboring pair of drain-select-level isolation structures 72. Each two-dimensional periodic array of memory opening fill structures 58 can include multiple columns Ci of memory opening fill structures 58 that are laterally spaced apart along the first horizontal direction hd1. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 73 and the alternating stack (32, 42, optionally 346). The alternating stack (32, 42, optionally 346) of the processing steps of FIGS. 9A-9C is divided into multiple alternating stacks (32, 42, optionally 346) that are laterally spaced apart along the second horizontal direction hd2 by the backside trenches 79. Layer stacks (32, 42, optionally 346, 70, 73) are formed, each of which includes a respective patterned portion of the contact-level dielectric layer 73 and a respective patterned portion of the alternating stack (32, 42, optionally 346) as formed at the processing steps of FIGS. 9A-9C and laterally spaced among one another by the backside trenches 79.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 11A:
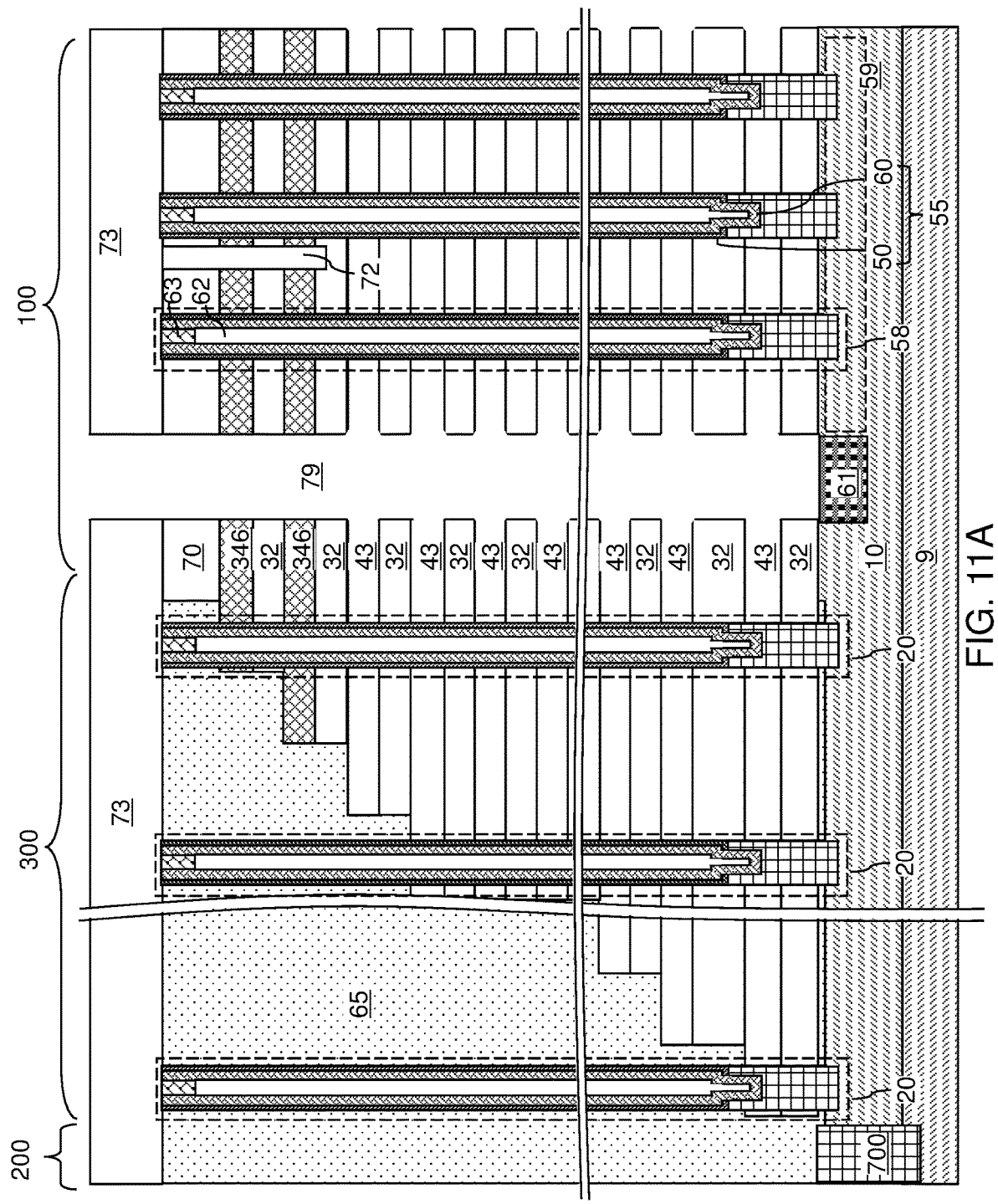
FIG. 11A is a schematic vertical cross-sectional view of the exemplary structure after formation of backside recesses according to an embodiment of the present disclosure.
Figure 11B:
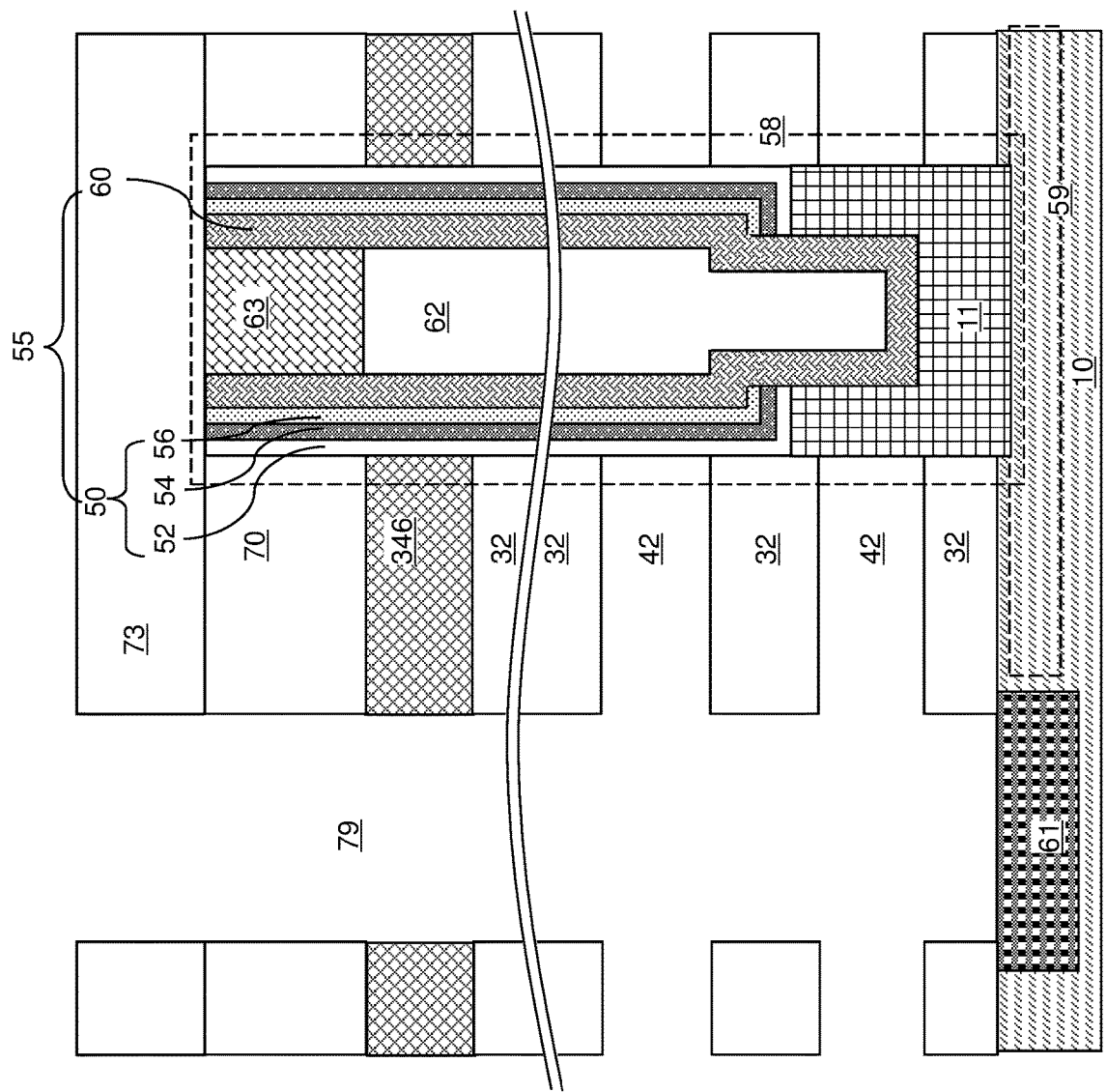
FIG. 11B is a magnified view of a region of FIG. 11A.

Referring to FIGS. 11A and 11B, an etchant that selectively etches the second material of the sacrificial material layers 42 with respect to the first material of the insulating layers 32 can be introduced into the backside cavities 79', for example, employing an etch process. In case drain-select-level electrically conductive layers 346 are present, the etchant etches the second material of the sacrificial material layers 42 selective to the material of the drain-select-level electrically conductive layers 346. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, the material of the drain-select-level electrically conductive layers 346 (if present), and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Generally, the backside recesses 43 can be formed by removing the sacrificial material layers 42 (which are patterned portions of the sacrificial material layers as formed at the processing steps of FIG. 3) selective to the insulating layers 32 (which are patterned portions of the insulating layers 32 as formed at the processing steps of FIG. 3).

Figure 12A:
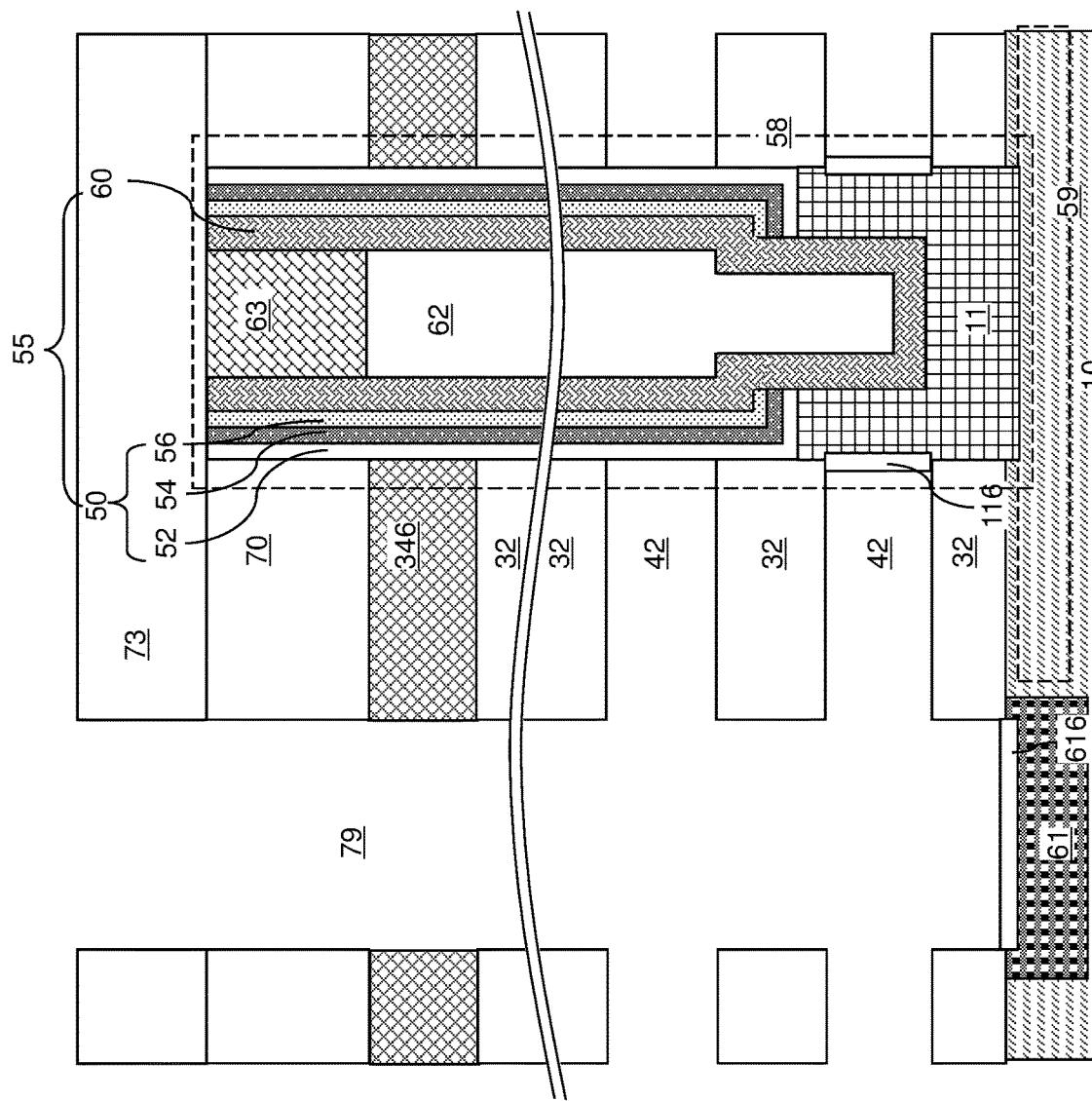
FIGS. 12A-12C are sequential vertical cross-sectional views of a region of the exemplary structure during formation of electrically conductive layers according to an embodiment of the present disclosure.

Referring to FIG. 12A, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 12B:
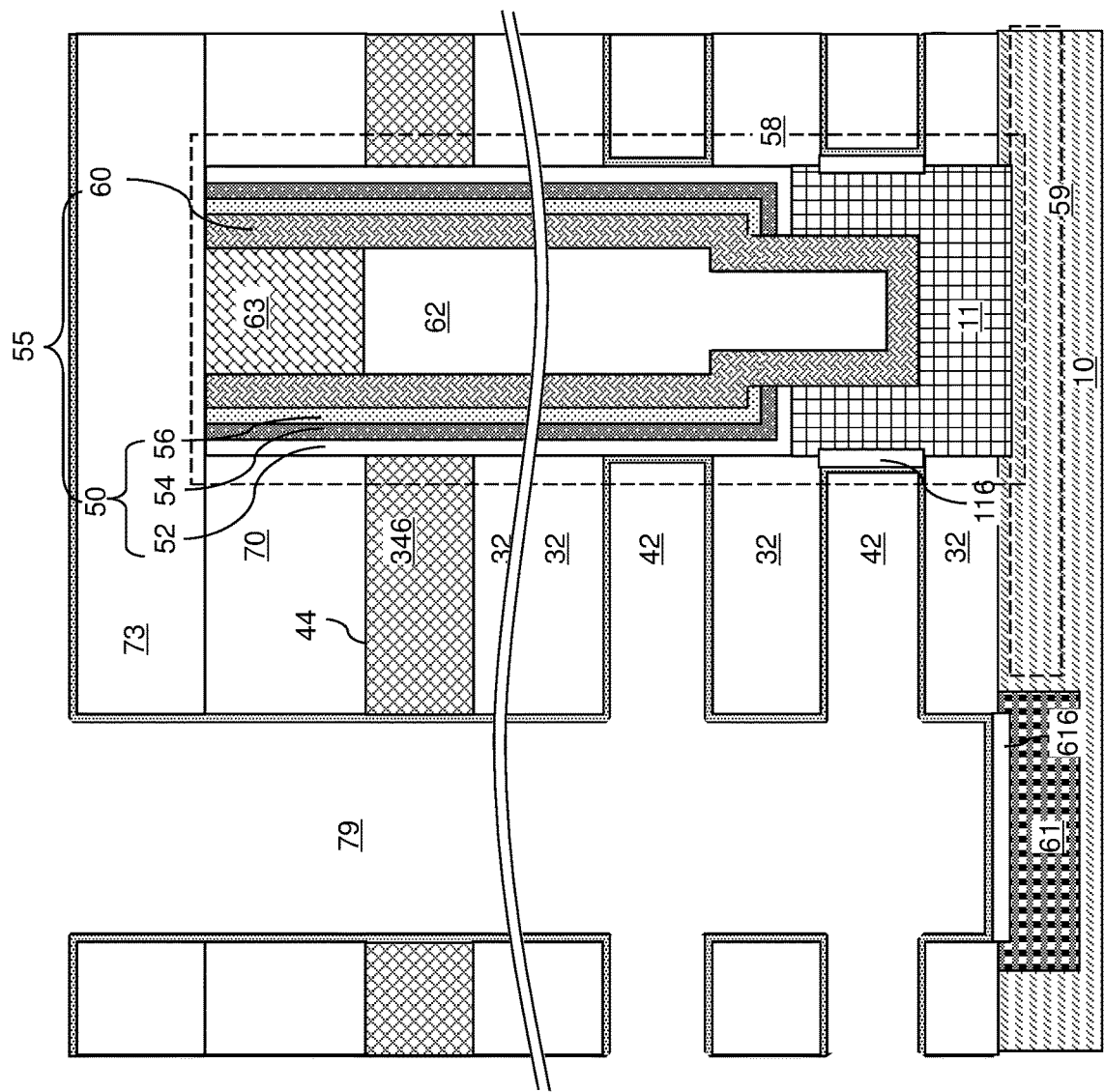

Referring to FIG. 12B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 12C:
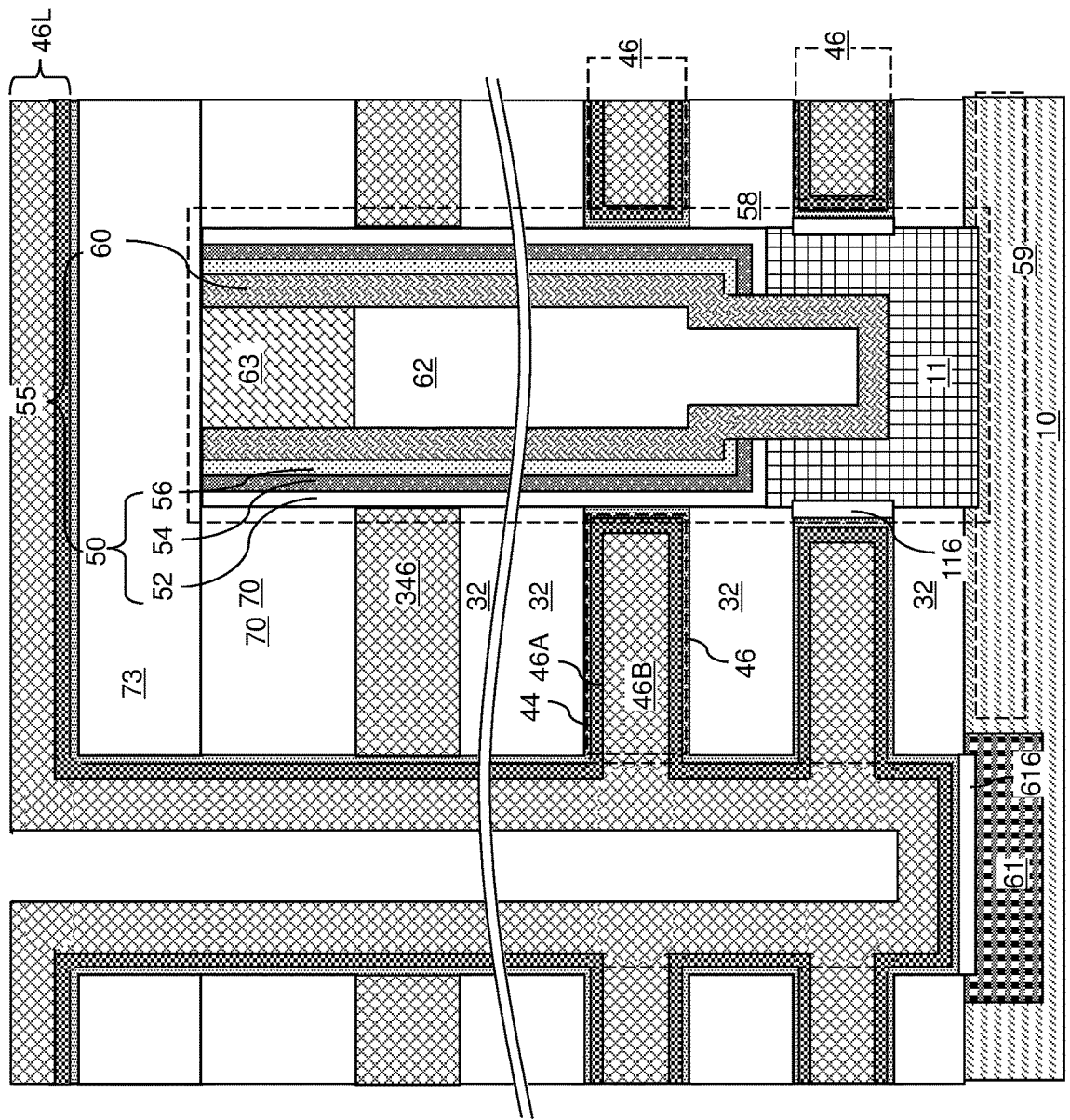
Figure 13A:
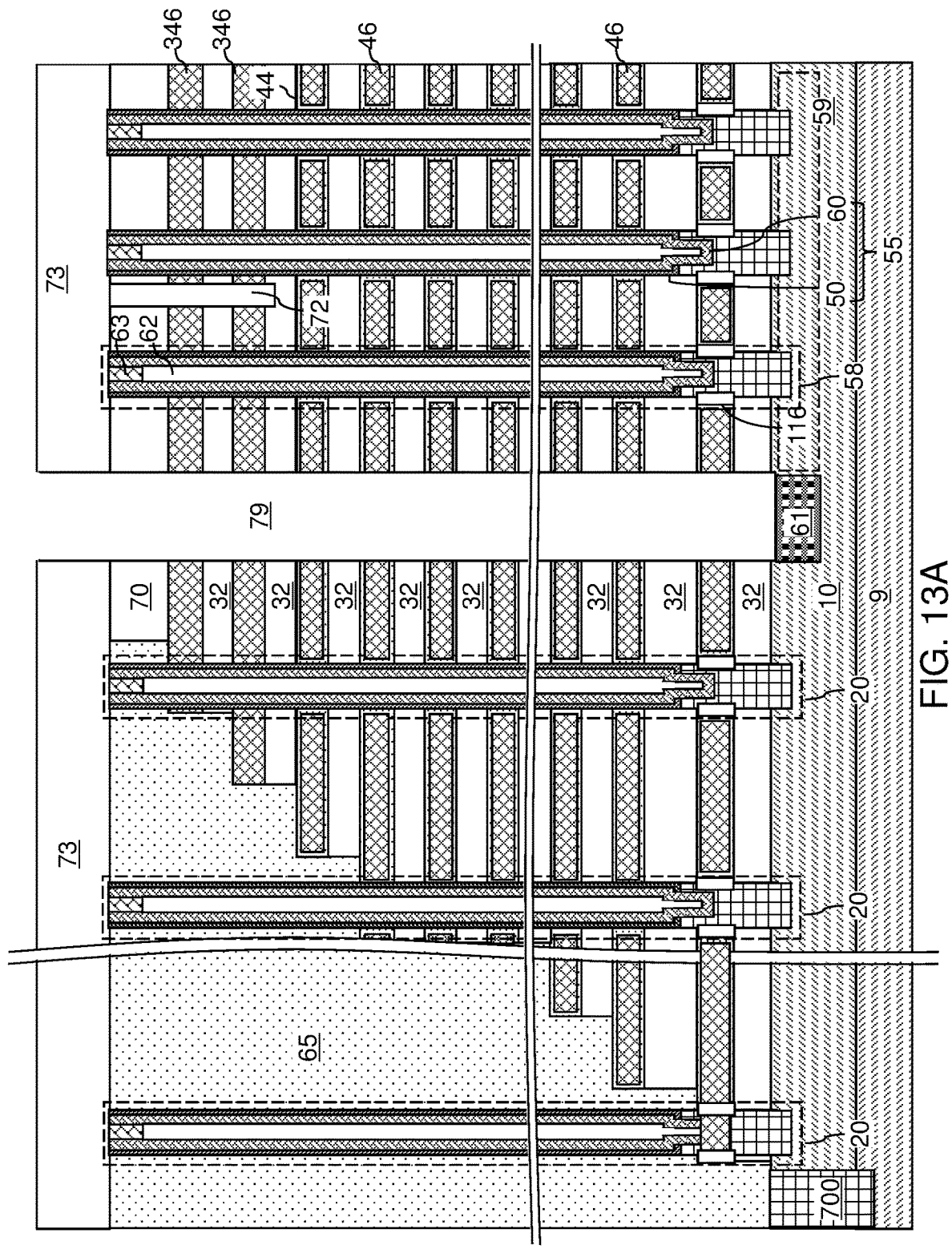
FIG. 13A is a schematic vertical cross-sectional view of the exemplary structure after removal of a deposited conductive materials from within the backside trenches according to an embodiment of the present disclosure.
Figure 13B:
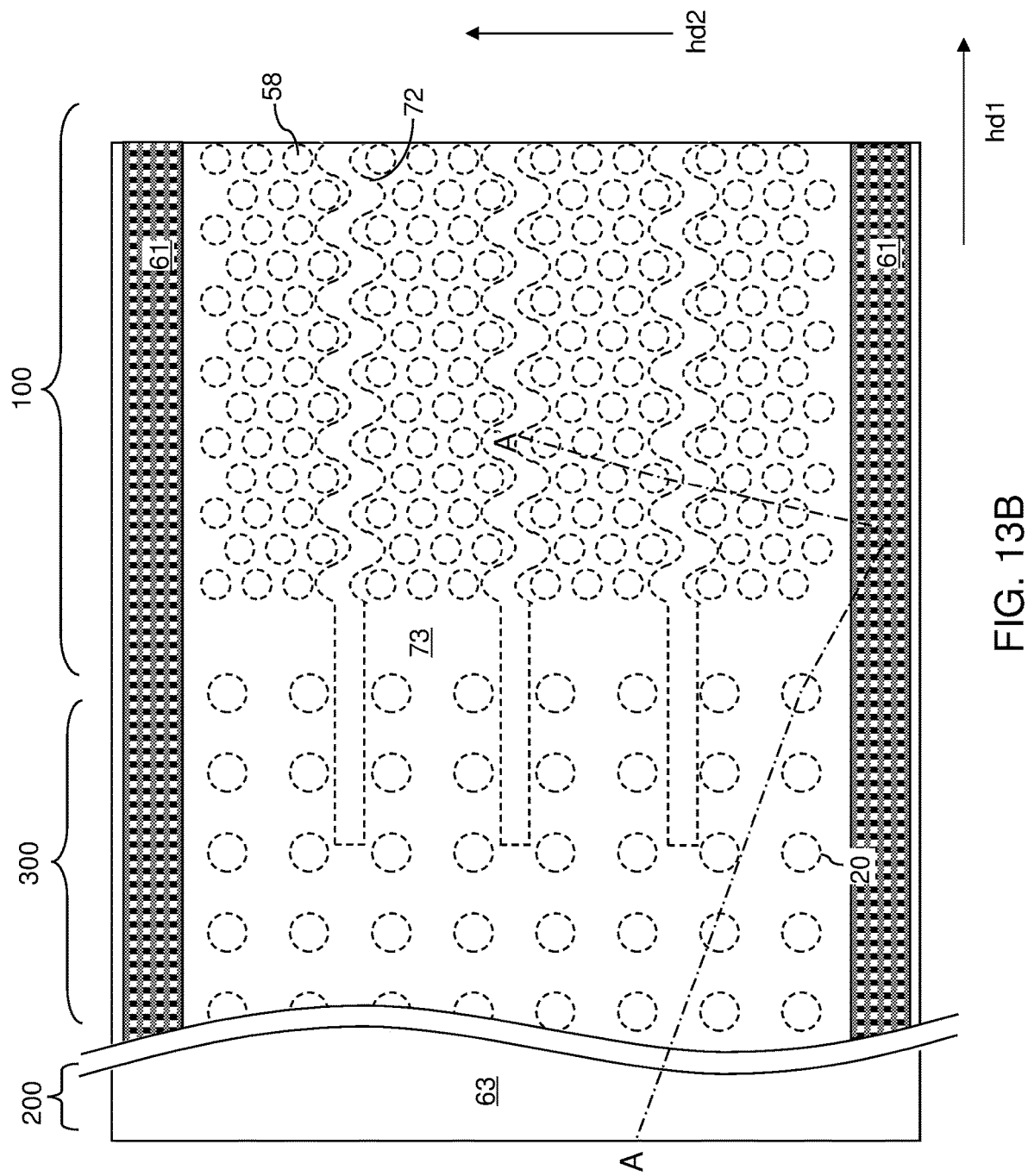
FIG. 13B is a top-down view of the first configuration of the exemplary structure of FIG. 13A. The vertical plane A-A' is the plane of the schematic vertical cross-sectional view of FIG. 13A.
Figure 13C:
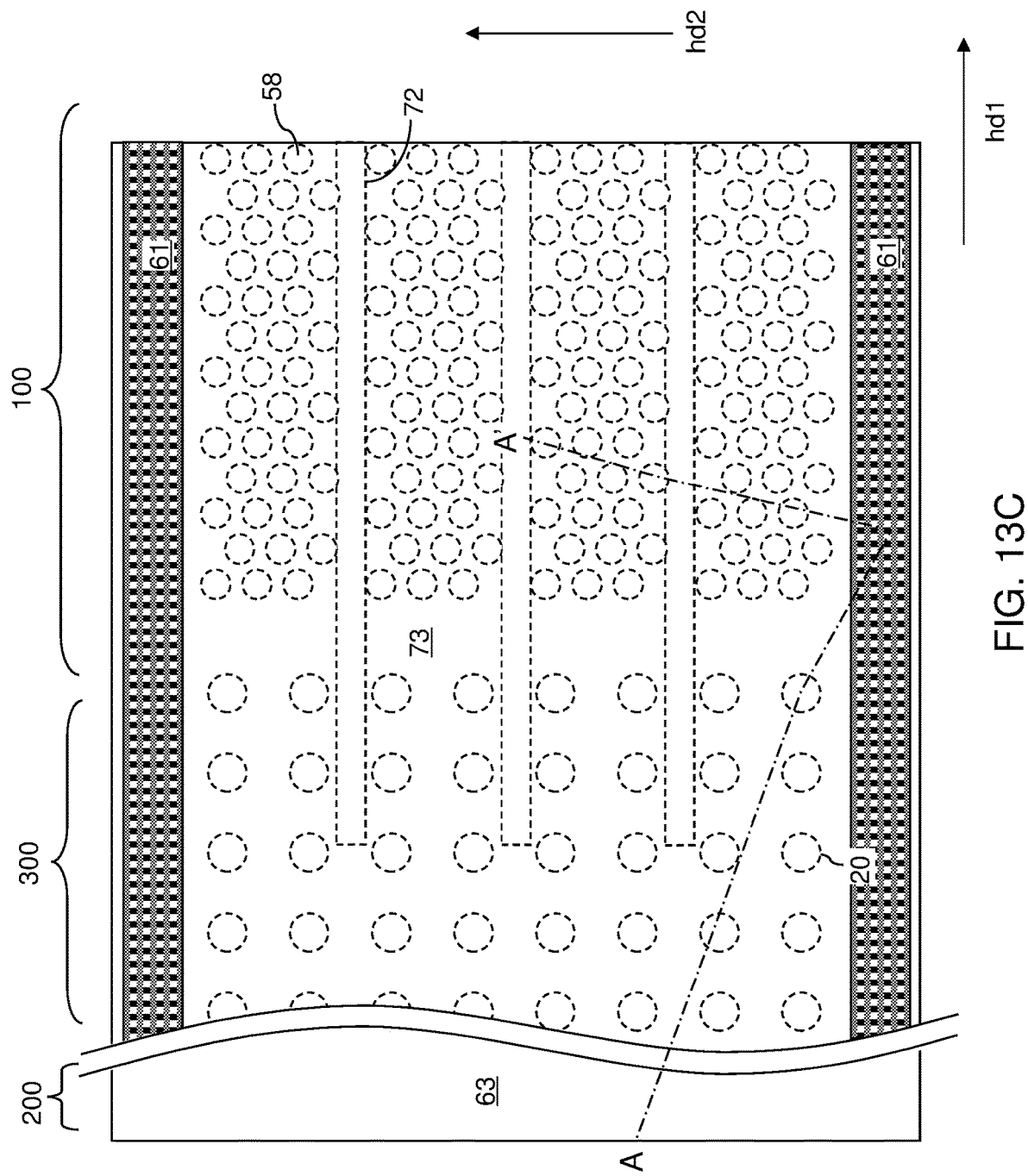
FIG. 13C is a top-down view of the second configuration of the exemplary structure of FIG. 13A. The vertical plane A-A' is the plane of the schematic vertical cross-sectional view of FIG. 13A.
Figure 13D:
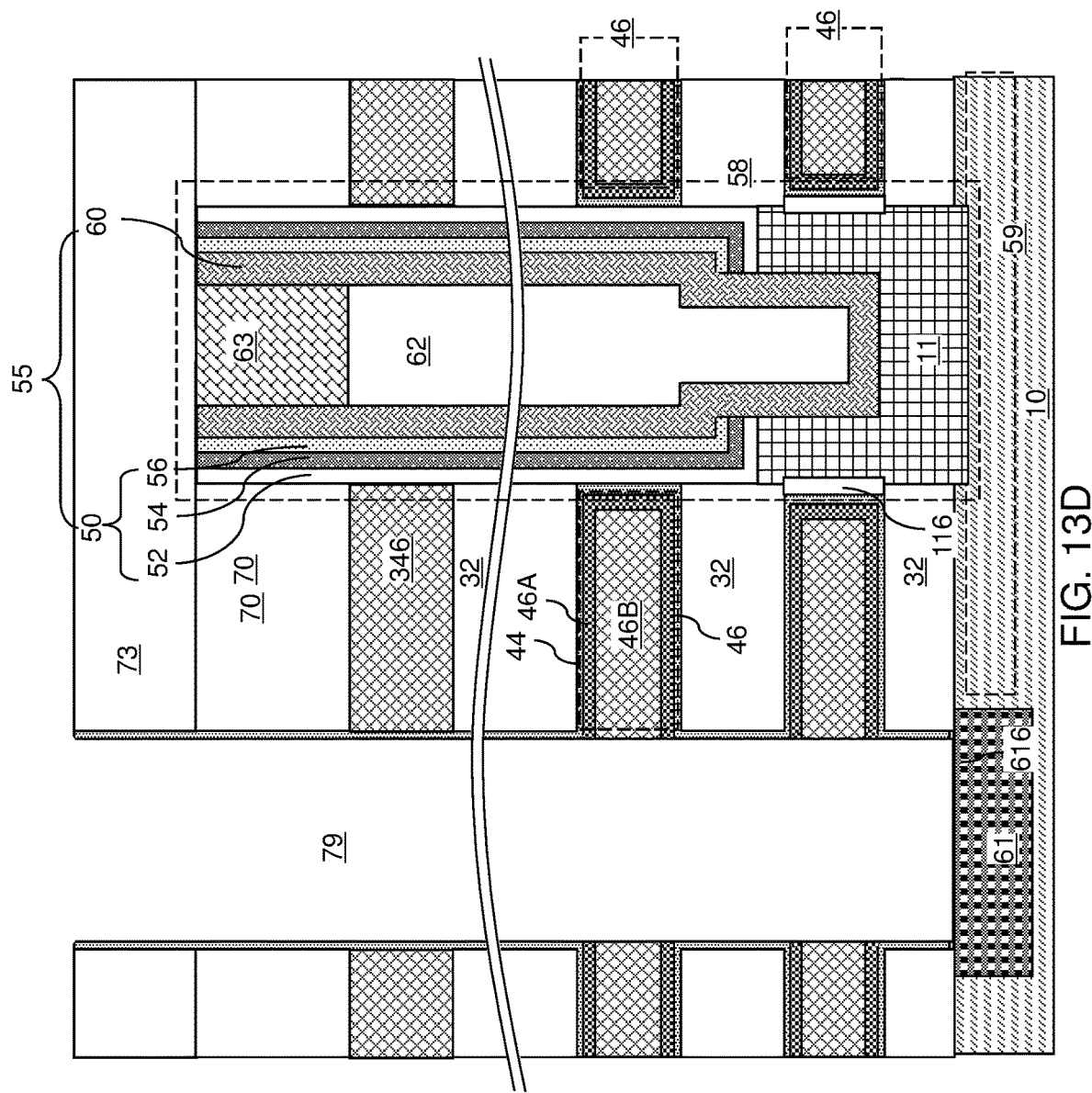
FIG. 13D is a magnified view of a region of FIG. 13A.

Referring to FIG. 12C, at least one conductive material can be deposited in the backside recesses 43 by providing at least one reactant gas into the backside recesses 43 through the backside trenches 79. A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, MoN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

Since the memory opening fill structures 58 are arranged in columns in a direction perpendicular to the backside trenches 79, straight line paths exist along the second horizontal direction hd2 between the columns of memory opening fill structures 58. Therefore, it may be easier to fill the backside recesses 43 with the metallic fill material layer 46B and the metallic barrier layer 46A because the metal precursors can flow in straight line paths from the backside trenches 79 through the backside recesses 43.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Referring to FIGS. 13A-13D, the deposited metallic material of the continuous electrically conductive material layer 46L is etched back from the sidewalls of each backside trench 79 and from above the contact-level dielectric layer 73 by performing an isotropic etch process that etches the at least one conductive material of the continuous electrically conductive material layer 46L. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79. Each backside cavity 79' continuous extends along the first horizontal direction hd1.

Figure 14:
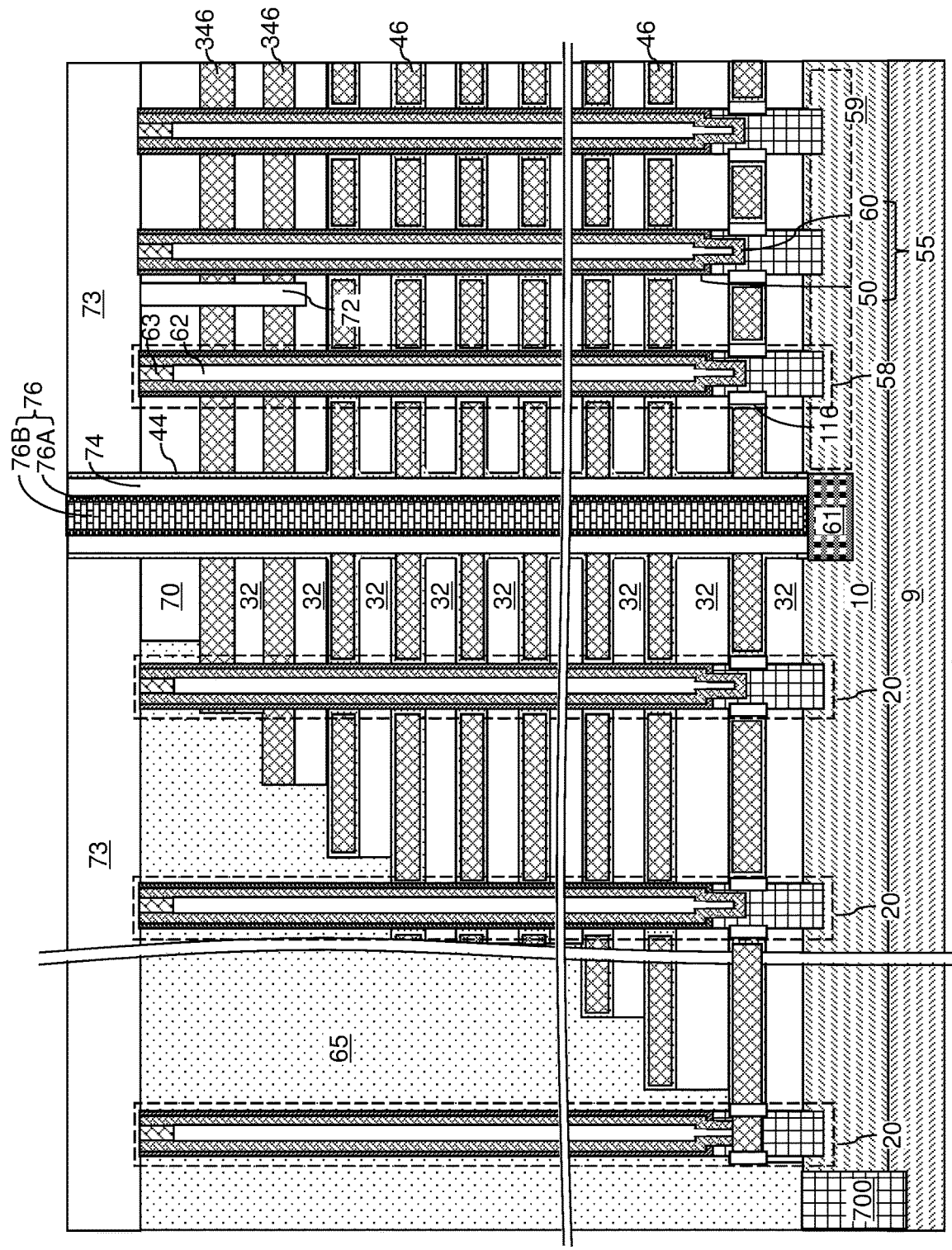
FIG. 14 is a schematic vertical cross-sectional view of the exemplary structure after formation of an insulating spacer and a backside contact structure within each backside trench according to an embodiment of the present disclosure.
Figure 15A:
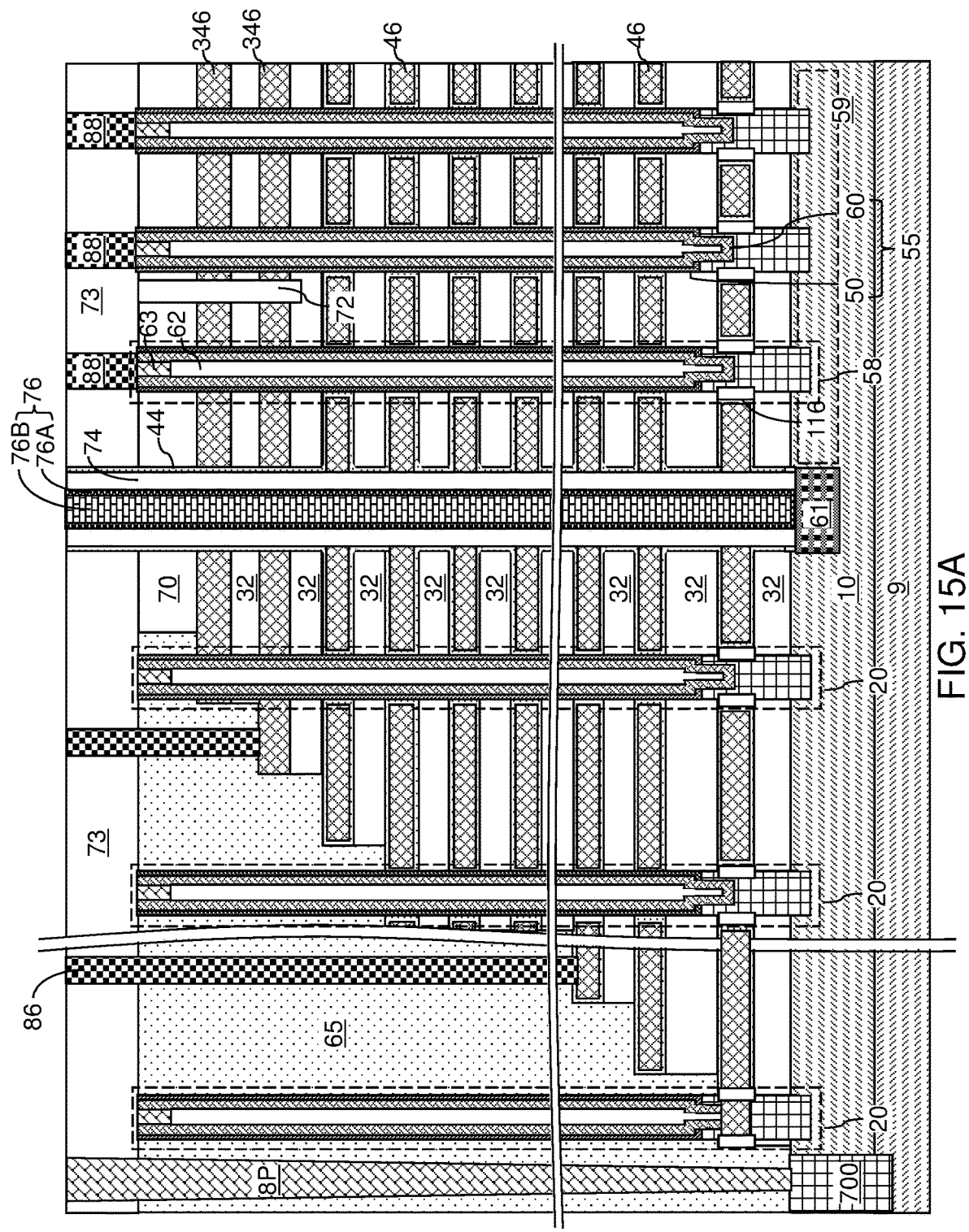
FIG. 15A is a schematic vertical cross-sectional view of the exemplary structure after formation of various contact via structures according to an embodiment of the present disclosure.
Figure 15B:
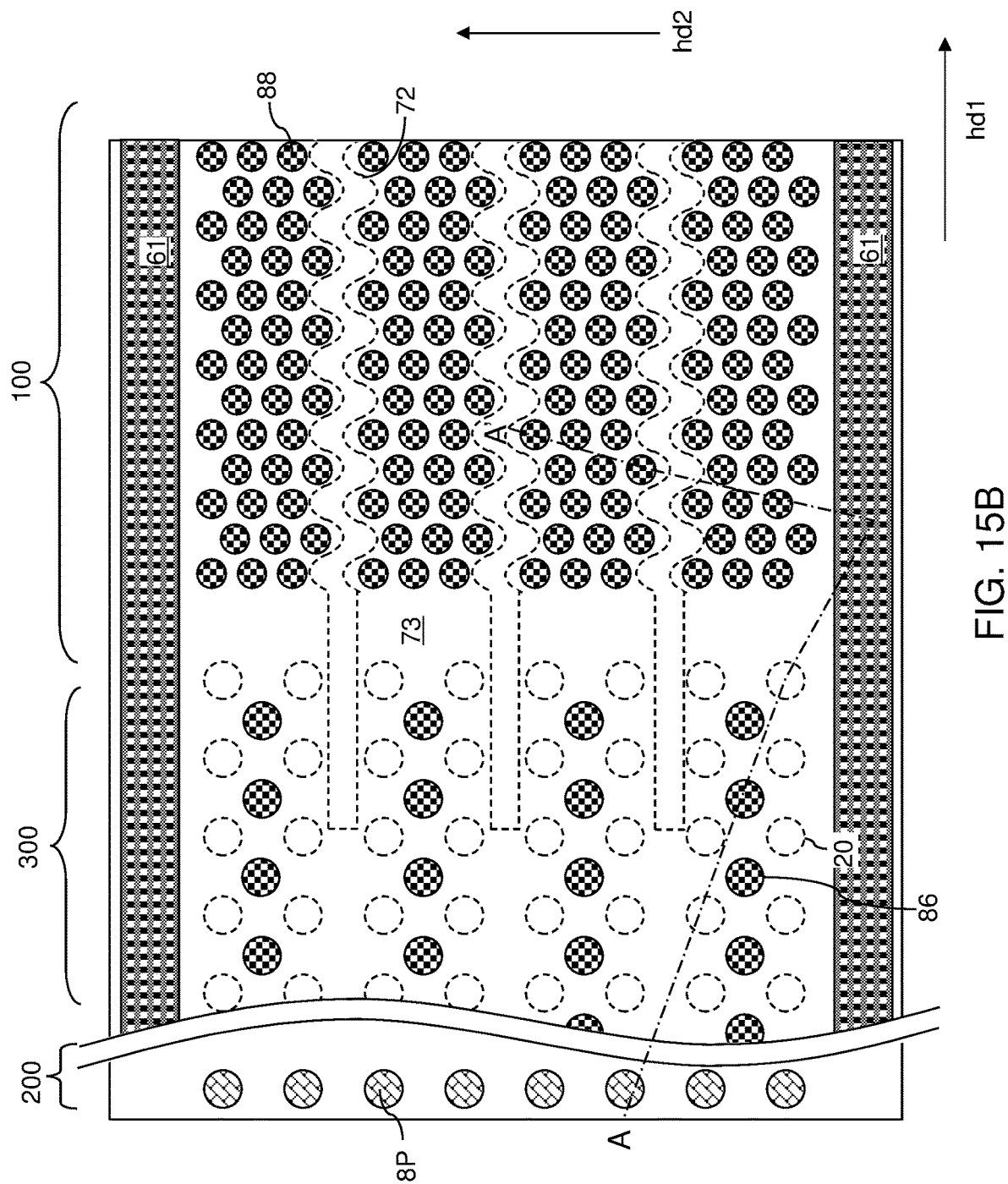
FIG. 15B is a top-down view of the first configuration of the exemplary structure of FIG. 15A. The vertical plane A-A' is the plane of the schematic vertical cross-sectional view of FIG. 15A.
Figure 15C:
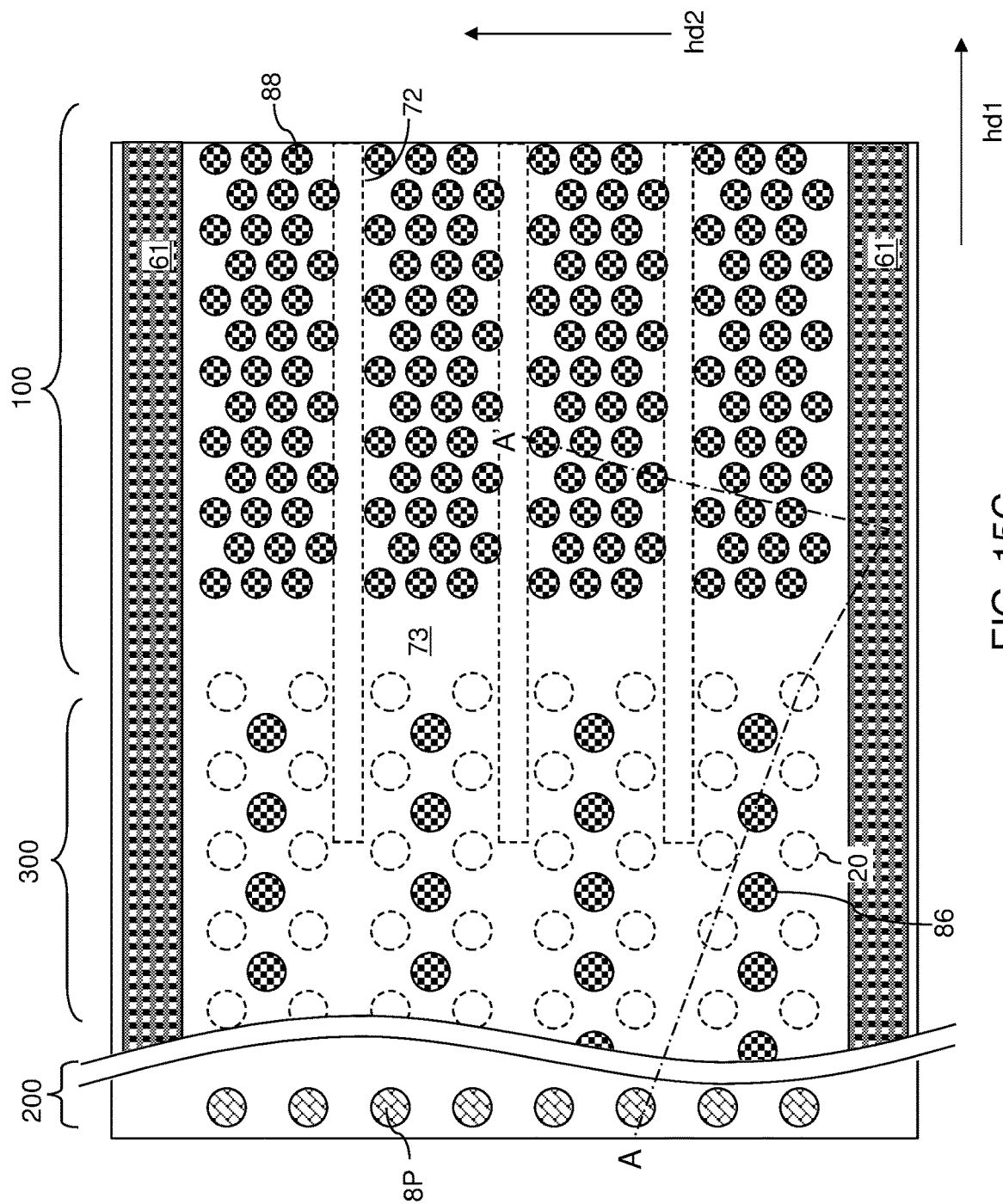
FIG. 15C is a top-down view of the second configuration of the exemplary structure of FIG. 15A. The vertical plane A-A' is the plane of the schematic vertical cross-sectional view of FIG. 15A.
Figure 15D:
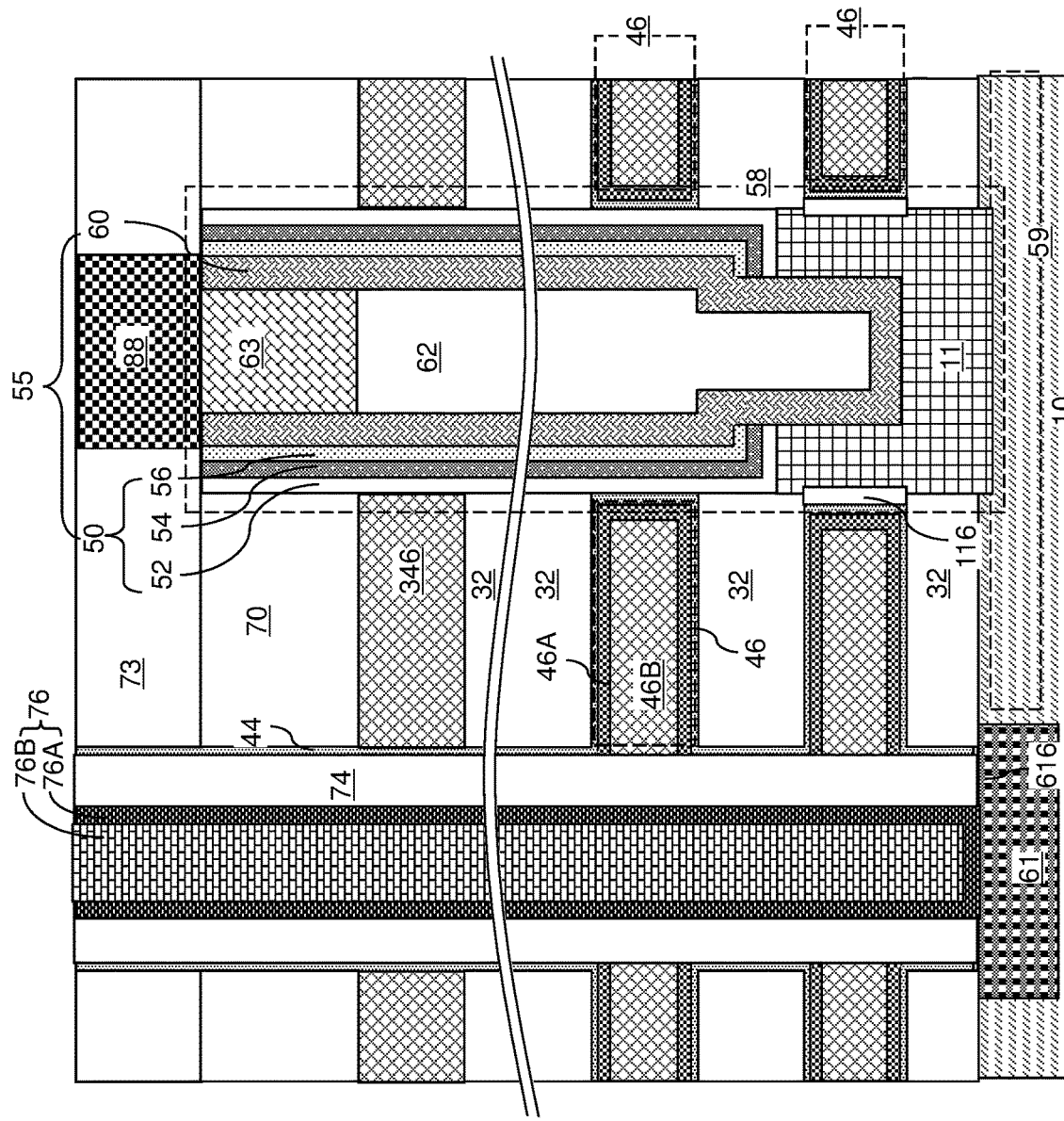
FIG. 15D is a magnified view of a region of FIG. 15A.

Referring to FIG. 14, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74.

A top surface of a source region 61 can be physically exposed at the bottom of each backside trench 79. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. Each backside contact via structure 76 extends through the alternating stacks (32, 46), and contacts a top surface of a respective source region 61. If a backside blocking dielectric layer 44 is employed, each backside contact via structure 76 can contact a sidewall of the backside blocking dielectric layer 44.

Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74. Each continuous combination of an insulating spacer 74 and a backside contact via structure 76 fills a respective backside trench 79, and is herein referred to as a backside trench fill structure (74, 76). In one embodiment, an alternating stack (or each alternating stack) of insulating layers 32 and electrically conductive layers (46, optionally 346) contacts a first backside trench fill structure (74, 76) laterally extending along the first horizontal direction hd1 and contacting a first sidewall of each layer within the alternating stack; and a second backside trench fill structure (74, 76) laterally extending along the first horizontal direction hd1 and contacting a second sidewall of each layer within the alternating stack. In one embodiment, each of the first backside trench fill structure (74, 76) and the second backside trench fill structure (74, 76) comprises: an insulating spacer 74 contacting the alternating stack (32, 46, optionally 346); and a backside contact via structure 76 laterally surrounded by the insulating spacer 74 and contacting a respective source region 61 embedded within the substrate (9, 10).

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Referring to FIGS. 15A-15D, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers (46, 346) through the contact-level dielectric layer 73, and through the retro-stepped dielectric material portion 65. Peripheral device contact via structures 8P can be formed through the retro-stepped dielectric material portion 65 directly on respective nodes of the peripheral devices.

Generally, a semiconductor device array including a two-dimensional array of doped semiconductor regions (such as drain regions 63) can be formed over a substrate (9, 10). In one embodiment, the semiconductor device array comprises a three-dimensional memory array including an alternating stack of insulating layers 32 and electrically conductive layers (46, 346) located over a substrate (9, 10); a two-dimensional array of memory openings 49 vertically extending through the alternating stack (32, 46); and a two-dimensional array of memory opening fill structures 58 located within the two-dimensional array of memory openings 49 and including a respective vertical semiconductor channel 60 and a respective vertical stack of memory elements (such as portions of the memory material layers 54 located at levels of the electrically conductive layers 46). The doped semiconductor material regions (such as the drain regions 63) are adjoined to a top end of a respective one of the vertical semiconductor channels 60.

Figure 16A:
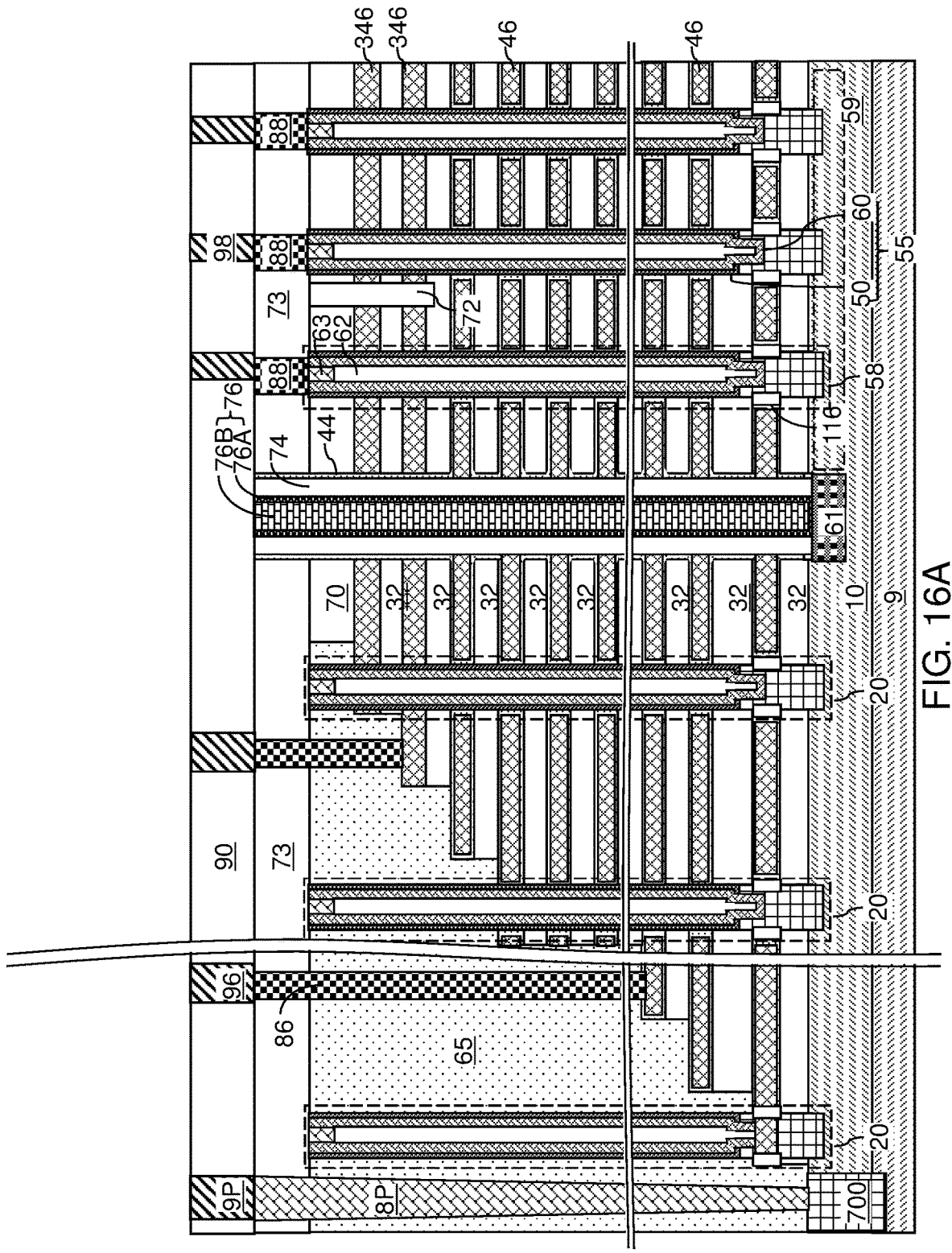
FIG. 16A is a schematic vertical cross-sectional view of the exemplary structure after formation of connection-level metal interconnect structures according to an embodiment of the present disclosure.
Figure 16B:
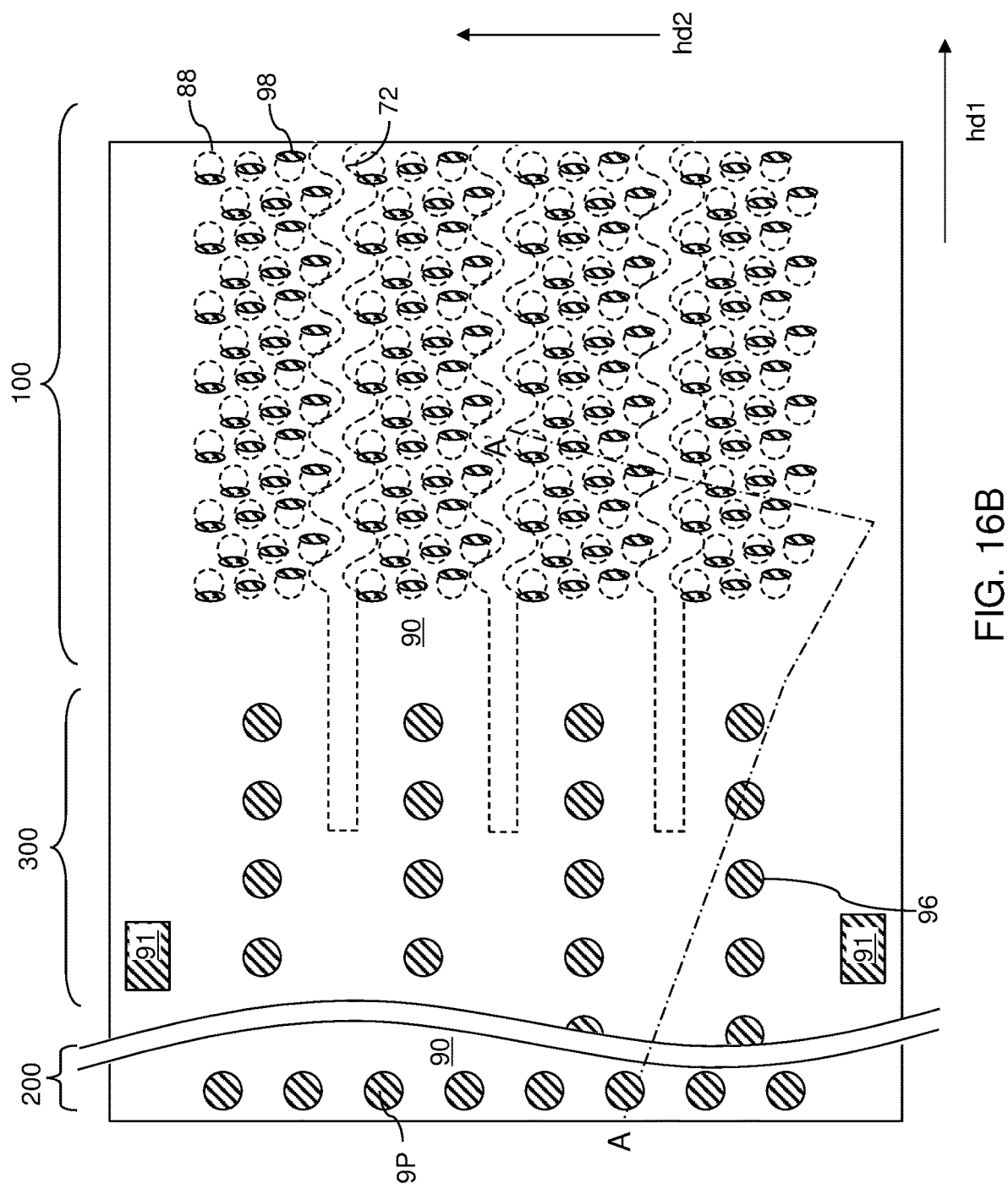
FIG. 16B is a top-down view of the first configuration of the exemplary structure of FIG. 16A. The vertical plane A-A' is the plane of the schematic vertical cross-sectional view of FIG. 16A.
Figure 16C:
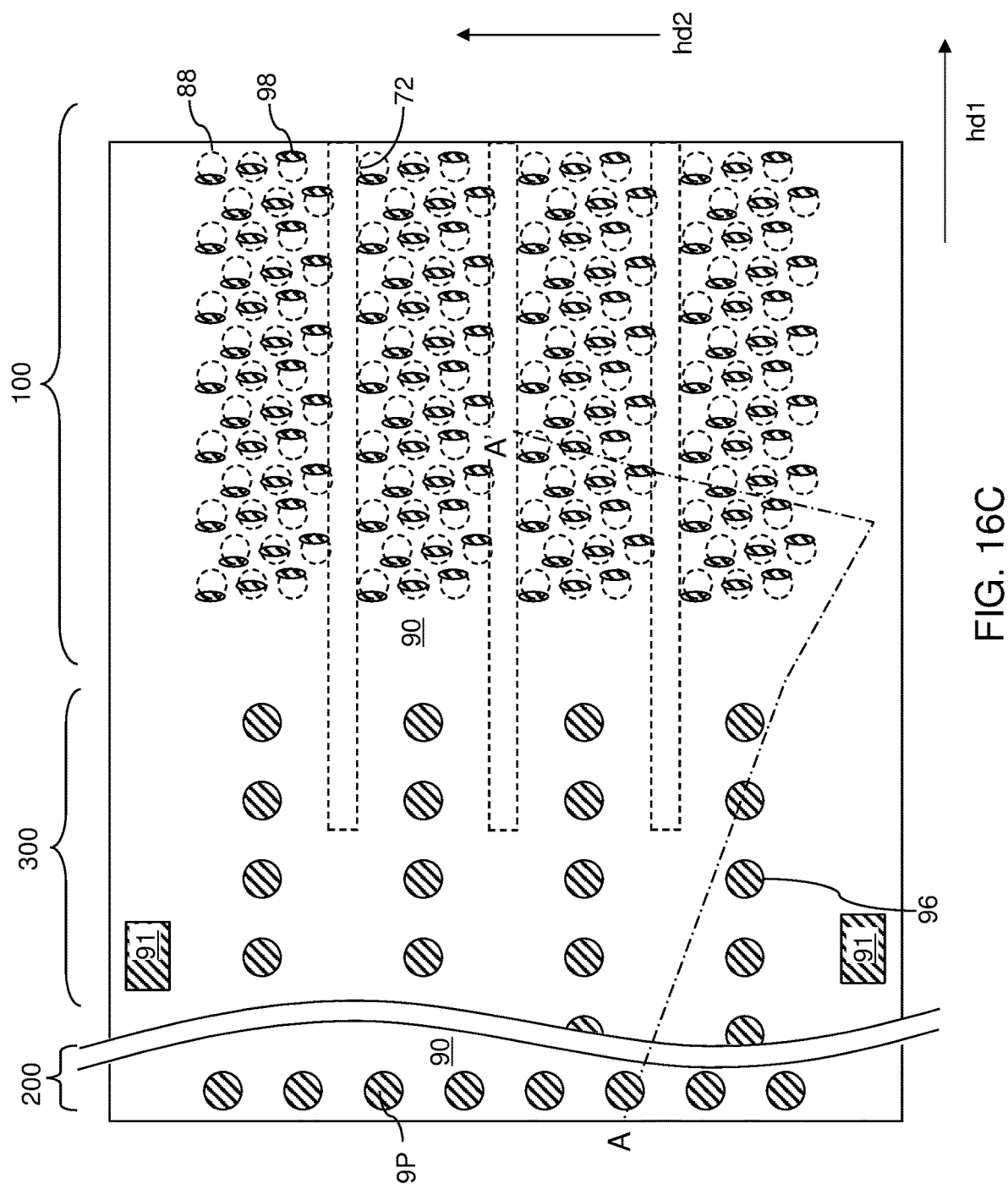
FIG. 16C is a top-down view of the second configuration of the exemplary structure of FIG. 16A. The vertical plane A-A' is the plane of the schematic vertical cross-sectional view of FIG. 16A.

Referring to FIGS. 16A-16C, a connection-level dielectric layer 90 can be formed over the contact-level dielectric layer 73, which embeds contact via structures such as drain contact via structures 88 that contact the drain regions 63. The connection-level dielectric layer 90 is a connection-level material layer consisting essentially of at least one dielectric material. The connection-level dielectric layer 90 may include an interconnect-level dielectric material such as undoped silicate glass, a doped silicate glass, or organosilicate glass, or may include a sacrificial material (such as a semiconductor material or a carbon-based material) that is subsequently removed. The thickness of the connection-level dielectric layer 90 can be in a range from 100 nm to 1,000 nm, such as from 200 nm to 500 nm, although lesser and greater thicknesses may also be employed.

Connection via cavities can be formed through the connection-level dielectric layer 90 by depositing and lithographically patterning a photoresist layer over the connection-level dielectric layer 90, and transferring the pattern of openings in the photoresist layer through the connection-level dielectric layer 90 employing an anisotropic etch process. The photoresist layer can be subsequently removed, for example, by ashing.

At least one electrically conductive material can be deposited in the connection via cavities, and excess portions of the at least one electrically conductive material can be removed from above the horizontal plane including the top surface of the connection-level dielectric layer by a planarization process, which may include a chemical mechanical planarization process and/or a recess etch process. Each remaining portion of the at least one electrically conductive material located within a respective one of the connection via cavities comprise connection-level via structures (98, 96, 9P). The connection-level via structures (98, 96, 9P) can comprise drain connection via structures 98 contacting a top surface of a respective one of the drain contact via structures 88, word-line-connection via structures 96 contacting a top surface of a respective one of the word line contact via structures 86, source-connection via structures 91 contacting the backside contact via structures 76, and peripheral-region connection via structures 9P contacting a top surface of a respective one of the peripheral device contact via structures 8P.

Generally, a combination of a connection-level material layer (such as the connection-level dielectric layer 90) and a two-dimensional array of connection via structures (such as the drain connection via structures 98) embedded in the connection-level material layer 90 can be formed over the semiconductor device array. Each of the connection via structures within the two-dimensional array of connection via structures (such as the drain connection via structures 98) overlies, and is electrically connected to, a respective one of the doped semiconductor material regions (such as the drain regions 63).

In one embodiment, the drain contact via structures 88 can be formed on top surfaces of the drain regions 63 through the contact-level dielectric layer 73, and the drain connection via structures 98 can be formed on top surfaces of the drain contact via structures 88. In one embodiment, the drain connection via structures 98 can be laterally elongated along the second horizontal direction hd2 that is perpendicular to the lengthwise direction of the backside trenches 79. For example, the drain connection via structures 98 can be laterally elongated along the bit line direction (i.e., the second horizontal direction) hd2, which is the lengthwise direction of bit lines to be subsequently formed. As will be discussed below, elongating the drain connection via structures 98 along the lengthwise direction of bit lines to be subsequently formed relaxes (i.e., widens) the pitch of the bit lines, i.e., the periodicity of the bit lines along the word line direction hd1 without decreasing device density. This improves the process margin of bit line formation and improves the RC delay of the bit lines.

According to an aspect of the present disclosure, each drain connection via structure 98 located within a same column of memory opening fill structures 58 can be laterally offset from each other, as shown in FIGS. 16B and 16C. In one embodiment, each column of memory opening fill structures 58 can include N memory opening fill structures (and thus, N drain regions 63), and the N drain connection via structures 98 overlying the column of memory opening fill structures 58 may be laterally offset from each other along the first horizontal direction hd1 by multiples of a unit lateral offset distance that is equal to the intercolumnar pitch pc divided by N. N is an integer selected from 2, 3, 4, 5, and 6.

In one embodiment shown in FIGS. 16B and 16C, N=3 and the three drain connection via structures 98 in each column contact the left, center and right horizontal portions of the respective underlying drain contact via structures 88. For example, the middle drain connection via structure 98 in each column may contact a center of the respective underlying drain contact via structures 88, while the first and second end drain connection via structure 98 in each column contacts the respective left and right portions of the respective underlying drain contact via structures 88.

As discussed above, neighboring pairs of columns of memory opening fill structures 58 can be laterally offset along the second horizontal direction hd2 by one half of the nearest-neighbor pitch pn, i.e., pn/2. Neighboring sets of N drain connection via structures 98 overlying a neighboring pair of columns of memory opening fill structures 58 can be laterally offset from each other along the second horizontal direction hd2 by one half of the nearest-neighbor pitch pn. In this case, the periodic structure including the one-dimensional periodic repetition of a unit set of drain connection via structures 98 can have a periodicity along the first horizontal direction hd1 that is the same as twice the intercolumnar pitch pc, i.e., 2pc. Accordingly, the unit set of drain connection via structures 98 within the periodic structure including the one-dimensional periodic repetition of the drain connection via structures 98 has a width that is twice the intercolumnar pitch pc, and has a length along the second horizontal direction hd2 that is at least N times the nearest-neighbor pitch pn. The unit set of drain connection via structures 98 that is repeated within the one-dimensional periodic repetition of the drain connection via structures 98 is herein referred to as a connection-level unit cell CLUC. The connection-level unit cell CLUC has a size that is at least N times the size of the memory-level unit cell MLUC.

Figure 17A:
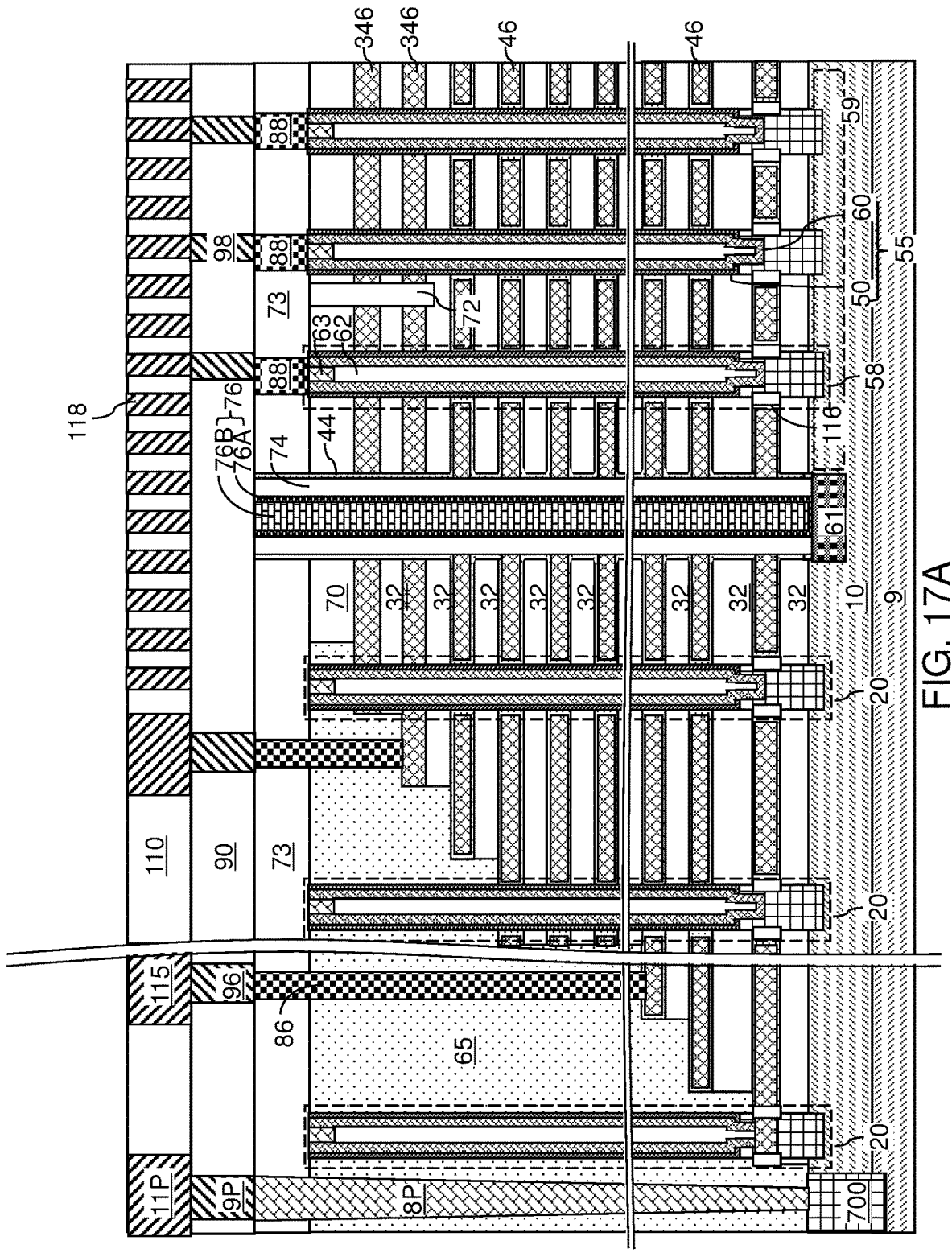
FIG. 17A is a schematic vertical cross-sectional view of the exemplary structure after formation of bit-line-level metal interconnect structures according to an embodiment of the present disclosure.
Figure 17B:
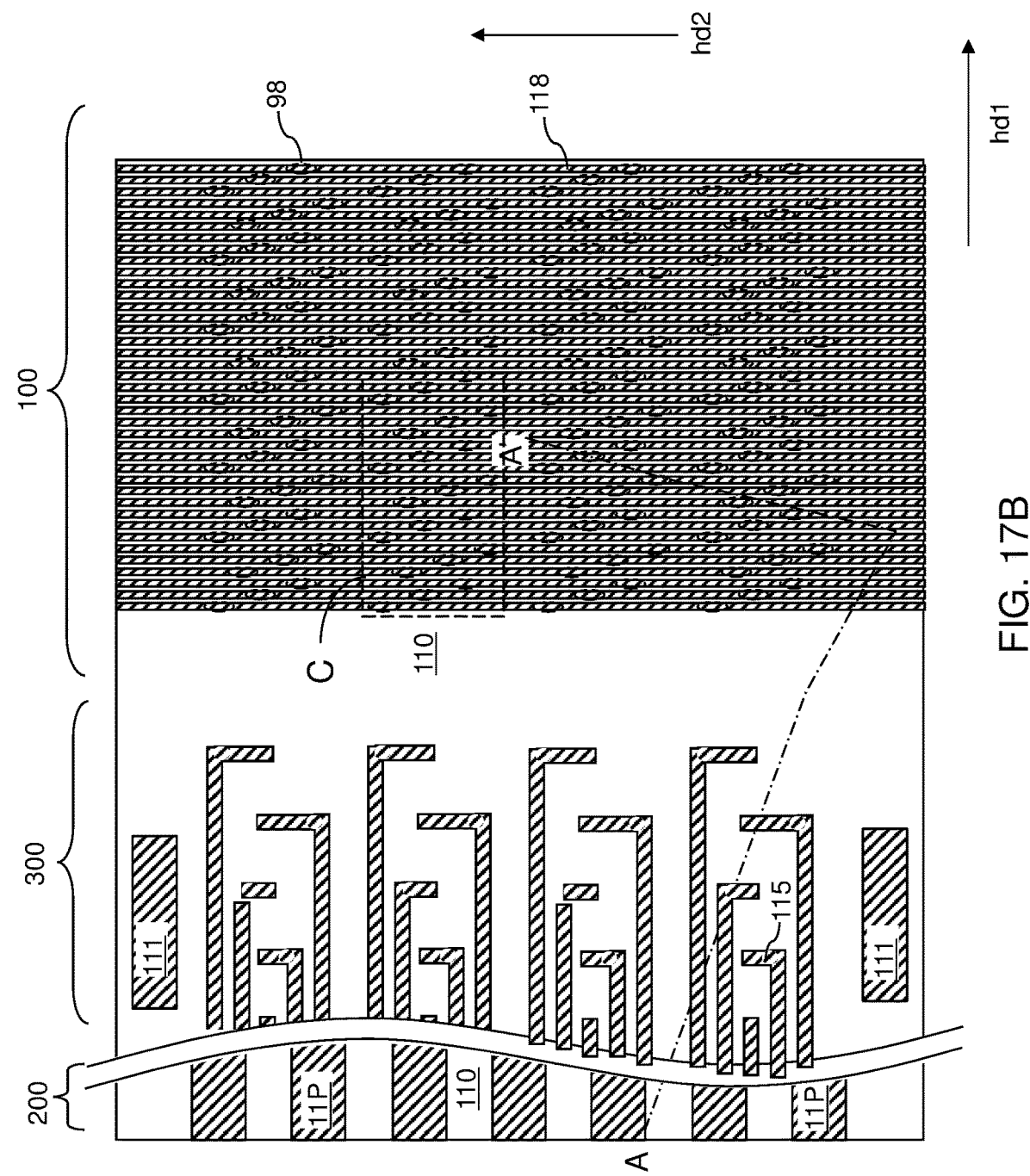
FIG. 17B is a top-down view of the exemplary structure of FIG. 17A. The vertical plane A-A' is the plane of the schematic vertical cross-sectional view of FIG. 17A.
Figure 17C:
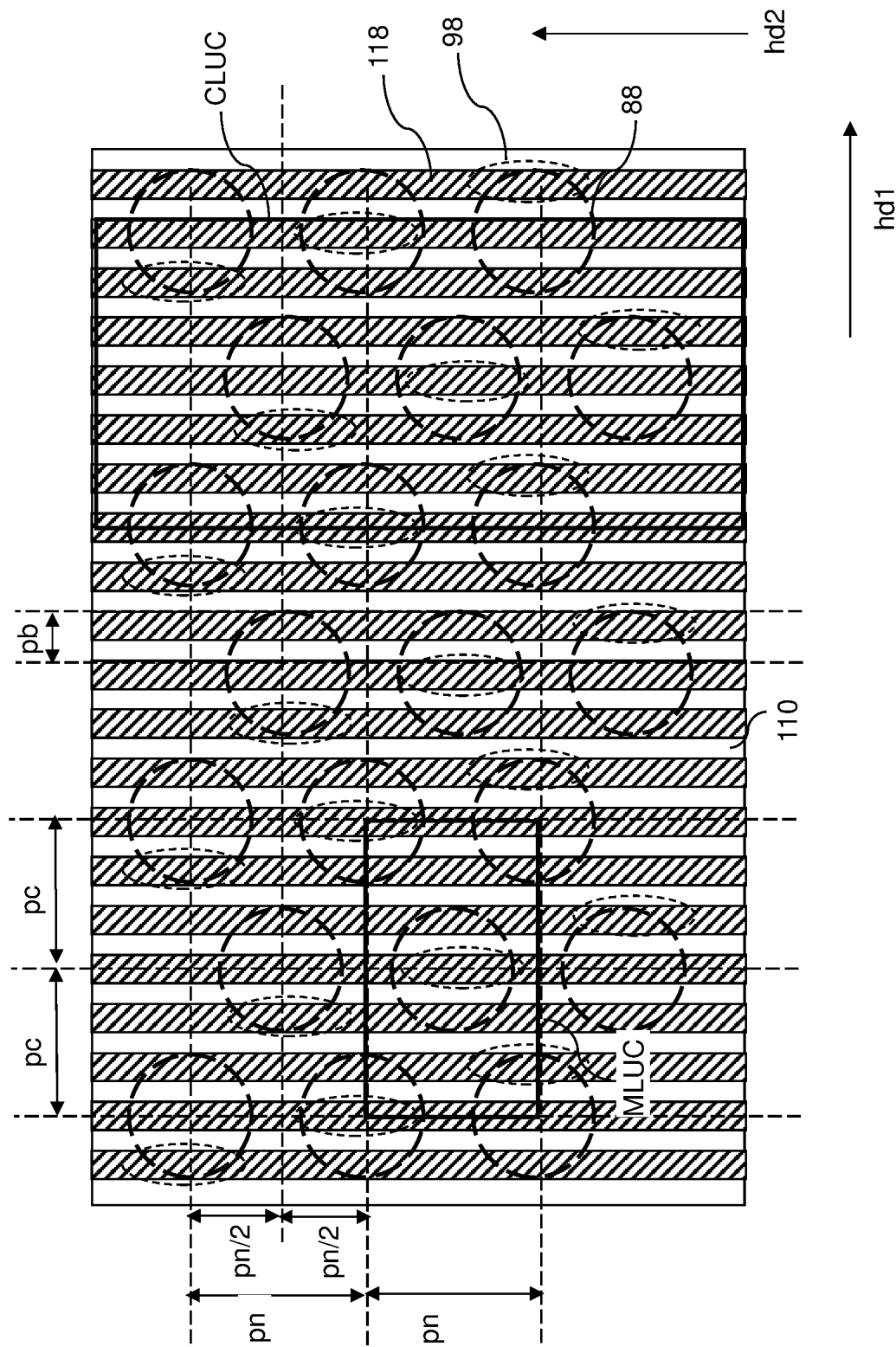
FIG. 17C is a magnified view of region C of FIG. 17B.

Referring to FIGS. 17A-17C, a bit-line-level dielectric layer 110 can be formed over the connection-level dielectric layer 90. Line trenches can be formed through the bit-line-level dielectric layer 110, and can be filled with at least one metallic material. The at least one metallic material may include an optional metallic barrier liner material such as TiN, TaN, and/or WN, and a metallic fill material such as copper, tungsten, molybdenum, cobalt, ruthenium, and combinations or alloys thereof. Excess portions of the at least one metallic material can be removed from above the horizontal plane including the top surface of the bit-line-level dielectric layer 110. Remaining patterned portion of the at least one metallic material comprise bit lines 118 that are formed in the memory array region 100 and additional via-level metal interconnect structures (111, 115, 11P) that are formed in the contact region 300 and in the peripheral device region 200. The additional via-level metal interconnect structures (111, 115, 11P) can include, for example, word-line-connection line structures 115 contacting the word-line-connection via structures 96, source-connection line structures 111 contacting the source-connection via structures 91, and peripheral connection line structures 11P contacting the peripheral-region connection via structures 9P.

In one embodiment, the bit lines 118 can be formed as a one-dimensional periodic array of bit lines 118 over the connection-level dielectric layer 90. The one-dimensional array of bit lines 118 can be formed such that each of the bit lines 118 contacts top surfaces of a respective subset of the drain connection via structures 98. In one embodiment, the bit lines 118 are laterally spaced apart along the first horizontal direction (i.e., word line direction) hd1 and laterally extend along the second horizontal direction hd2 that is perpendicular to the first horizontal direction hd1.

Generally, the bit lines 118 can be formed over the alternating stack (32, 46, optionally 346) and the two-dimensional arrays of memory opening fill structures 58. The bit lines 118 laterally extend along the second horizontal direction hd2, and each of the bit lines 118 is electrically connected to a respective subset of the drain regions 63. Each of the bit lines 118 can be formed on a respective subset of the drain connection via structures 98.

In one embodiment, the drain contact via structures 88 can contact a top surface of a respective one of the drain regions 63, and the drain connection via structures 98 can contact a top surface of a respective one of the drain contact via structures 88. Each of the bit lines 118 can contact a respective subset of the drain connection via structures 98. In one embodiment, the drain contact via structures 88 may have the same two-dimensional periodicity as the memory openings 49. In this case, the unit of repetition within each two-dimensional array of drain contact via structures 88 can have the same size as the unit of repetition in the underlying two-dimensional array of memory openings 49. In other words, the unit of repetition within each two-dimensional array of drain contact via structures 88 can have the same area as the area of a memory-level unit cell MLUC that is a unit of two-dimensional repetition within each periodic two-dimensional array of memory openings 49. Accordingly, the unit of repetition within each two-dimensional array of drain contact via structures 88 can have the area of a product of two intercolumnar pitches pc times the nearest-neighbor pitch pn.

In one embodiment, a set of all drain connection via structures 88 contacting the drain regions 63 within a periodic two-dimensional array of memory openings 49 may be arranged as a periodic structure including a one-dimensional periodic repetition of a unit set of drain connection via structures 98. A two-dimensional periodic array of memory opening fill structures 58 can be located between a neighboring pair of structures selected from the drain-select-level isolation structures 72 and the backside trench fill structures (74, 76).

In case each column of memory opening fill structures 58 includes N memory opening fill structures 58, the bit line pitch pb, i.e., the pitch of the bit lines 118 along the first horizontal direction hd1, can be the intercolumnar pitch pc divided by N, i.e., pc/N. Generally, each drain connection via structure 98 within the unit set of drain connection via structures 98 (within a connection-level unit cell CLUC) is laterally offset from all other drain connection via structure 98 within the unit set along the first horizontal direction hd1 and along the second horizontal direction hd2. The lateral offset distances along the first horizontal direction hd1 are integer multiples of the intercolumnar pitch pc divided by N. The lateral offset distances along the second horizontal direction hd2 for each subset of drain connection via structures 98 overlying a same column of memory opening fill structures 58 are integer multiples of the nearest-neighbor pitch pn. For example, if N=3, then three bit lines 118 may pass over each drain contact via structure 88 and each underlying memory opening fill structure 58. However, only one of the three bit lines 118 is electrically connected to the drain contact via structure 88 and the underlying memory opening fill structure 58 via the respective drain connection via structure 98.

The layout of the memory openings 49, the drain connection via structures 98, and the bit lines 118 illustrated in FIGS. 17B and 17C provide a relaxed bit line pitch pb along the first horizontal direction hd1. This improves process margin and RC delay of the bit lines. The layout of the memory openings 49, the drain connection via structures 98, and the bit lines 118 of the embodiments present disclosure differs from prior art layouts that employ rows of memory openings 49 that laterally extend along a direction that is perpendicular to the lengthwise direction of the bit lines.

Referring to all drawings and according to various embodiments of the present disclosure, a three-dimensional memory device comprises an alternating stack of insulating layers 32 and electrically conductive layers (46, optionally 346) located over a substrate (9, 10); a plurality of periodic two-dimensional arrays of memory openings 49 vertically extending through the alternating stack (32, 46, 346), wherein each periodic two-dimensional array of memory openings 49 comprises a plurality of columns Ci of memory openings 49 in which neighboring columns Ci of memory openings 49 are laterally spaced apart along a first horizontal direction hd1 with an intercolumnar pitch pc, wherein memory openings within each column of memory openings are laterally spaced apart along a second horizontal direction with a nearest-neighbor pitch pn that is greater than the intercolumnar pitch pc, and each neighboring columns Ci of memory openings 49 are laterally offset along the second horizontal direction hd2 by one half of the nearest-neighbor pitch pn; a plurality of periodic two-dimensional arrays of memory opening fill structures 58, wherein each of the memory opening fill structures 58 is located within a respective memory opening 49 within the periodic two-dimensional arrays of memory openings 49 and comprises a respective vertical semiconductor channel 60, a respective vertical stack of memory elements, and a respective drain region 63; and bit lines 118 overlying the alternating stack (32, 46, 346) and the two-dimensional arrays of memory opening fill structures 58 and laterally extending along the second horizontal direction hd2, wherein each of the bit lines 118 is electrically connected to a respective subset of the drain regions 63.

In one embodiment, each periodic two-dimensional array of memory openings 49 of the plurality of periodic two-dimensional arrays of memory openings 49 has: a first periodicity along the first horizontal direction hd1 that is twice the intercolumnar pitch pc; and a second periodicity along the second horizontal direction hd2 that is the same as the nearest-neighbor pitch pn. In one embodiment, the first periodicity is in a range from 1.4 times the second periodicity to 2.0 times the second periodicity.

In one embodiment, each column Ci of memory openings 49 within the plurality of columns of memory openings 49 consists of a respective set of N memory openings 49; and each of the memory openings 49 within the plurality of columns of memory openings 49 has an areal overlap with a respective set of N overlying bit lines 118 of the bit lines 118 in a plan view (such as a top-down view along a direction that is perpendicular to a top surface of the substrate (9, 10)), wherein N is an integer selected from 2, 3, 4, 5, or 6. In one embodiment, N=3 and each of the memory openings 49 within the plurality of columns Ci of memory openings 49 does not have any areal overlap with any bit line 118 other than the respective set of N overlying bit lines 118 of the bit lines 118 in the plan view.

In one embodiment, neighboring pairs of periodic two-dimensional arrays of memory openings 49 of the periodic two-dimensional arrays of memory openings 49 are laterally spaced apart along the second horizontal direction hd2 by a respective drain-select-level isolation structure 72 that vertically extends through at least one electrically conductive layer (46 or 346) including a topmost electrically conductive layer (46 or 346) within the alternating stack (32, 46, 346).

In one embodiment, the respective drain-select-level isolation structure 72 laterally extends along the first horizontal direction hd1 with lateral wiggles along the second horizontal direction hd2; and the lateral wiggles have a periodicity that is the same as twice the intercolumnar pitch pc. Alternatively, the respective drain-select-level isolation structure 72 laterally extends along the first horizontal direction hd1 with straight lengthwise sidewalls that are parallel to the first horizontal direction hd1.

In one embodiment, the alternating stack (32, 46, 346) contacts: a first backside trench fill structure (74, 76) laterally extending along the first horizontal direction hd1 and contacting a first sidewall of each layer within the alternating stack (32, 46, 346); and a second backside trench fill structure (74, 76) laterally extending along the first horizontal direction hd1 and contacting a second sidewall of each layer within the alternating stack (32, 46, 346). In one embodiment, each of the first backside trench fill structure (74, 76) and the second backside trench fill structure (74, 76) comprises: an insulating spacer 74 contacting the alternating stack (32, 46, 346); and a backside contact via structure 76 laterally surrounded by the insulating spacer 74 and contacting a respective source region 61 embedded within the substrate (9, 10).

In one embodiment, the three-dimensional memory device comprises: drain contact via structures 88 contacting a top surface of a respective one of the drain regions 63; and drain connection via structures 98 contacting a top surface of a respective one of the drain contact via structures 88, wherein each of the bit lines 118 contacts a respective subset of the drain connection via structures 98.

In one embodiment, a set of all drain connection via structures 98 electrically connected to the drain regions 63 within a periodic two-dimensional array of memory openings 49 of the plurality of periodic two-dimensional arrays of memory openings 49 is arranged as a periodic structure including a one-dimensional periodic repetition of a unit set of drain connection via structures 98 (which may contain 2N drain connection via structures 98, N being the number of memory openings 49 within each column Ci of memory openings 49), wherein the periodic structure has a periodicity along the first horizontal direction hd1 that is the same as twice the intercolumnar pitch pc.

In one embodiment, each drain connection via structure 98 within the unit set of drain connection via structures 98 is laterally offset from all other drain connection via structure 98 within the unit set along the first horizontal direction hd1 and along the second horizontal direction hd2.

In one embodiment, each column Ci of memory openings 49 within the plurality of columns of memory openings 49 consists of a respective set of N memory openings 49; N is an integer selected from 2, 3, 4, 5, or 6; and each drain connection via structure 98 within the unit set of drain connection via structures 98 is laterally offset from all other drain connection via structure 98 within the unit set along the first horizontal direction hd1 by integer multiples of a unit lateral offset distance that equals the intercolumnar pitch pc divided by N.

In one embodiment, N=3; and three drain connection via structures 98 in each column Ci contact a respective left, center or right horizontal portions of a respective one of the drain contact via structures 88.

In one embodiment, each of the memory opening fill structures 58 has nearest neighbor memory opening fill structures 58 along the bit line direction hd2 and along two diagonal directions that are inclined by 45 degrees from the bit line direction. However, there are no nearest neighbor memory opening fill structures 58 along the word line direction hd1 which is perpendicular to the bit line direction hd2.

Referring to all drawings and according to various embodiments of the present disclosure, a three-dimensional memory device comprises an alternating stack of insulating layers 32 and electrically conductive layers comprising word lines 46 and drain side select gate electrodes 346, a plurality of memory opening fill structures 58 vertically extending through the alternating stack, wherein each of the plurality of memory opening fill structures comprises a respective vertical semiconductor channel 60, a respective vertical stack of memory elements 54, and a respective drain region 63; and bit lines 118 overlying the alternating stack and the plurality of memory opening fill structures 58, and laterally extending along a bit line direction hd2. Each of the bit lines 118 is electrically connected to a respective subset of the drain regions 63. Each of the memory opening fill structures 58 has nearest neighbor memory opening structures 58 along the bit line direction hd2 and along two diagonal directions that are inclined by 45 degrees from the bit line direction.

In one embodiment, the device further comprises a first backside trench fill structure (74, 76) laterally extending along a word line direction hd1 perpendicular to the bit line direction hd2, and contacting a first sidewall of each layer within the alternating stack, a second backside trench fill structure (74, 76) laterally extending along the word line direction hd1 and contacting a second sidewall of each layer within the alternating stack, and drain-select-level isolation structures 72 vertically extending through the drain side select gate electrodes 346 and laterally extending along the word line direction hd1. The memory opening fill structures 58 are arranged in columns Ci extending in the bit line direction hd2.

In one embodiment, drain contact via structures 88 contact a top surface of a respective one of the drain regions 63 and drain connection via structures 98 contact a top surface of a respective one of the drain contact via structures 88, each of the bit lines 118 contacts a respective subset of the drain connection via structures 98, each column of the memory opening fill structures 58 consists of three memory opening fill structures located between a pair of adjacent drain-select-level isolation structures 72, and three drain connection via structures 98 in each column Ci contact a respective left, center or right horizontal portions of a respective one of the drain contact via structures 88.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate;
a plurality of periodic two-dimensional arrays of memory openings vertically extending through the alternating stack, wherein each periodic two-dimensional array of memory openings comprises a plurality of columns of memory openings in which neighboring columns of memory openings are laterally spaced apart along a first horizontal direction with an intercolumnar pitch, wherein memory openings within each column of memory openings are laterally spaced apart along a second horizontal direction with a nearest-neighbor pitch that is greater than the intercolumnar pitch, and each neighboring columns of memory openings are laterally offset along the second horizontal direction by one half of the nearest-neighbor pitch;
a plurality of periodic two-dimensional arrays of memory opening fill structures, wherein each of the memory opening fill structures is located within a respective memory opening within the periodic two-dimensional arrays of memory openings and comprises a respective vertical semiconductor channel, a respective vertical stack of memory elements, and a respective drain region; and
bit lines overlying the alternating stack and the two-dimensional arrays of memory opening fill structures and laterally extending along the second horizontal direction, wherein each of the bit lines is electrically connected to a respective subset of the drain regions.

2. The three-dimensional memory device of claim 1, wherein each periodic two-dimensional array of memory openings of the plurality of periodic two-dimensional arrays of memory openings has:
a first periodicity along the first horizontal direction that is twice the intercolumnar pitch; and
a second periodicity along the second horizontal direction that is the same as the nearest-neighbor pitch.

3. The three-dimensional memory device of claim 2, wherein the first periodicity is in a range from 1.4 times the second periodicity to 2 times the second periodicity.

4. The three-dimensional memory device of claim 1, wherein:
each column of memory openings within the plurality of columns of memory openings consists of a respective set of N memory openings; and
each of the memory openings within the plurality of columns of memory openings has an areal overlap with a respective set of N overlying bit lines of the bit lines in a plan view along a direction that is perpendicular to a top surface of the substrate, wherein N is an integer selected from 2, 3, 4, 5, or 6.

5. The three-dimensional memory device of claim 4, wherein each of the memory openings within the plurality of columns of memory openings does not have any areal overlap with any bit line other than the respective set of N overlying bit lines of the bit lines in the plan view, and wherein N=3.

6. The three-dimensional memory device of claim 1, wherein neighboring pairs of periodic two-dimensional arrays of memory openings of the periodic two-dimensional arrays of memory openings are laterally spaced apart along the second horizontal direction by a respective drain-select-level isolation structure that vertically extends through at least one electrically conductive layer including a topmost electrically conductive layer within the alternating stack.

7. The three-dimensional memory device of claim 6, wherein:
the respective drain-select-level isolation structure laterally extends along the first horizontal direction with lateral wiggles along the second horizontal direction; and
the lateral wiggles have a periodicity that is the same as twice the intercolumnar pitch.

8. The three-dimensional memory device of claim 6, wherein the respective drain-select-level isolation structure laterally extends along the first horizontal direction with straight lengthwise sidewalls that are parallel to the first horizontal direction.

9. The three-dimensional memory device of claim 6, wherein the alternating stack contacts:
a first backside trench fill structure laterally extending along the first horizontal direction and contacting a first sidewall of each layer within the alternating stack; and
a second backside trench fill structure laterally extending along the first horizontal direction and contacting a second sidewall of each layer within the alternating stack.

10. The three-dimensional memory device of claim 6, wherein each of the first backside trench fill structure and the second backside trench fill structure comprises:
an insulating spacer contacting the alternating stack; and
a backside contact via structure laterally surrounded by the insulating spacer and contacting a respective source region embedded within the substrate.

11. The three-dimensional memory device of claim 1, further comprising:
drain contact via structures contacting a top surface of a respective one of the drain regions; and
drain connection via structures contacting a top surface of a respective one of the drain contact via structures,
wherein each of the bit lines contacts a respective subset of the drain connection via structures.

12. The three-dimensional memory device of claim 11, wherein a set of all drain connection via structures electrically connected to the drain regions within a periodic two-dimensional array of memory openings of the plurality of periodic two-dimensional arrays of memory openings is arranged as a periodic structure including a one-dimensional periodic repetition of a unit set of drain connection via structures, wherein the periodic structure has a periodicity along the first horizontal direction that is the same as twice the intercolumnar pitch.

13. The three-dimensional memory device of claim 12, wherein each drain connection via structure within the unit set of drain connection via structures is laterally offset from all other drain connection via structure within the unit set along the first horizontal direction and along the second horizontal direction.

14. The three-dimensional memory device of claim 13, wherein:
each column of memory openings within the plurality of columns of memory openings consists of a respective set of N memory openings;
N is an integer selected from 2, 3, 4, 5, or 6; and
each drain connection via structure within the unit set of drain connection via structures is laterally offset from all other drain connection via structures within the unit set along the first horizontal direction by integer multiples of a unit lateral offset distance that equals the intercolumnar pitch divided by N.

15. The three-dimensional memory device of claim 14, wherein:
N=3; and
three drain connection via structures in each column contact a respective left, center or right horizontal portions of a respective one of the drain contact via structures.

16. The three-dimensional memory device of claim 1, wherein each of the memory opening fill structures has nearest neighbor memory opening structures along the second horizontal direction and along two diagonal directions that are inclined by 45 degrees from the second horizontal direction.

17. A three-dimensional memory device, comprising:
an alternating stack of insulating layers and electrically conductive layers comprising word lines and drain side select gate electrodes;
a plurality of memory opening fill structures vertically extending through the alternating stack, wherein each of the plurality of memory opening fill structures comprises a respective vertical semiconductor channel, a respective vertical stack of memory elements, and a respective drain region; and
bit lines overlying the alternating stack and the plurality of memory opening fill structures and laterally extending along a bit line direction, wherein each of the bit lines is electrically connected to a respective subset of the drain regions,
wherein each of the memory opening fill structures has nearest neighbor memory opening structures along the bit line direction and along two diagonal directions that are inclined by 45 degrees from the bit line direction.

18. The three-dimensional memory device of claim 17, further comprising:
a first backside trench fill structure laterally extending along a word line direction perpendicular to the bit line direction, and contacting a first sidewall of each layer within the alternating stack;
a second backside trench fill structure laterally extending along the word line direction and contacting a second sidewall of each layer within the alternating stack; and
drain-select-level isolation structures vertically extending through the drain side select gate electrodes and laterally extending along the word line direction,
wherein the memory opening fill structures are arranged in columns extending in the bit line direction.

19. The three-dimensional memory device of claim 18, further comprising:
drain contact via structures contacting a top surface of a respective one of the drain regions; and
drain connection via structures contacting a top surface of a respective one of the drain contact via structures,
wherein:
each of the bit lines contacts a respective subset of the drain connection via structures;
each column of the memory opening fill structures consists of three memory opening fill structures located between a pair of adjacent drain-select-level isolation structures; and
three drain connection via structures in each column contact a respective left, center or right horizontal portions of a respective one of the drain contact via structures.

20. A method of forming a three-dimensional memory device, comprising:
forming an alternating stack of insulating layers and spacer material layers over a substrate, wherein the spacer material layers are formed as, or are subsequently replaced with, electrically conductive layers;
forming a plurality of periodic two-dimensional arrays of memory openings through the alternating stack, wherein each periodic two-dimensional array of memory openings comprises a plurality of columns of memory openings in which neighboring columns of memory openings are laterally spaced apart along a first horizontal direction with an intercolumnar pitch, wherein memory openings within each column of memory openings are laterally spaced apart along a second horizontal direction with a nearest-neighbor pitch that is greater than the intercolumnar pitch, and each neighboring columns of memory openings are laterally offset along the second horizontal direction by one half of the nearest-neighbor pitch;
forming a plurality of periodic two-dimensional arrays of memory opening fill structures within the plurality of periodic two-dimensional arrays of memory openings, wherein each memory opening fill structure within the plurality of periodic two-dimensional arrays of memory opening fill structures comprises a respective vertical semiconductor channel, a respective vertical stack of memory elements, and a respective drain region; and
forming bit lines over the alternating stack and the two-dimensional arrays of memory opening fill structures, wherein the bit lines laterally extend along the second horizontal direction, and wherein each of the bit lines is electrically connected to a respective subset of the drain regions.

* * * * *